(12) United States Patent
Matsugai et al.

(10) Patent No.: US 12,132,064 B2
(45) Date of Patent: Oct. 29, 2024

(54) CAMERA PACKAGE, METHOD FOR MANUFACTURING CAMERA PACKAGE, AND ELECTRONIC DEVICE

(71) Applicant: SONY SEMICONDUCTOR SOLUTIONS CORPORATION, Kanagawa (JP)

(72) Inventors: Hiroyasu Matsugai, Kanagawa (JP); Kotaro Nishimura, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 561 days.

(21) Appl. No.: 17/430,578

(22) PCT Filed: Feb. 18, 2020

(86) PCT No.: PCT/JP2020/006166
§ 371 (c)(1),
(2) Date: Aug. 12, 2021

(87) PCT Pub. No.: WO2020/171037
PCT Pub. Date: Aug. 27, 2020

(65) Prior Publication Data
US 2022/0130880 A1    Apr. 28, 2022

(30) Foreign Application Priority Data
Feb. 22, 2019 (JP) .................. 2019-030169

(51) Int. Cl.
*H01L 21/00* (2006.01)
*G02B 5/00* (2006.01)
*G02B 7/02* (2021.01)
*H01L 27/146* (2006.01)
*G02B 1/113* (2015.01)

(52) U.S. Cl.
CPC ........ *H01L 27/14627* (2013.01); *G02B 5/003* (2013.01); *G02B 7/02* (2013.01);
(Continued)

(58) Field of Classification Search
CPC ......... H01L 27/14627; H01L 27/14618; H01L 27/1462; H01L 27/14623; H01L 27/14629; H01L 27/14685; G02B 5/003; G02B 7/02
See application file for complete search history.

(56) References Cited

U.S. PATENT DOCUMENTS

| 6,294,313 B1 | 9/2001 | Kobayashi et al. |
| 11,574,949 B2 * | 2/2023 | Matsugai ................. G03B 3/00 |

(Continued)

FOREIGN PATENT DOCUMENTS

| CN | 104076415 A | 10/2014 |
| EP | 932081 A1 | 7/1999 |

(Continued)

OTHER PUBLICATIONS

International Search Report and Written Opinion of PCT Application No. PCT/JP2020/006166, issued on May 12, 2020, 13 pages of ISRWO.

*Primary Examiner* — Richard A Booth
(74) *Attorney, Agent, or Firm* — CHIP LAW GROUP

(57) ABSTRACT

The present disclosure relates to a camera package, a method for manufacturing a camera package, and an electronic device with which it is possible to reduce manufacturing cost for lens formation.
The camera package according to the present disclosure includes: a solid-state imaging element; and a lens formed above a transparent substrate that protects the solid-state imaging element. A lens formation region in which the lens is formed above the transparent substrate and a lens free region around the lens formation region differ in contact angle. The present disclosure can be applied to, for example, a camera package in which a lens is disposed above a solid-state imaging element, or the like.

20 Claims, 63 Drawing Sheets

(52) U.S. Cl.
CPC .... *H01L 27/14618* (2013.01); *H01L 27/1462* (2013.01); *H01L 27/14623* (2013.01); *H01L 27/14629* (2013.01); *H01L 27/14685* (2013.01); *G02B 1/113* (2013.01)

(56) References Cited

U.S. PATENT DOCUMENTS

| | | | |
|---|---|---|---|
| 11,804,502 | B2 * | 10/2023 | Sasaki ............... H01L 27/14625 |
| 2002/0006558 | A1 | 1/2002 | Kobayashi et al. |
| 2014/0293428 | A1 | 10/2014 | Yasuda et al. |

FOREIGN PATENT DOCUMENTS

| | | | |
|---|---|---|---|
| EP | 1376224 | A1 | 1/2004 |
| JP | 5-326900 | A | 12/1993 |
| JP | H09122573 | A | 5/1997 |
| JP | 2000-002802 | A | 1/2000 |
| JP | 2000-353798 | A | 12/2000 |
| JP | 2001-141906 | A | 5/2001 |
| JP | 2007-043063 | A | 2/2007 |
| JP | 4265984 | B2 | 5/2009 |
| JP | 2009-123788 | A | 6/2009 |
| JP | 2009-194083 | A | 8/2009 |
| JP | 2010-197821 | A | 9/2010 |
| JP | 2011-049274 | A | 3/2011 |
| JP | 2012-093765 | A | 5/2012 |
| JP | 2014-190988 | A | 10/2014 |
| JP | 2019014112 | A | 1/2019 |
| WO | 1999/008158 | A1 | 2/1999 |
| WO | WO-2013094710 | A1 | 6/2013 |
| WO | 2018/070259 | A1 | 4/2018 |
| WO | 2019/131488 | A1 | 7/2019 |

\* cited by examiner

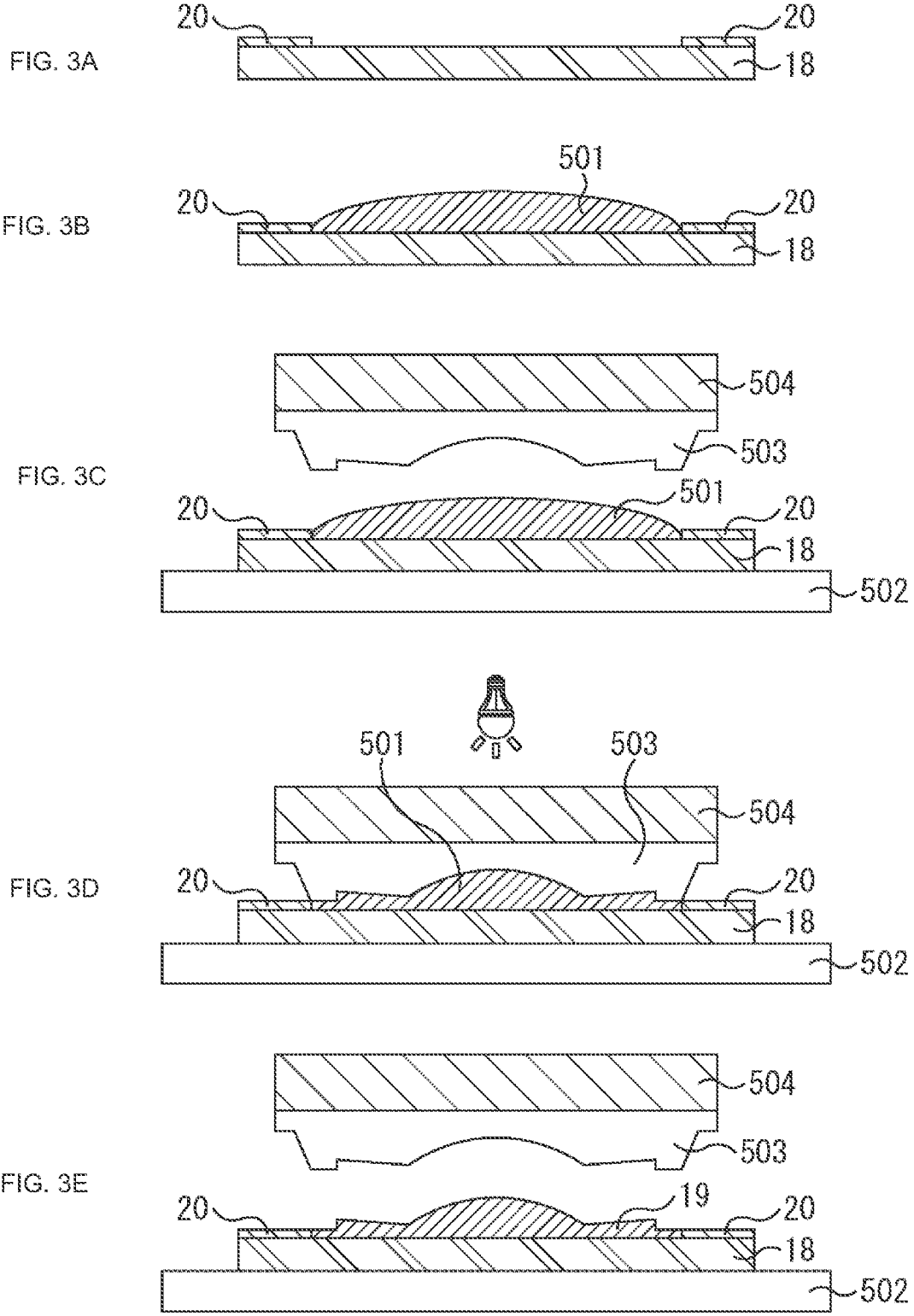

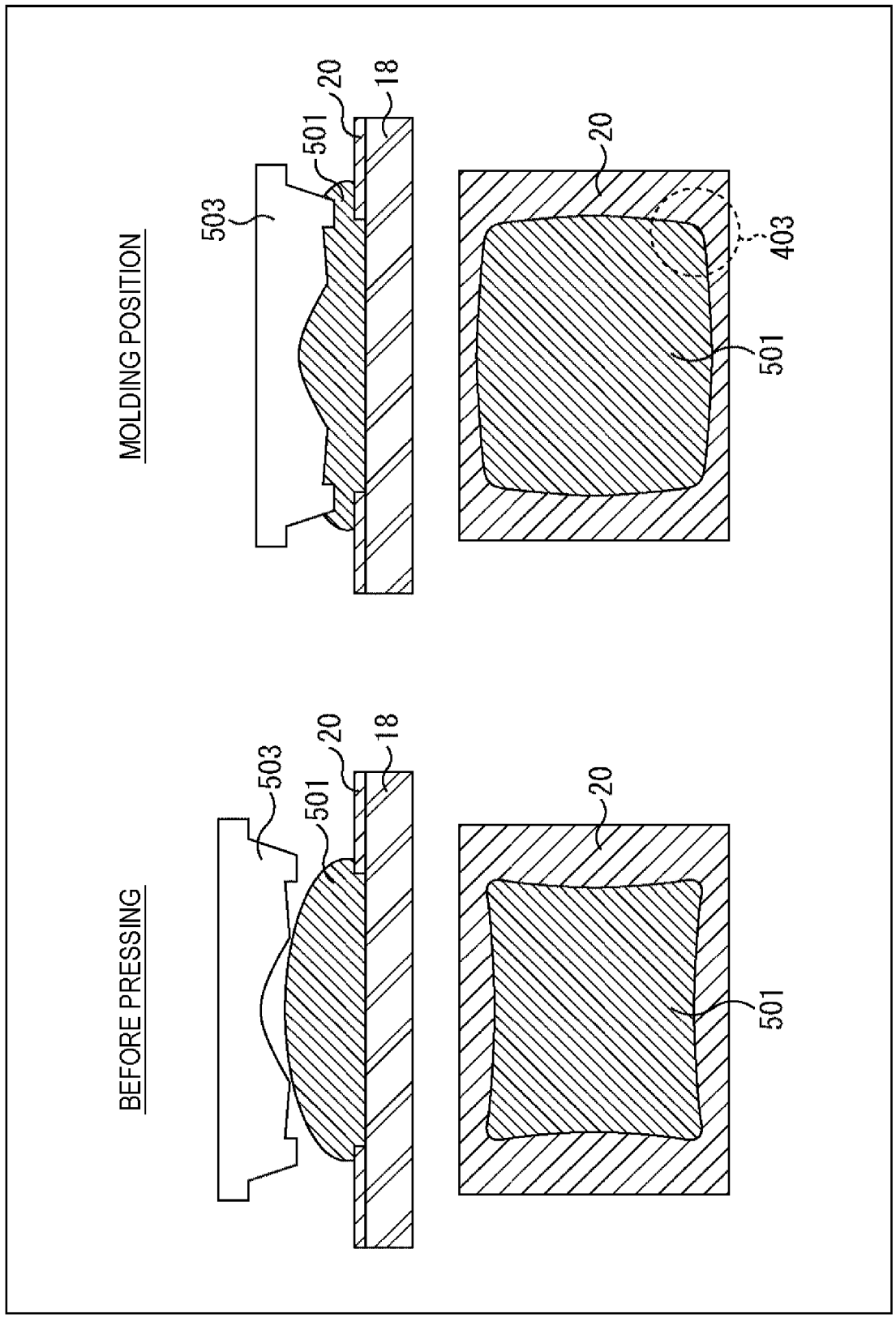

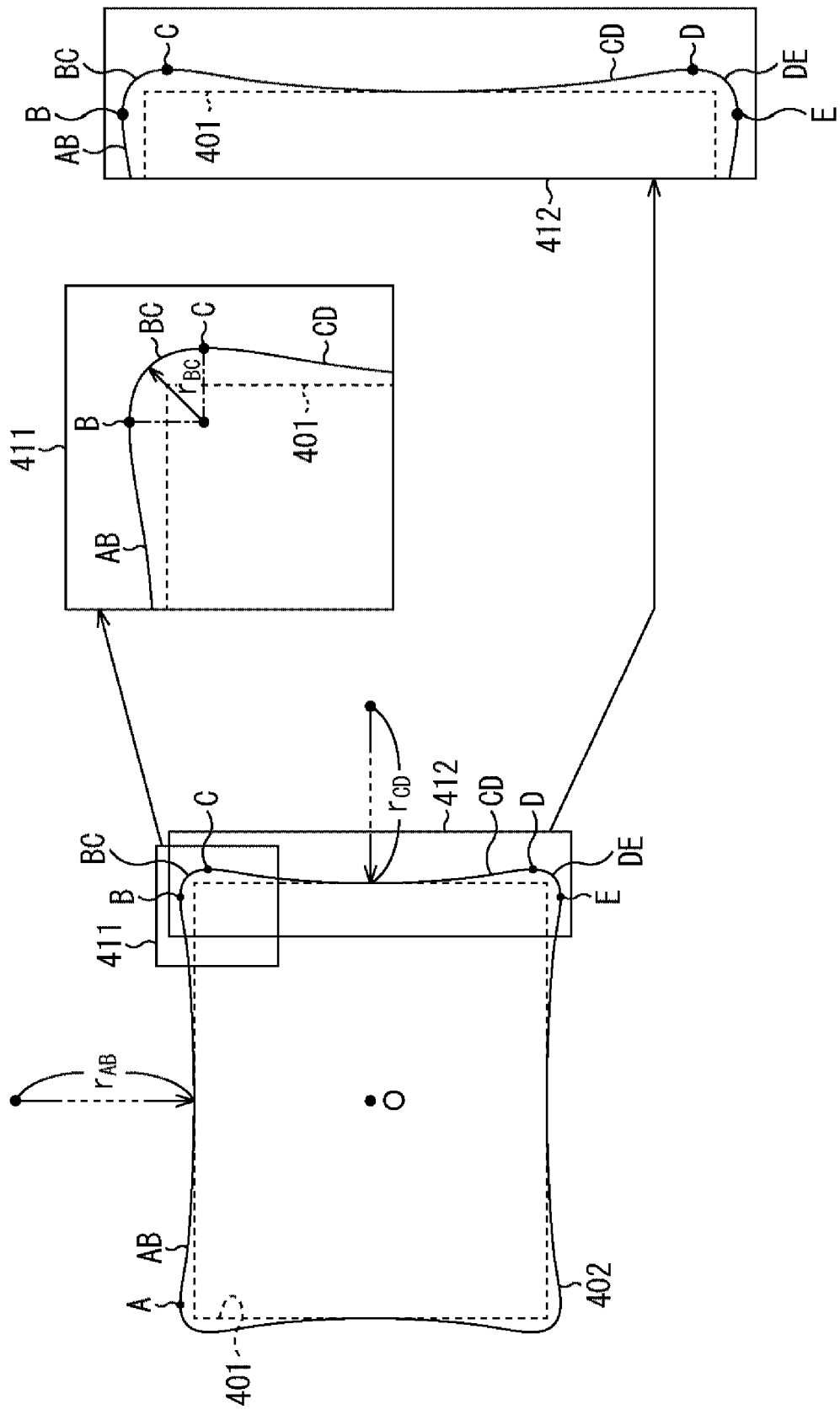

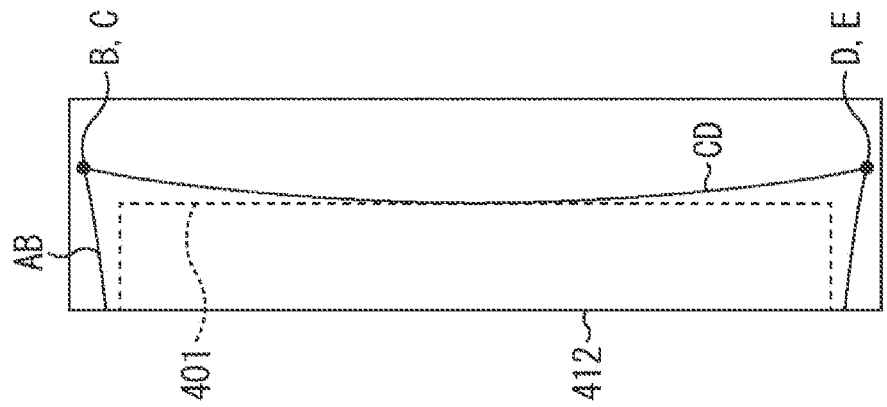
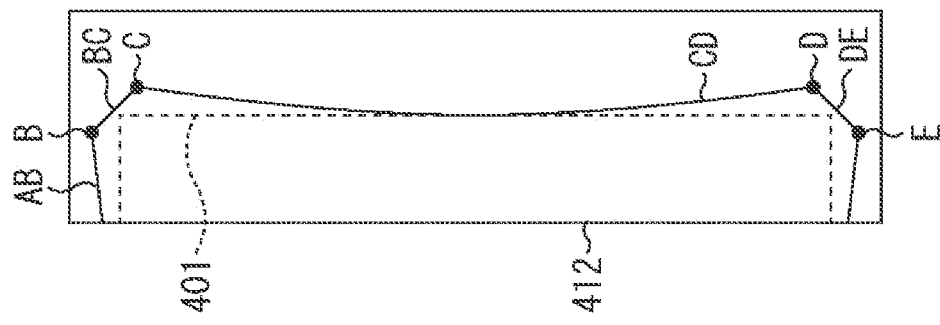

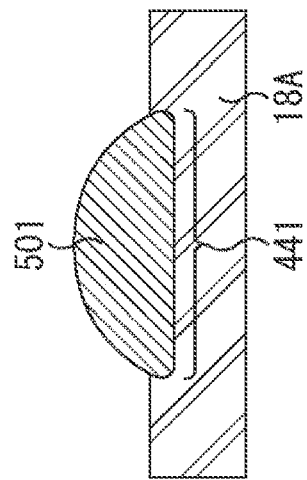
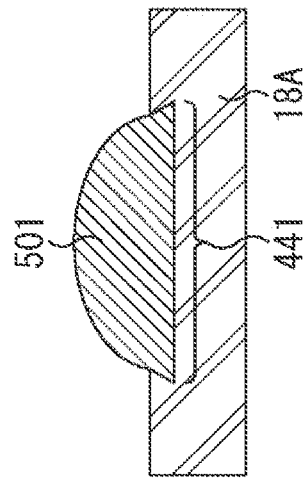
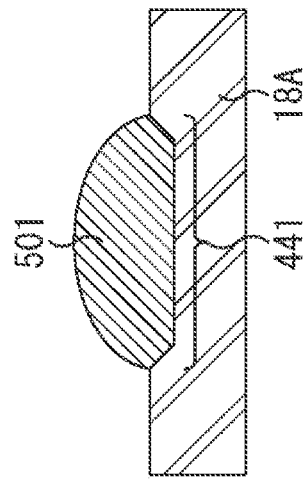

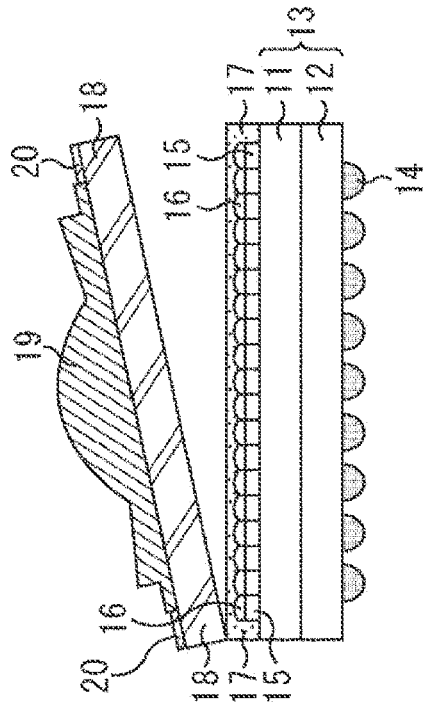
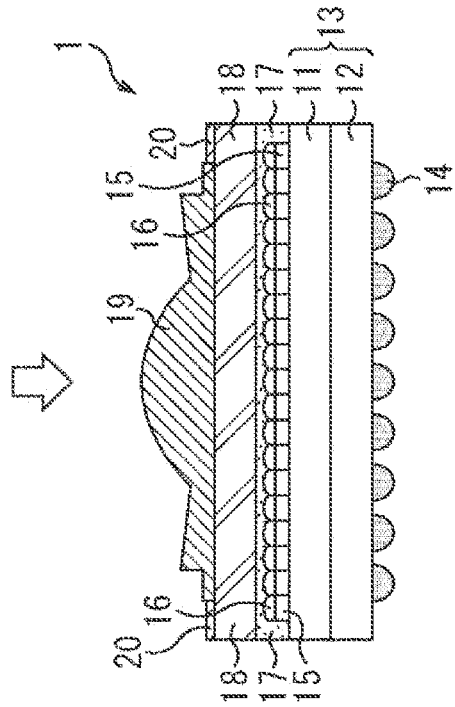
FIG. 18A
FIG. 18B

FIG. 19
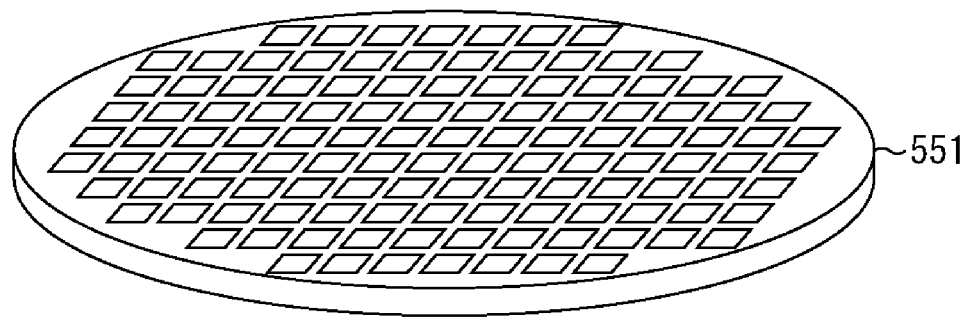
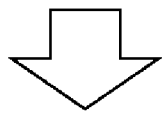
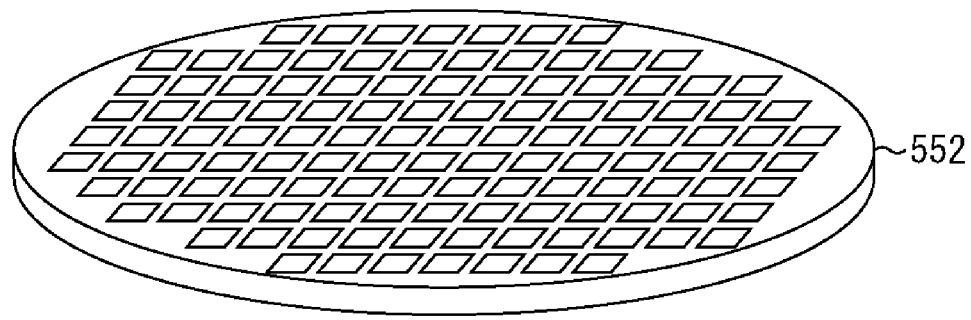

FIG. 33
FIG. 33A
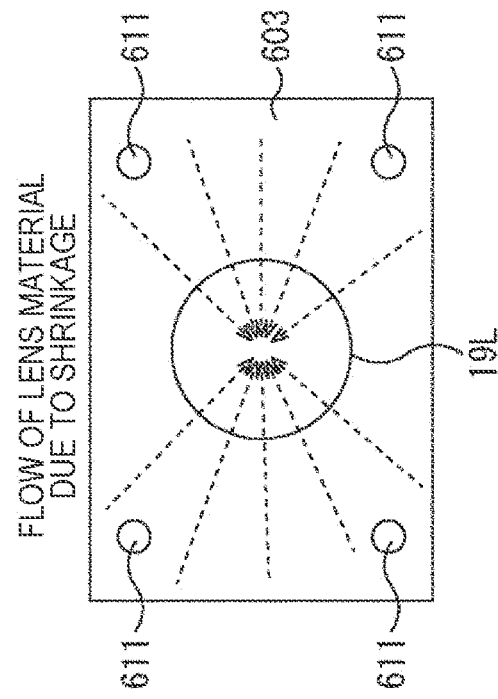
FIG. 33B
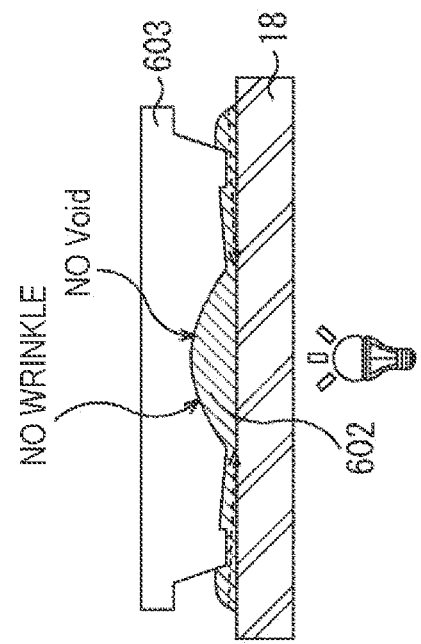

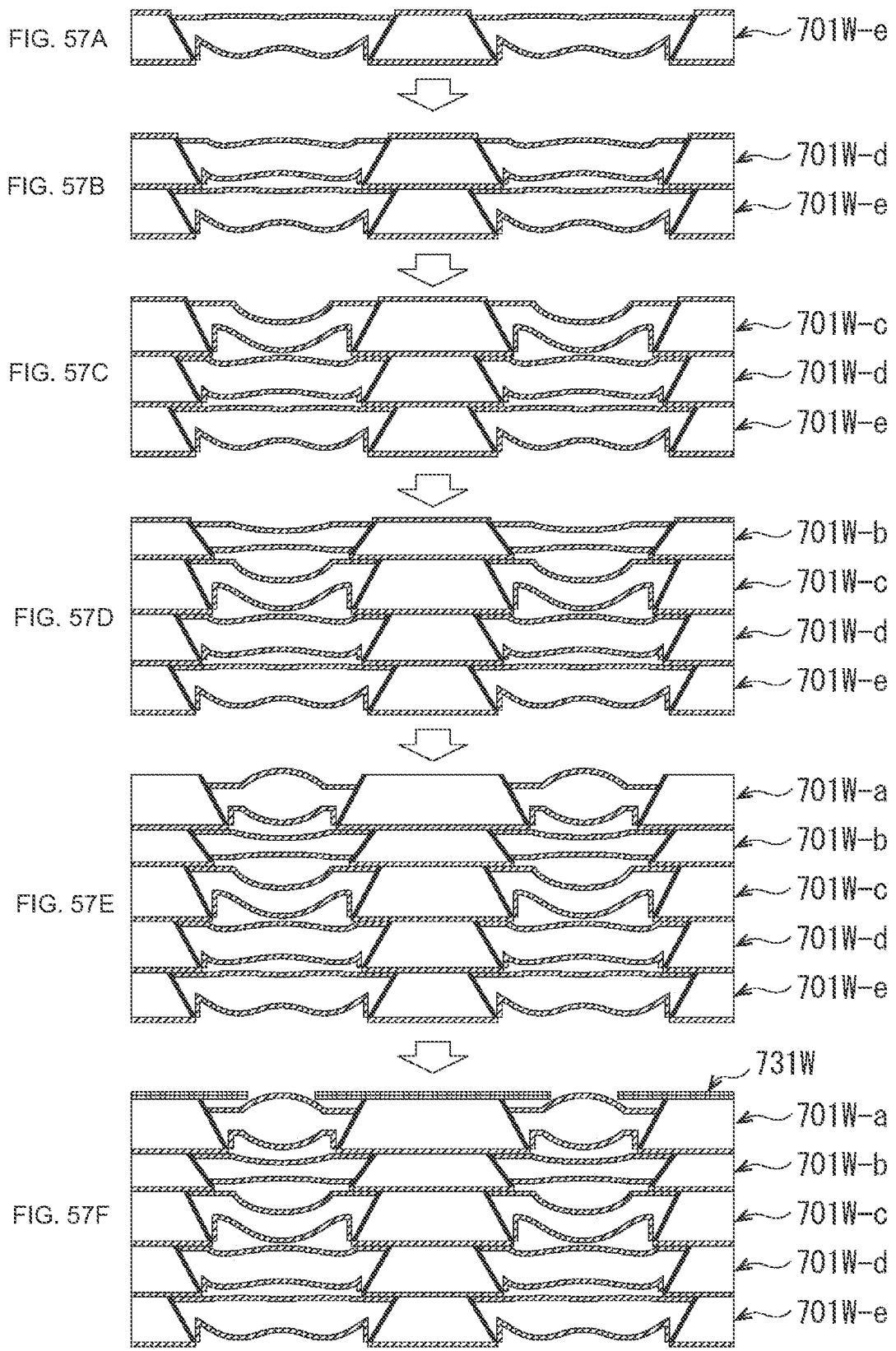

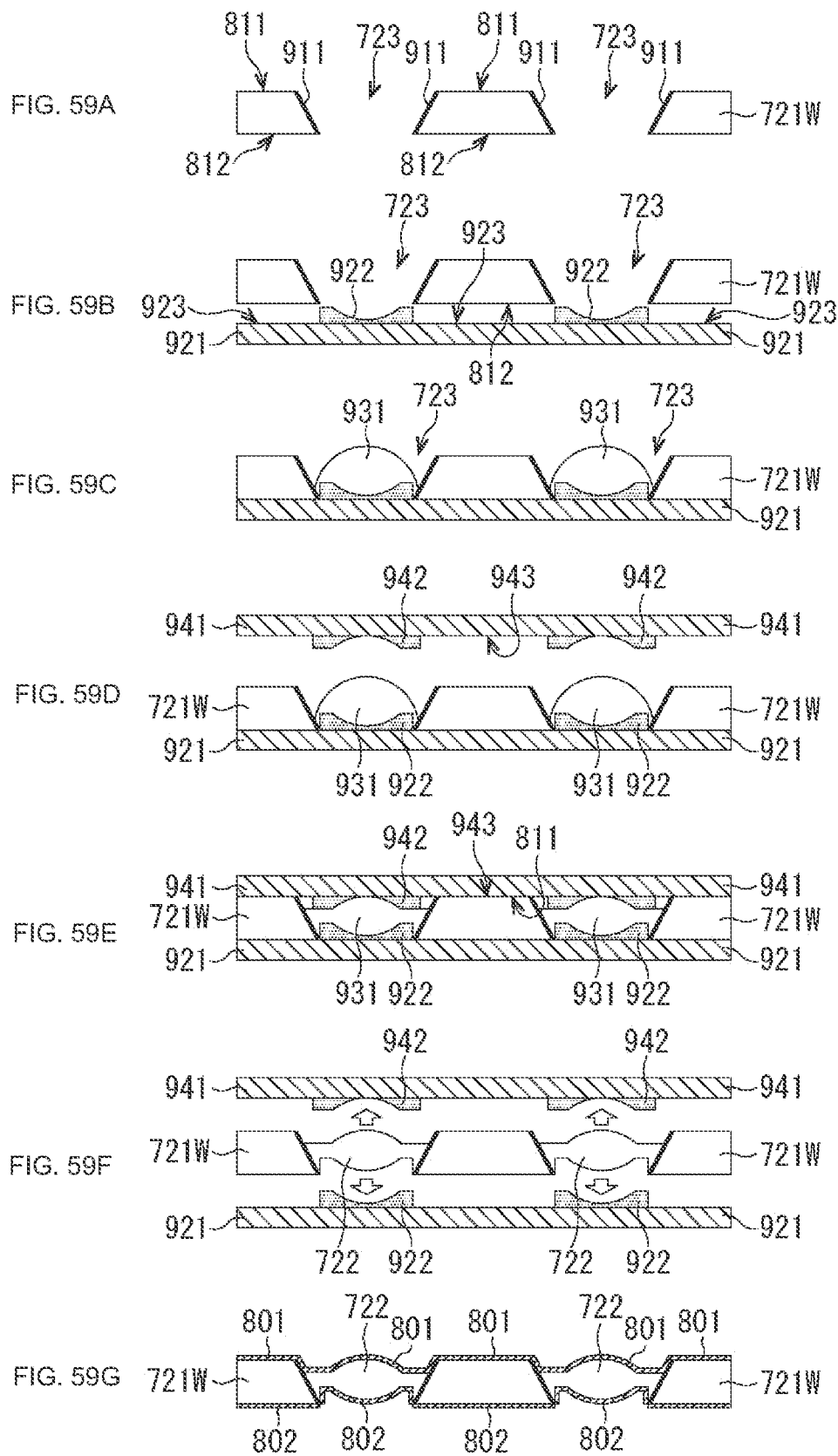

CAMERA PACKAGE, METHOD FOR MANUFACTURING CAMERA PACKAGE, AND ELECTRONIC DEVICE

CROSS REFERENCE TO RELATED APPLICATIONS

This application is a U.S. National Phase of International Patent Application No. PCT/JP2020/006166 filed on Feb. 18, 2020, which claims priority benefit of Japanese Patent Application No. JP 2019-030169 filed in the Japan Patent Office on Feb. 22, 2019. Each of the above-referenced applications is hereby incorporated herein by reference in its entirety.

TECHNICAL FIELD

The present disclosure relates to a camera package, a method for manufacturing a camera package, and an electronic device, and more particularly to a camera package, a method for manufacturing a camera package, and an electronic device with which it is possible to reduce manufacturing cost for lens formation.

BACKGROUND ART

As a method for forming a lens on a substrate, an imprinting technology of pressing a mold against a resin dropped on the substrate to transfer a mold shape is known. In order to form a defect-free lens with an excellent yield, it is common to use a method for forming a lens by dropping an excessive amount of resin with respect to the volume of the lens so that the resin protrudes from the mold. The reason to drop an excessive amount of resin is to form a bulky lens with a complicated shape, because the resin spreads by its own weight when being dropped onto the substrate.

For example, Patent Document 1 suggests a technology of providing an overflow section which traps an excessive resin on a mold so that the excessive resin does not flow into an unnecessary region.

CITATION LIST

Patent Document

Patent Document 1: Japanese Patent Application Laid-Open No. 2012-93765

SUMMARY OF THE INVENTION

Problems to be Solved by the Invention

Dropping resin more than necessary leads to an increase in manufacturing cost. In addition, if the mold is provided with an overflow section, the size of the mold itself is increased, and thus, in a case where multiple lenses are simultaneously molded on the substrate, the distance between the adjacent lenses cannot be reduced, resulting in generating a loss in the substrate. This leads to an increase in manufacturing cost.

The present disclosure is accomplished in view of such a situation, and an object of the present disclosure is to reduce manufacturing cost required for lens formation.

Solutions to Problems

A camera package according to a first aspect of the present technology includes: a solid-state imaging element; and a lens formed above a transparent substrate that protects the solid-state imaging element, in which a lens formation region in which the lens is formed above the transparent substrate and a lens free region around the lens formation region differ in contact angle.

A method for manufacturing a camera package according to a second aspect of the present technology includes: performing processing such that a lens formation region above a transparent substrate that protects a solid-state imaging element and a lens free region around the lens formation region differ in contact angle; dropping a lens material into the lens formation region above the transparent substrate; and pressing a mold to form a lens.

In the second aspect of the present technology, processing is performed such that a lens formation region above a transparent substrate that protects a solid-state imaging element and a lens free region around the lens formation region differ in contact angle, a lens material is dropped into the lens formation region above the transparent substrate, and a mold is pressed to form a lens.

An electronic device according to a third aspect of the present technology includes: a camera package including a solid-state imaging element, and a lens formed above a transparent substrate that protects the solid-state imaging element, in which a lens formation region in which the lens is formed above the transparent substrate and a lens free region around the lens formation region differ in contact angle; and a lens module including one or more lens-equipped substrates disposed above the camera package.

In the first and third aspects of the present technology, a solid-state imaging element and a lens formed above a transparent substrate that protects the solid-state imaging element are provided, and a lens formation region in which the lens is formed above the transparent substrate and a lens free region around the lens formation region differ in contact angle.

The camera package and electronic device may be an independent device or a module incorporated in another device.

BRIEF DESCRIPTION OF DRAWINGS

FIGS. 3A, 3B, 3C, 3D, and 3E are diagrams for describing a method for forming a lens resin part.

FIG. 7 is a diagram for describing a method for forming a lens resin part in the lens formation region in FIG. 6.

FIG. 8 is a diagram for describing in detail a region where a lens material is dropped.

FIGS. 9A and 9B are diagrams for describing details of a region where a lens material is dropped.

FIGS. 16A, 16B, and 16C are cross-sectional views showing an example of a shape of a side wall of a recessed part.

FIGS. 18A and 18B are diagrams for describing a timing for forming a lens resin part.

FIG. 19 is a diagram for describing a wafer-level lens process for forming a lens resin part.

FIGS. 33A and 33B are diagrams for describing operation and effect in a case where the mold in FIG. 31 is used.

FIGS. 57A, 57B, 57C, 57D, 57E, and 57F are diagrams for describing a method for manufacturing a multilayer lens structure.

FIGS. 59A, 59B, 59C, 59D, 59E, 59F, and 59G are diagrams for describing a method for manufacturing a lens-equipped substrate in a form of substrate.

MODE FOR CARRYING OUT THE INVENTION

Figure 1:
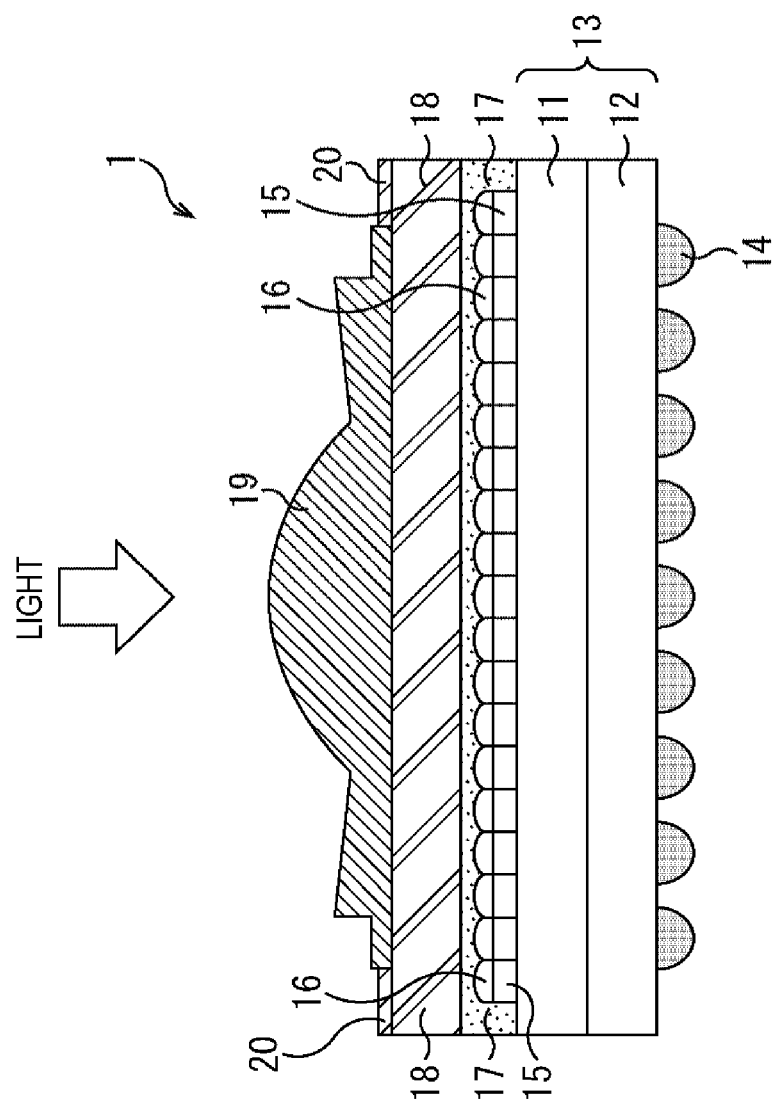
FIG. 1 is a schematic structural diagram of a camera package as a semiconductor device to which the present disclosure is applied.

Modes (hereinafter referred to as embodiments) for carrying out the present disclosure will be described below. Note that the description will be given in the following order.

1. Schematic structure of camera package
2. System configuration of camera package
3. Method for forming lens resin part
4. Timing of formation of lens resin part
5. Modification
6. First formation method for forming high contact angle film
7. Second formation method for forming high contact angle film
8. Third formation method for forming high contact angle film
9. Fourth formation method for forming high contact angle film
10. Formation of mold
11. Schematic structure of camera package without having high contact angle film
12. Operation and effect of mold
13. Modification of mold
14. Another embodiment of mold
15. Detailed structure of solid-state imaging element
16. Method for manufacturing camera package
17. Configuration example of camera module
18. Direct bonding between lens-equipped substrates
19. Method for manufacturing lens-equipped substrate
20. Example of application to electronic device
21. Example of application to in-vivo information acquisition system
22. Example of application to endoscopic surgical system
23. Example of application to mobile object <1. Schematic Structure of Camera Package>

FIG. 1 shows a schematic structure of a camera package as a semiconductor device to which the present disclosure is applied.

The camera package 1 shown in FIG. 1 converts light or electromagnetic wave entering the device in the direction of an arrow in the figure into an electric signal. Hereinafter, the present disclosure will give description, taking a device that uses light as a target to be converted into an electric signal as an example for the sake of convenience.

The camera package 1 includes at least a solid-state imaging element 13 having a laminated structure of a first structure 11 and a second structure 12, an external terminal 14, a protective substrate 18 formed above the first structure 11, a lens resin part 19 formed on the protective substrate 18, and a high contact angle film 20 formed around the lens resin part 19. Note that, in the following, for convenience, the first structure 11 is referred to as an upper structure 11, and the second structure 12 is referred to as a lower structure 12 with the light incidence surface side where light enters the device being defined as an upper side, and the other surface side of the device facing the light incidence surface being defined as a lower side in FIG. 1.

The camera package 1 is formed such that a semiconductor substrate (wafer) constituting a part of the upper structure 11, a semiconductor substrate (wafer) constituting a part of the lower structure 12, and the protective substrate 18 are bonded at wafer level, and then, the resultant is diced into individual camera packages 1.

In the upper structure 11 before the dicing process, pixels for converting incident light into an electric signal are formed on the semiconductor substrate (wafer). Each pixel includes, for example, a photodiode (PD) for photoelectric conversion and a plurality of pixel transistors that controls a photoelectric conversion operation and an operation of reading a photoelectrically converted electric signal. The pixel transistors are preferably MOS transistors, for example. The upper structure 11 included in the diced camera package 1 may be referred to as an upper chip, an image sensor substrate, or an image sensor chip.

For example, an R (red), G (green), or B (blue) color filter 15 and an on-chip lens 16 are formed on the upper surface of the upper structure 11. The protective substrate 18 for protecting the structure of the camera package 1, particularly the on-chip lens 16 and the color filter 15, is provided above the on-chip lens 16. The protective substrate 18 is a transparent substrate such as a glass substrate, for example. When the hardness of the protective substrate 18 is higher than the hardness of the on-chip lens 16, the effect of protecting the on-chip lens 16 is increased.

A lens resin part 19 formed by molding a resin material serving as a lens material into a predetermined shape by imprinting is provided on the upper surface of the protective substrate 18. The lens resin part 19 functions as a lens that refracts incident light in a predetermined direction so that the incident light enters a predetermined pixel of the upper structure 11. Further, a high contact angle film 20 is formed around the lens resin part 19 on the upper surface of the protective substrate 18. The high contact angle film 20 refers to a film in which, when the resin material that is the lens material is dropped in a step of forming the lens resin part 19, the contact angle of the resin material is greater than the contact angle of the protective substrate 18.

The lower structure 12 before the dicing process has a configuration in which a semiconductor circuit including a transistor and wiring is formed on a semiconductor substrate (wafer). The lower structure 12 included in the diced camera package 1 may be referred to as a lower chip, a signal processing substrate, or a signal processing chip. The lower structure 12 is provided with a plurality of external terminals 14 for electrical connection to wirings (not shown) outside the device. The external terminals 14 are, for example, solder balls.

The camera package 1 has a cavityless structure in which the protective substrate 18 is fixed above the upper structure 11 or above the on-chip lens 16 via a sealing resin 17 disposed on the on-chip lens 16. The sealing resin 17 has a hardness lower than the hardness of the protective substrate 18, and therefore, has a function of preventing transmission of a stress, which is applied to the protective substrate 18 from the outside of the camera package 1, to the inside of the device, as compared with a case where the sealing resin is not provided.

Note that the camera package 1 may have a structure different from the cavityless structure. Specifically, the camera package 1 may have a cavity structure in which a columnar or wall-like structure is formed on the upper surface of the upper structure 11, and the protective substrate 18 is fixed to the abovementioned columnar or wall-like structure so as to be supported above the on-chip lens 16 with a cavity.

<2. System Configuration of Camera Package>

Figure 2:
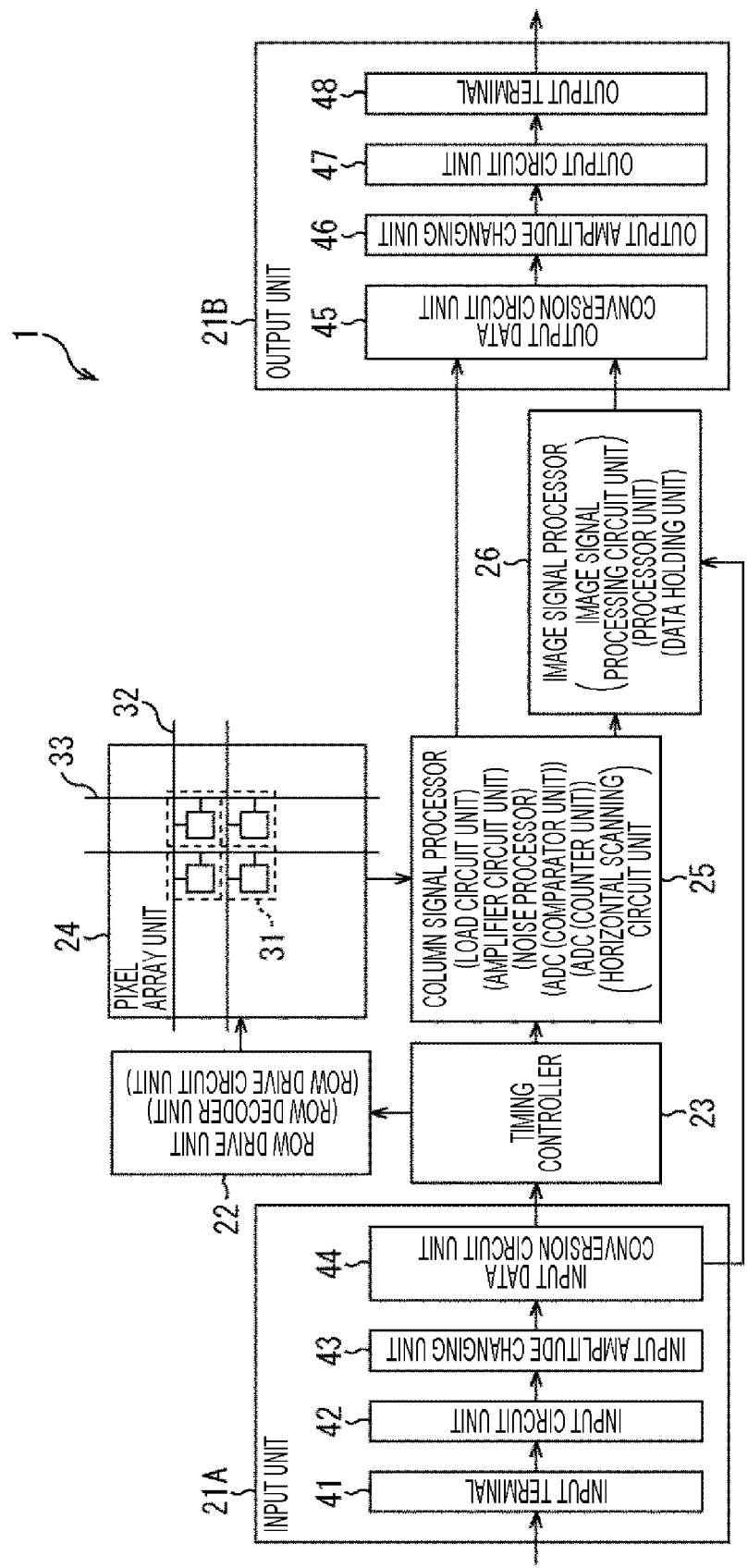
FIG. 2 is a block diagram showing a system configuration example of the camera package shown in FIG. 1.

FIG. 2 is a block diagram showing a system configuration example of the camera package 1.

The camera package 1 shown in FIG. 2 includes a pixel array unit 24 in which multiple pixels 31 each having a photoelectric conversion unit (PD) are arrayed in a row direction and a column direction.

The pixel array unit 24 is provided with row drive signal lines 32 for driving the pixels 31 for each row, and vertical signal lines (column read lines) 33 for reading a signal generated as a result of photoelectric conversion from a plurality of pixels 31 driven for each row. As shown in FIG. 2, multiple pixels 31 arrayed in the row direction are connected to one row drive signal line 32. Multiple pixels 31 arrayed in the column direction are connected to one vertical signal line 33.

The camera package 1 further includes a row drive unit 22 and a column signal processor 25.

The row drive unit 22 includes, for example, a row address controller, in other words, a row decoder unit, that determines a row position for driving pixels, and a row drive circuit unit that generates a signal for driving the pixel 31.

The column signal processor 25 includes, for example, a load circuit unit which is connected to the vertical signal lines 33 and which constitutes a source follower circuit with the pixels 31. Further, the column signal processor 25 may include an amplifier circuit unit that amplifies signals read from the pixels 31 via the vertical signal lines 33. In addition, the column signal processor 25 may further include a noise processor for removing a noise level of the system from the signals read from the pixels 31 as a result of photoelectric conversion.

The column signal processor 25 includes an analog-to-digital converter (ADC) for converting the signal read from the pixel 31 or the analog signal that has been subjected to the noise processing described above into a digital signal. The ADC includes a comparator unit for comparing the analog signal to be converted with a reference sweep signal that is to be compared with the analog signal, and a counter unit for counting the time until the comparison result in the comparator unit is inverted. The column signal processor 25 may further include a horizontal scanning circuit unit which performs control such that the read column is scanned.

The camera package 1 further includes a timing controller 23. The timing controller 23 supplies a signal for controlling a timing to the row drive unit 22 and the column signal processor 25 on the basis of a reference clock signal and a timing control signal input to the device. Hereinafter, in the present disclosure, all or a part of the row drive unit 22, the column signal processor 25, and the timing controller 23 may be simply referred to as a pixel peripheral circuit unit, a peripheral circuit unit, or a control circuit unit.

The camera package 1 further includes an image signal processor 26. The image signal processor 26 is a circuit that performs various kinds of signal processing on the data obtained as a result of photoelectric conversion, in other words, the data obtained as a result of an imaging operation in the camera package 1. The image signal processor 26 includes, for example, an image signal processing circuit unit and a data holding unit. The image signal processor 26 may further include a processor unit.

Examples of signal processing executed by the image signal processor 26 include tone curve correction processing for increasing the tone level in a case where the AD-converted imaging data indicates data obtained by capturing a dark subject, and reducing the tone level in a case where the AD-converted imaging data indicates data obtained by capturing a bright subject. In this case, it is desirable to store characteristic data of a tone curve in the data holding unit of the image signal processor 26 in advance in order to determine what kind of tone curve is used to correct the tone of the imaging data.

The camera package 1 further includes an input unit 21A. The input unit 21A inputs, for example, the abovementioned reference clock signal, timing control signal such as a vertical synchronization signal and a horizontal synchronization signal, characteristic data to be stored in the data holding unit of the image signal processor 26, or the like to the camera package 1 from outside the device. The input unit 21A includes an input terminal 41 which is an external terminal 14 for inputting data to the camera package 1, and an input circuit unit 42 which captures the signal input to the input terminal 41 into the inside of the camera package 1.

The input unit 21A further includes an input amplitude changing unit 43 that changes the amplitude of the signal captured by the input circuit unit 42 to an amplitude that can be easily used inside the camera package 1.

The input unit 21A further includes an input data conversion circuit unit 44 that changes the arrangement of data strings of the input data. The input data conversion circuit unit 44 is, for example, a serial-parallel conversion circuit that receives a serial signal as input data and converts it into a parallel signal.

Note that the input amplitude changing unit 43 and the input data conversion circuit unit 44 may be omitted.

In a case where the camera package 1 is connected to external memory devices such as flash memory, SRAM, and DRAM, the input unit 21A can be further provided with a memory interface circuit that receives data from these external memory devices.

The camera package 1 further includes an output unit 21B. The output unit 21B outputs image data captured by the camera package 1 and image data which has been subjected to signal processing by the image signal processor 26 from the camera package 1 to the outside of the device. The output unit 21B includes an output terminal 48 which is an external terminal 14 for outputting data from the camera package 1 to the outside of the device, and an output circuit unit 47 that is a circuit for outputting data from the inside of the camera package 1 to the outside of the device and for driving an external wiring outside the camera package 1 connected to the output terminal 48.

The output unit 21B further includes an output amplitude changing unit 46 that changes the amplitude of the signal used inside the camera package 1 to an amplitude that can be easily used in an external device connected to the outside of the camera package 1.

The output unit 21B further includes an output data conversion circuit unit 45 that changes the arrangement of data strings of the output data. The output data conversion circuit unit 45 is, for example, a parallel-serial conversion circuit that converts a parallel signal used in the camera package 1 into a serial signal.

The output data conversion circuit unit 45 and the output amplitude changing unit 46 may be omitted.

In a case where the camera package 1 is connected to external memory devices such as flash memory, SRAM, and DRAM, the output unit 21B can be further provided with a memory interface circuit that receives data from these external memory devices.

Note that, in the present disclosure, a circuit block including both or at least one of the input unit 21A and/or the output unit 21B may be referred to as an input/output unit 21 for the sake of convenience. Further, a circuit unit including both or at least one of the input circuit unit 42 and/or the output circuit unit 47 may be referred to as an input/output circuit unit 49.

<3. Method for Forming Lens Resin Part>

Next, a method for forming the lens resin part 19 on the protective substrate 18 will be described with reference to FIGS. 3A, 3B, 3C, 3D, and 3E.

First, contamination on the surface of the protective substrate 18 shown in FIG. 3A is removed by UV ozone cleaning using ultraviolet light (UV) and ozone (O3) or cleaning using a chemical solution. The cleaning using chemical solution may be performed by a cleaning method such as two-fluid cleaning or brush cleaning by using, for example, isopropyl alcohol (IPA), ethanol, acetone, etc.

After cleaning, the high contact angle film 20 is patterned on the upper surface of the protective substrate 18 as shown in-A of FIG. 3A. The high contact angle film 20 may be patterned by a lithography method, a screen printing method, an inkjet printing method, or the like. The high contact angle film 20 is formed in a region where a lens material 501, which will be dropped in the next step, is not intended to be placed, in other words, a region other than the lens resin part 19 on the protective substrate 18 in FIG. 1. As a material of the high contact angle film 20, a fluorine-based resin, a silicone (Si—CH3)-based resin, or the like can be used, for example. Further, as the material of the high contact angle film 20, a material having a function of blocking (absorbing or reflecting) light may be added or used. In this case, it is possible to simultaneously address the problem of flare and ghost by the high contact angle film 20.

It is to be noted that, after the surface of the protective substrate 18 is cleaned and before the high contact angle film 20 is patterned, an adhesion promoter for improving adhesion between the lens material 501 to be dropped in the next step and the protective substrate 18 may be applied to the entire upper surface of the protective substrate 18. The contact angle film of the adhesion promoter is smaller than that of the high contact angle film, and so, the high contact angle film has a large contact angle with respect to the adhesion promoter.

Next, as shown in FIG. 3B, the lens material 501 is dropped in a predetermined region on the protective substrate 18 where the lens resin part 19 is to be formed, specifically, to the inside of the region where the high contact angle film 20 is formed. The dropping amount of the lens material 501 is substantially equal to the volume of the finished lens resin part 19. The dropping position of the lens material 501 can be controlled with high accuracy with respect to an alignment mark formed at a predetermined position on the protective substrate 18. The lens material 501 includes, for example, a resin material that is cured by ultraviolet light.

FIGS. 4A, 4B, 4C, and 4D are plan views of the upper surface of the protective substrate 18 after the step of dropping the lens material 501 shown in FIG. 3B.

Figure 4B:
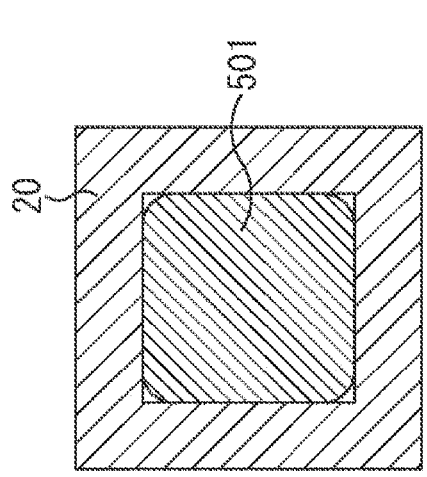
FIGS. 4A, 4B, 4C, and 4D are plan views of an upper surface of a protective substrate.
Figure 4D:
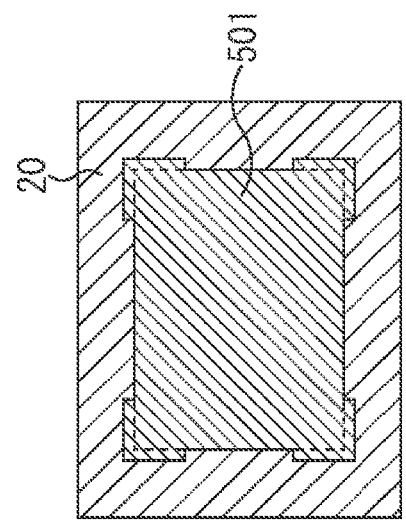
Figure 4A:
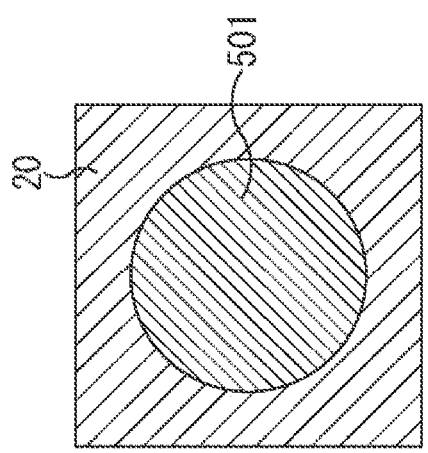
Figure 4C:
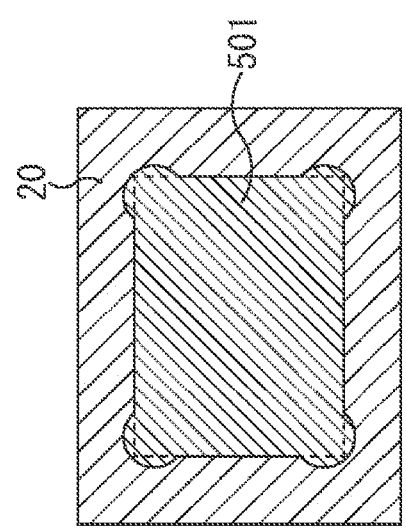

The planar shape of the lens resin part 19 may be circular as shown in FIG. 4A or rectangular as shown in FIG. 4B. The high contact angle film 20 is formed into a circular or rectangular shape depending on the planar shape of the lens resin part 19 to be formed. Since the high contact angle film 20 is formed on the upper surface of the protective substrate 18, the dropped lens material 501 spreads only in the region where the high contact angle film 20 is not formed. Since the lens material 501 does not spread more than necessary in a planar direction, the lens material 501 in an amount corresponding to the volume of the lens resin part 19 has a bulky shape, so that it is possible to form a thick lens. It is to be noted that, in a case where the high contact angle film 20 is formed into a rectangular shape as shown in FIG. 4, the rectangular region may be formed such that the lens formation region extends outward only in the vicinity of four corners as shown in FIGS. 4C and 4D in case the lens material 501 does not easily reach the four corners of the rectangle. The high contact angle film 20 may have any planar shape as long as the lens material 501 can definitely reach the four corners of the rectangle.

Returning to the description of FIGS. 3A, 3B, 3C, 3D, and 3E, the protective substrate 18 is placed and fixed by suction on a chuck 502 of an imprinting device, and in this state, a mold 503 which is attached to a mounting section 504 of the imprinting device and which has a concave-convex shape of the lens resin part 19 is pressed against the lens material 501 with a predetermined load at a predetermined speed as shown in FIG. 3C. Thus, the concave-convex shape of the mold 503 is transferred to the lens material 501 dropped on the protective substrate 18. The height at which the mold 503 is pressed against the lens material 501 is controlled according to the thickness of the lens resin part 19. Similarly to the dropping position of the lens material 501, the position of the mold 503 in the planar direction is controlled with high accuracy with respect to an alignment mark formed at a predetermined position on the protective substrate 18. The surface of the mold 503 that comes into contact with the lens material 501 may be subjected to a mold release treatment in advance so that it can be easily separated from the cured lens material 501.

Next, as shown in FIG. 3D, ultraviolet light is emitted from above the mounting section 504 in a state where the mold 503 is pressed against the lens material 501, whereby the lens material 501 is cured. A material that transmits ultraviolet light is used for the mounting section 504 and the mold 503. It is to be noted that the chuck 502 may include a material that transmits ultraviolet light, and the lens material 501 may be cured by emitting ultraviolet light from below the chuck 502. Alternatively, a thermosetting resin material may be used for the lens material 501 instead of an ultraviolet curable resin material, and the lens material 501 may be cured by heat treatment.

When the mold 503 is separated from the lens material 501 after the lens material 501 is cured, the lens resin part 19 shown in FIG. 1 is formed on the protective substrate 18 as shown in FIG. 3E. The dropping amount of the lens material 501 is substantially equal to the volume of the finished lens resin part 19, and the lens resin part 19 which is controlled with high accuracy without protrusion of the lens material 501 onto the high contact angle film 20 can be formed.

Figure 5:
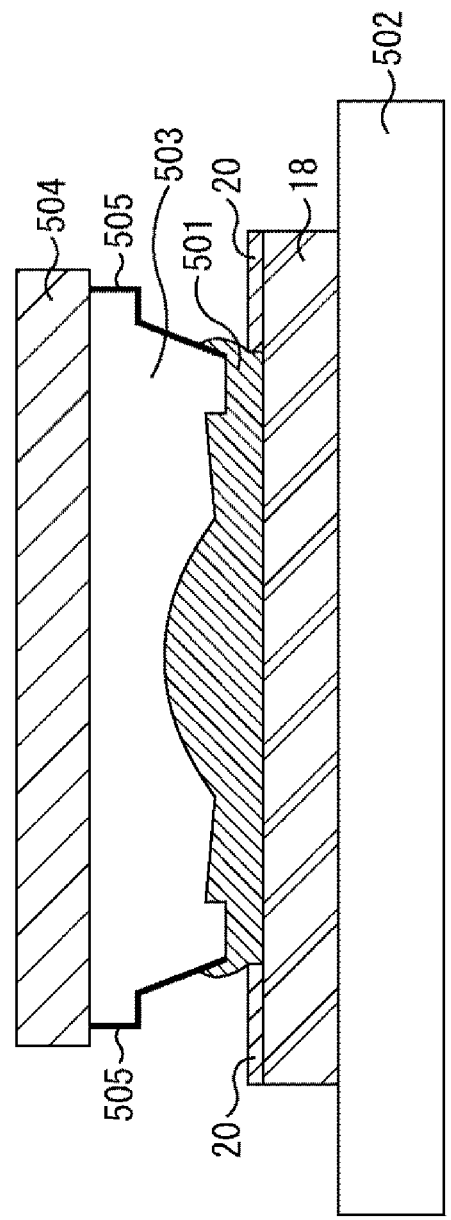
FIG. 5 is a diagram showing another example of a mold.

Note that, in a case where the dropping amount of the lens material 501 is set to be slightly greater than the amount corresponding to the volume of the finished lens resin part 19, a light-shielding film (mask) 505 that does not transmit ultraviolet light can be formed on the side surface on the outer periphery of the mold 503 as shown in FIG. 5. With this configuration, when the mold 503 is pressed against the lens material 501, the lens material 501 protruding to the outside is not irradiated with ultraviolet light, so that it can be removed without being cured.

After the mold release shown in FIG. 3E, an antireflection film may be formed on the outermost surface that is the upper surface of the lens resin part 19 and the upper surface of the high contact angle film 20. Examples of the material of the antireflection film include a silicon oxide film, a silicon nitride film, and a silicon oxynitride film.

As described above, the lens resin part 19 is formed in such a way that the high contact angle film 20 is formed around the lens resin part 19 on the upper surface of the protective substrate 18, the lens material 501 is dropped inside the high contact angle film 20, and the dropped lens material 501 is molded using the mold 503 and cured. Due to the formation of the high contact angle film 20 around the lens resin part 19, it is possible to form a thick lens having a bulky shape with a dropping amount of the lens material 501 corresponding to the volume of the finished lens resin part 19. It is not necessary to drop an extra lens material 501 exceeding the volume of the lens shape, and it is also not necessary to provide an overflow section in the mold 503.

Therefore, the mold 503 can also be designed in a small size. Thus, the manufacturing cost required for lens formation can be reduced.

<Other Examples of Lens Formation Region>

FIGS. 4C and 4D illustrate an example in which, in a case where the lens resin part 19 has a rectangular planar shape, a lens formation region to which the lens material 501 is dropped is formed so as to extend outward only in the vicinity of four corners with respect to the intended rectangular lens formation region in case the lens material 501 does not easily reach the four corners of the rectangle.

Figure 6:
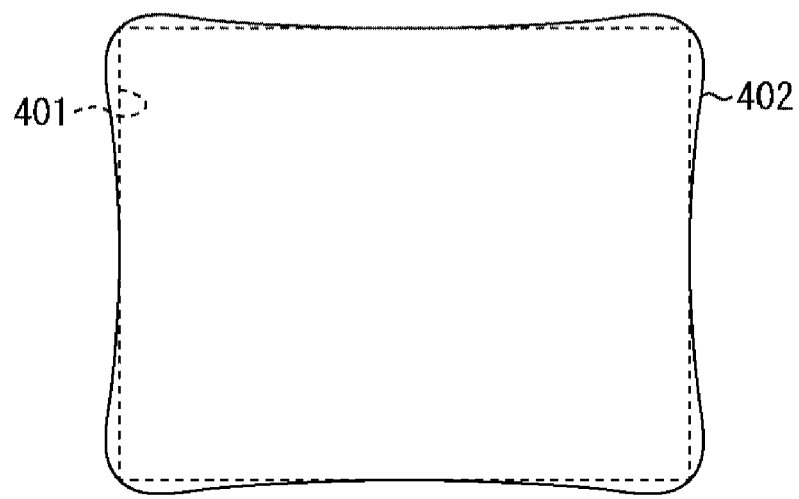
FIG. 6 is a diagram showing another example of a lens formation region.

FIG. 6 shows another example of the lens formation region.

A rectangular region 401 represented by a broken line in FIG. 6 indicates the planar shape of the intended lens resin part 19. On the other hand, a region 402 represented by a solid line indicates a lens formation region into which the lens material 501 is dropped in a case where the planar shape of the intended lens resin part 19 is the rectangular region 401. The region outside the lens formation region in which the lens material 501 is dropped is a lens free region where the high contact angle film 20 is formed. The region 402 that separates the lens formation region from the lens free region has a shape in which portions corresponding to the apexes of the intended rectangular region 401 of the lens resin part 19 are curved to extend outward.

FIG. 7 illustrates the state before pressing in FIG. 3C in the step of forming the lens resin part 19 in FIGS. 3A, 3B, 3C, 3D, and 3E and the molding position (pressing state) in FIG. 3D, in a case where the lens formation region in which the lens material 501 is dropped is formed as the region 402 which extends outward by curving the vicinity of four corners as shown in FIG. 6.

By forming the lens formation region in which the lens material 501 is dropped as the region 402 which extends outward by curving the vicinity of four corners of the intended rectangle of the lens resin part 19, it is possible to allow the lens material 501 to definitely reach the four corners as in four corner portions indicated by a broken line 403, for example. This configuration can prevent an occurrence of appearance defect such as chips and voids which may be caused due to insufficient amount of required liquid because the lens material 501 does not spread to the four corners of the intended rectangle of the lens resin part 19.

The details of the region 402 in which the lens material 501 is dropped will be described with reference to FIG. 8.

Note that, in FIG. 8, a region 411 indicates an enlarged portion of four corners of the region 402 in which the lens material 501 is dropped, and a region 412 in FIG. 8 indicates an enlarged short side of the region 402.

The region 402 in which the lens material 501 is dropped is formed by connecting a plurality of curves that is externally in contact with (circumscribes) the intended rectangular region 401 of the lens resin part 19.

More specifically, the region 402 includes a line segment AE formed by connecting a curve AB connecting points A and B, a curve BC connecting points B and C, a curve CD connecting points C and D, and a curve DE connecting points D and E, and a line segment EA which is symmetrical with respect to the line segment AE about a center O (hereinafter also referred to as a molding center O) of the intended rectangular region 401 of the lens resin part 19.

The curve AB corresponds to a given long side of the intended rectangular region 401 of the lens resin part 19, and is constituted by, for example, an arc which circumscribes the long side and which has a predetermined radius of curvature $r_{AB}$. The curve BC is constituted by, for example, an arc having a predetermined radius of curvature $r_{BC}$. The curve CD corresponds to a given short side of the rectangular region 401, and is constituted by, for example, an arc which circumscribes the short side and which has a predetermined radius of curvature $r_{CD}$. The curve DE is constituted by an arc having the same radius of curvature $r_{BC}$ as the curve BC.

Therefore, in other words, the region 402 is a closed region enclosed by the curve AB which circumscribes a given long side of the intended rectangular region 401 of the lens resin part 19 and which has a predetermined radius of curvature $r_{AB}$, the curve CD which circumscribes a given short side of the intended rectangular region 401 and which has a predetermined radius of curvature $r_{CD}$, the curve BC which connects the curve AB and the curve CD and which has a predetermined radius of curvature $r_{BC}$, and the curve DE which is connected to the other end of the curve CD that is not connected to the curve BC and which has the same radius of curvature $r_{BC}$ as the curve BC, the closed region being formed by placing the curves AB, the curves BC, the curves CD, and the curves DE in a symmetrical manner about the molding center O.

The curve AB circumscribing one given long side of the intended rectangular region 401 of the lens resin part 19 and the curve CD circumscribing one given short side of the rectangular region 401 are not necessarily an arc having a predetermined radius of curvature, and it is only sufficient that they form smooth curves extending outward in a direction away from the molding center O with respect to the intended rectangular region 401 of the lens resin part 19.

Further, the curve BC and the curve DE that connect the curve AB and the curve CD do not necessarily need to have an arc having a predetermined radius of curvature, and may be any smooth curve.

Furthermore, the region may have a shape in which an end point B of the curve AB and an end point C of the curve CD which is near the end point B are connected by a straight line as shown in FIG. 9A, or the end point B of the curve AB and the end point C of the curve CD near the end point B may be connected as a point as shown in FIG. 9B, for example.

FIGS. 9A and 9B are diagrams showing a modification of the region 402 in which the lens material 501 is dropped, and show only the region 412 which is an enlarged view of the short side of the region 402.

As described above, the region 402 in which the lens material 501 is dropped has a shape in which the curve AB circumscribing one given long side of the intended rectangular region 401 of the lens resin part 19 and the curve CD circumscribing one given short side of the rectangular region 401 are connected to each other with a smooth curve, a straight line, or a point, and the curve AB circumscribing the long side and the curve CD circumscribing the short side extend outward from the intended rectangular region 401 of the lens resin part 19 with nearness to the four corners (points distant from the molding center O) of the rectangular region 401 from the center O (lens center O) of the rectangular region 401.

Due to the configuration in which such region 402 is formed as the lens formation region, the lens material 501 that may protrude at the middle of sides of the intended rectangular region 401 of the lens resin part 19 can be guided to the four corners when the lens material 501 is dropped and the mold 503 is pressed against the lens material 501.

<Formation of Hydrophilic Film>

The abovementioned embodiment has described the configuration that enables formation of a bulky and thick lens with a dropping amount of the lens material 501 corresponding to the volume of the finished lens resin part 19 by giving water repellency due to formation of the high contact angle film 20 in the lens free region other than the lens formation region which serves as the lens resin part 19 on the protective substrate 18.

Meanwhile, it is sufficient that the lens formation region where the lens resin part 19 is to be formed and the lens free region differ in contact angle. Therefore, it is also possible to form a bulky and thick lens with a dropping amount of the lens material 501 corresponding to the volume of the finished lens resin part 19 by forming a hydrophilic film that has a low contact angle in the lens formation region instead of forming the high contact angle film 20 in the lens free region.

Figure 10A:
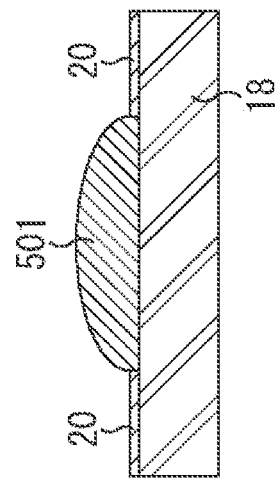
FIGS. 10A, 10B, and 10C are diagrams showing an example of forming a hydrophilic film in the lens formation region.

For example, FIG. 10A shows a state in which the lens material 501 is dropped with the high contact angle film 20 being formed in the lens free region described in the abovementioned embodiment. Here, the region 402 in FIG. 6 or the region in which the lens material 501 is dropped in FIGS. 4A, 4B, 4C, and 4D are used as the region where the lens material 501 is dropped, for example.

Figure 10B:
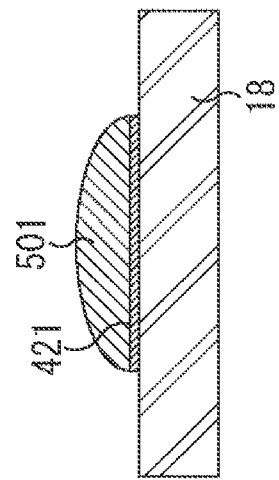

FIG. 10B shows a state in which the lens material 501 is dropped with a hydrophilic film 421 having hydrophilic property (low contact angle) being formed in the lens formation region without forming the high contact angle film 20 in the lens free region. As the material of the hydrophilic film 421, a resin material such as an acrylic resin or urethane resin containing a hydrophilic group and having a photoreactive functional group can be used, for example. The lens formation region needs to transmit incident light, and thus, it is obvious that a light transmissive material is used for the hydrophilic film 421.

Figure 10C:
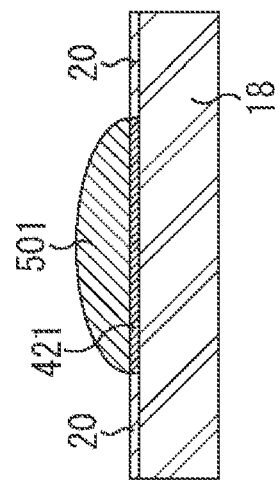

FIG. 10C shows a state in which the lens material 501 is dropped with the hydrophilic film 421 having hydrophilic property being formed in the lens formation region and the high contact angle film 20 being formed in the lens free region.

FIGS. 10A, 10B, and 10C are cross-sectional views corresponding to FIG. 3B. After the lens material 501 is dropped in the lens formation region as shown in FIGS. 10A, 10B, and 10C, the mold 503 having a concave-convex shape of the lens resin part 19 is pressed against the lens material 501 with a predetermined load at a predetermined speed, and then, ultraviolet light is emitted to cure the lens material 501 as described with reference to FIGS. 3C, 3D, and 3E.

It is to be noted that a state having a high contact angle can be formed by irradiating the surface of the lens free region of the protective substrate 18 with an ultrashort pulsed-laser beam to form micro-irregularities, instead of forming the high contact angle film 20 in the lens free region.

As described above, it is only sufficient that there is a difference in contact angle between the lens free region and the lens formation region of the protective substrate 18, and the high contact angle film 20 or the hydrophilic film 421 may be provided or may not be provided. A process of forming at least one of the high contact angle film 20 or the hydrophilic film 421 may be used, or a process of emitting an ultrashort pulsed-laser beam to form micro-irregularities may be used.

Figure 11:
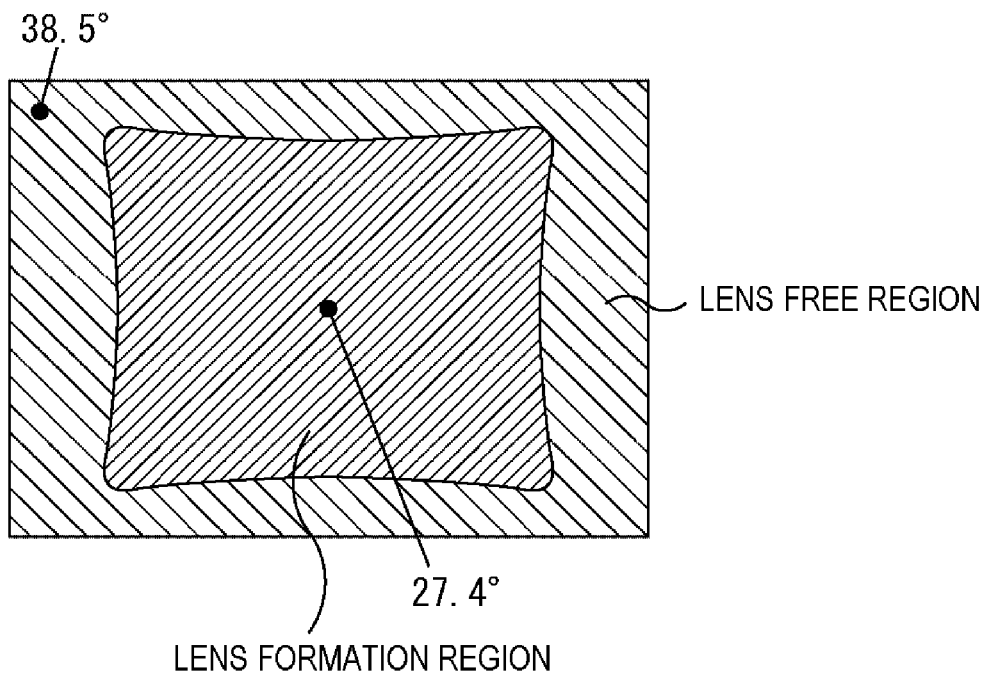
FIG. 11 is a diagram for describing a difference in contact angle between the lens formation region and a lens free region.

The measurement of contact angles was performed to find out the specific difference in contact angle between the lens formation region where the lens resin part 19 is to be formed and the lens free region where the lens resin part 19 is not formed in order to enable formation of a bulky and thick lens with the minimum necessary lens material 501. According to the measurement, the contact angle of 27.4 degrees of the lens formation region and the contact angle of 38.5 degrees of the lens free region were obtained as shown in FIG. 11, for example. It is possible to form a bulky and thick lens with the minimum necessary lens material 501, if there is a difference in contact angle by 10 degrees or more between the lens formation region and the lens free region.

<Structure in which Difference in Height is Generated in Lens Formation Region>

Next, a method for forming the lens resin part 19 with which performance for holding the lens material 501 is improved and an occurrence of appearance defect such as chips or voids is prevented other than the method for forming the high contact angle film 20 having water repellency or the method for forming the hydrophilic film 421 having hydrophilic property will be described.

Figure 12:
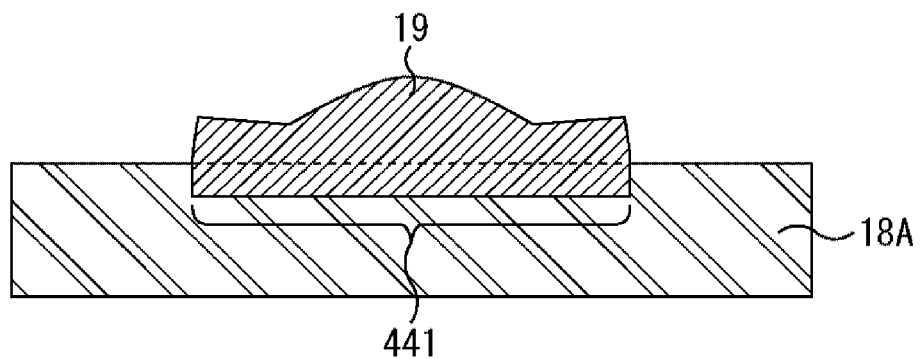
FIG. 12 is a cross-sectional view showing a configuration example of a protective substrate having a difference in height.

FIG. 12 is a cross-sectional view showing another configuration example of the protective substrate that enhances the performance for holding the lens material 501.

A protective substrate 18A shown in FIG. 12 is different from the protective substrate 18 in FIG. 1 or other drawings in that the lens formation region in which the lens resin part 19 is formed is provided with a recessed part 441 that is lower in height than the lens free region around the lens formation region. The lens resin part 19 is embedded in the recessed part 441 of the protective substrate 18A, and the upper surface of the lens resin part 19 has a shape as a lens for allowing the incident light to enter a predetermined pixel of the upper structure 11 (FIG. 1) by refracting the incident light in a predetermined direction.

Figure 13:
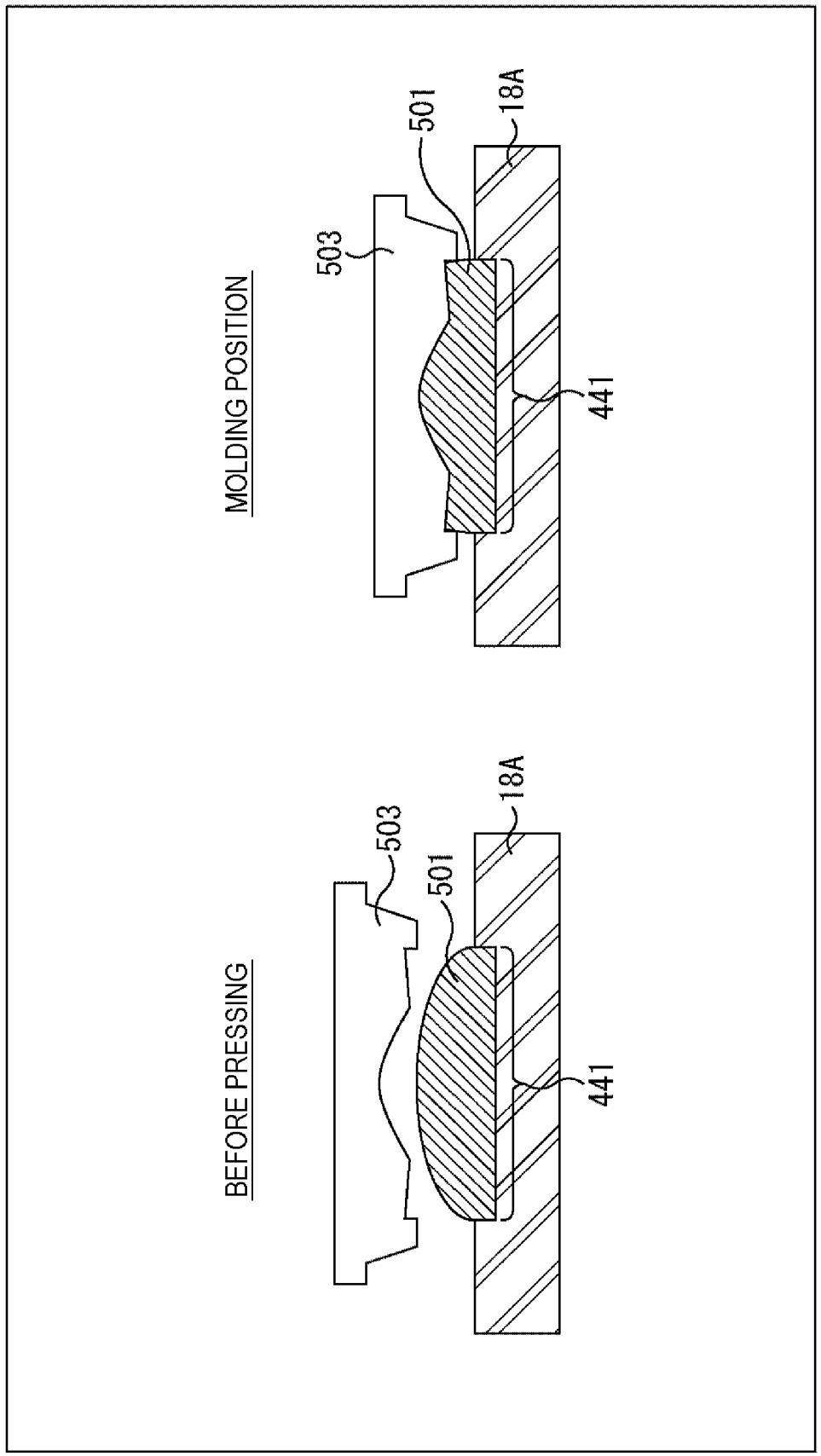
FIG. 13 is a diagram for describing a method for forming a lens resin part on the protective substrate shown in FIG. 12.

FIG. 13 shows the state before pressing in FIG. 3C and the state of the molding position in FIG. 3D in the process of forming the lens resin part 19 in FIGS. 3A, 3B, 3C, 3D, and 3E using the protective substrate 18A provided with the recessed part 441.

The lens material 501 of the lens resin part 19 is dropped in the recessed part 441 of the protective substrate 18A, and irradiated with ultraviolet light in a state where the mold 503 having a concave-convex shape of the lens resin part 19 is pressed against the lens material 501 with a predetermined load at a predetermined speed, by which the lens material 501 is cured.

As described above, in a case where the protective substrate 18A is provided with the recessed part 441, performance for holding the lens material 501 is enhanced by the angular structure due to a difference in height and the liquid surface tension. Further, since the contact area with the protective substrate 18A is increased as compared with the case where the lens formation region is flat, the peeling resistance of the lens resin part 19 after curing is improved.

Regarding the degree of spread of the lens material 501 in the planar direction, an increase in contact area is advantageous for spreading the lens material 501, so that the lens material 501 spreads to the corners. Further, since a barrier is formed due to the difference in height, the protrusion of the lens material 501 is also suppressed.

Therefore, according to the protective substrate 18A provided with the recessed part 441, it is possible to improve the performance for holding the lens material 501 and prevent the occurrence of appearance defects such as chips and voids.

The protective substrate 18A provided with the recessed part 441 may be combined with at least one of the high contact angle film 20 or the hydrophilic film 421 described with reference to FIGS. 10A, 10B, and 10C.

Figure 14A:
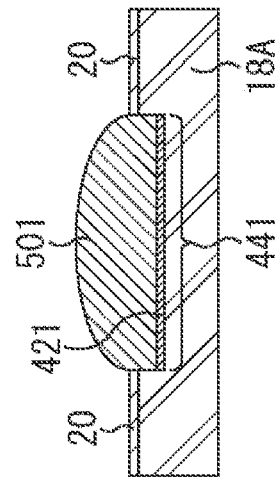
FIGS. 14A, 14B, and 14C are cross-sectional views showing a configuration example in which a film is added to the protective substrate shown in FIG. 12.

FIG. 14A shows a state in which the lens material 501 is dropped with the high contact angle film 20 being formed in the lens free region of the protective substrate 18A provided with the recessed part 441.

Figure 14B:
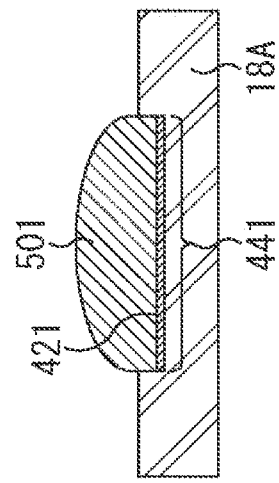

FIG. 14B shows a state in which the lens material 501 is dropped with the hydrophilic film 421 being formed in the lens formation region of the protective substrate 18A provided with the recessed part 441.

Figure 14C:
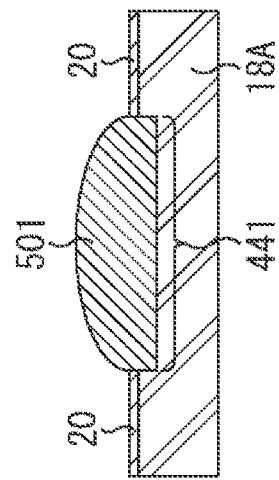

FIG. 14C shows a state in which the lens material 501 is dropped with the hydrophilic film 421 having hydrophilic property being formed in the lens formation region of the protective substrate 18A provided with the recessed part 441 and the high contact angle film 20 being formed in the lens free region.

By using the protective substrate 18A provided with the recessed part 441 in combination with at least one of the high contact angle film 20 or the hydrophilic film 421, the performance for holding the lens material 501 can be further enhanced, and the occurrence of appearance defects can be prevented.

Figure 15A:
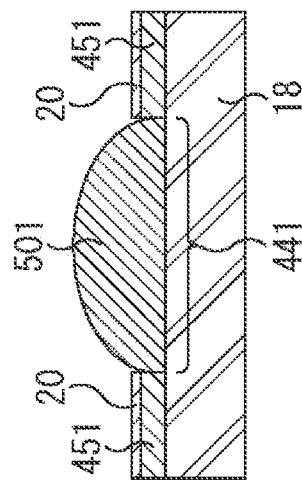
FIGS. 15A, 15B, and 15C are cross-sectional views showing a configuration example of a protective substrate having a difference in height by a thick film.

Note that, although the protective substrate 18A has the recessed part 441 formed by cutting the substrate, it is only sufficient that there is a difference in height between the lens formation region where the lens resin part 19 is to be formed and the lens free region around the lens formation region. Therefore, the recessed part 441 may be formed by providing a thick film 451 in the lens free region of the flat protective substrate 18 as shown in FIG. 15A, for example. As the material of the thick film 451, a resin material that can be patterned such as a resist material, an inorganic film such as SiO2 or a metal film, or the like can be used, for example. Alternatively, the thickness of the high contact angle film 20 having water repellency may be increased.

Figure 15B:
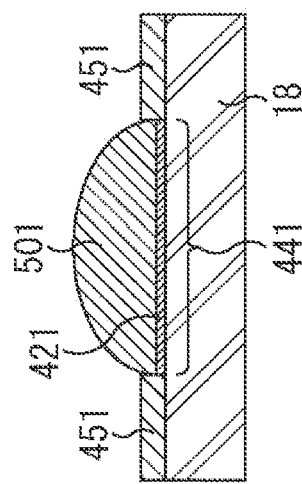

FIG. 15B shows a state in which the hydrophilic film 421 is further formed in the lens formation region of the protective substrate 18 provided with the recessed part 441 that is formed by providing the thick film 451 in the lens free region.

Figure 15C:
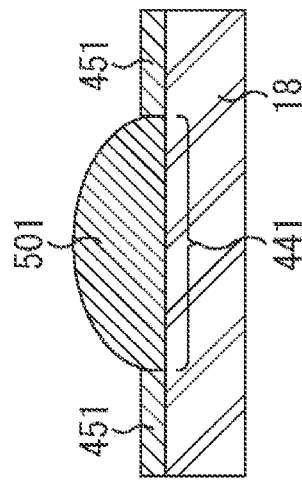

FIG. 15C shows a state in which the high contact angle film 20 is further formed on the upper surface of the thick film 451 in the lens free region of the protective substrate 18 provided with the recessed part 441 that is formed by providing the thick film 451 in the lens free region.

In this way, the protective substrate 18 having the recessed part 441 formed by providing the thick film 451 in the lens free region may be combined for use with the high contact angle film 20 having water repellency or the hydrophilic film 421 having hydrophilic property described above.

FIGS. 16A, 16B, and 16C show modifications of the protective substrate 18A provided with the recessed part 441.

FIG. 16A shows an example of the protective substrate 18A in which the side wall of the recessed part 441 has a tapered shape so that the opening on the upper surface side is larger than that on the bottom surface side.

FIG. 16B shows an example of the protective substrate 18A in which the side wall of the recessed part 441 has an inverted tapered shape so that the opening on the upper surface side is smaller than that on the bottom surface side.

FIG. 16C shows an example of the protective substrate 18A in which the side wall of the recessed part 441 has a curved shape that projects outward of the lens. Contrary to the example of FIG. 16C, the side wall of the recessed part 441 may have a curved surface that projects to the center of the lens.

It is only sufficient that the recessed part 441 generates a difference in height between the uppermost surface of the protective substrate 18A and the flat surface of the lens formation region, and therefore, the side wall of the recessed part 441 may have any shape as in the examples of FIGS. 16A, 16B, and 16C.

FIGS. 17A, 17B, 17C, and 17D are cross-sectional views showing another configuration example of the protective substrate that enhances performance for holding the lens material 501.

Note that FIGS. 17A, 17B, 17C, and 17D show states before the lens material 501 dropped in the recessed part 441 is molded.

Figure 17A:
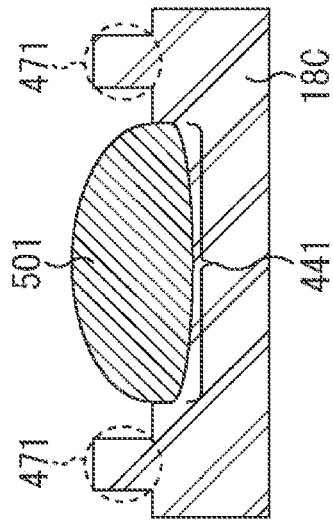
FIGS. 17A, 17B, 17C, and 17D are cross-sectional views showing a configuration example of a protective substrate having a bank and a difference in height.

A protective substrate 18B shown in FIG. 17A has a structure in which a bank 471 that blocks the outflow of the lens material 501 is added to the outer peripheral portion of the protective substrate 18A provided with the recessed part 441 shown in FIG. 12 in the planar direction of the lens material 501.

Figure 17B:
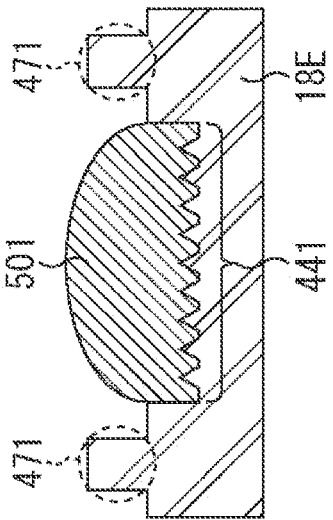

A protective substrate 18C shown in FIG. 17B has a structure similar to that of the protective substrate 18B shown in FIG. 17A except that the bottom surface of the recessed part 441 is curved to project downward. In the protective substrate 18C shown in FIG. 17B, the bottom surface of the recessed part 441 is curved to project downward, but it may be curved to project upward.

Figure 17C:
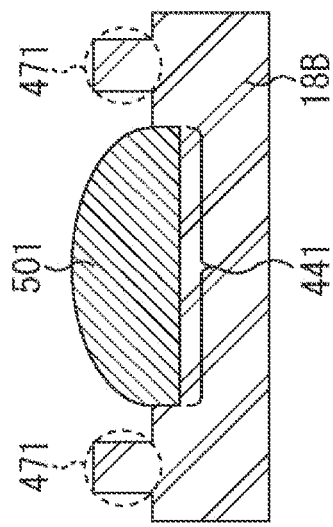

A protective substrate 18D shown in FIG. 17C has a structure similar to that of the protective substrate 18B shown in FIG. 17A except that the bottom surface of the recessed part 441 is formed into a circular cone or polygonal pyramid that projects upward with the lens center as a vertex, and the outer peripheral portion contacting the side surface is the lowest in height.

According to the structure of the protective substrate 18D, the recessed part 441 is formed such that the outer peripheral portion of the bottom surface is the lowest in height, so that the lens material 501 is less likely to leak from the recessed part 441 (lens formation region).

Figure 17D:
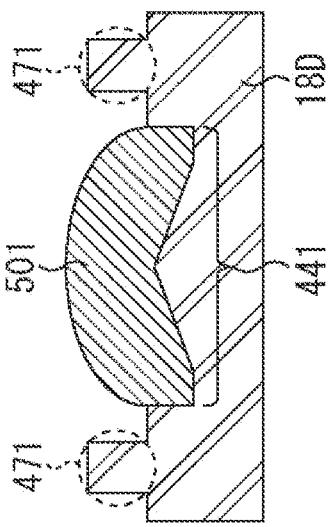

A protective substrate 18E shown in FIG. 17D has a structure similar to that of the protective substrate 18B shown in FIG. 17A except that the bottom surface of the recessed part 441 has a recessed and projected pattern having a predetermined cycle.

According to the structure of the protective substrate 18E having the periodic recessed and projected pattern formed on the bottom surface of the recessed part 441, the lens material 501 is less likely to leak from the recessed part 441, and the adhesion between the protective substrate 18E and the lens material 501 (lens resin part 19) is improved. Note that the recessed and projected pattern may be random, not periodic.

As described with reference to FIGS. 12, 13, 14A, 14B, 14C, 15A, 15B, 15C, 16A, 16B, 16C, 17A, 17B, 17C, and 17D, each of the protective substrates 18A to 18E includes a recessed part 441, and the average height of the lens formation region is lower than the average height of the lens free region when a predetermined plane parallel to the surface of the substrate is defined as a reference position in the height direction. A difference in height between the surface of the lens formation region and the surface of the lens free region may be formed by recessing the substrate of the lens formation region or by forming a thick film 451 in the lens free region of the flat substrate. Further, the bottom surface of the recessed part 441 may be a recessed surface, a projecting surface, an uneven surface, an inclined surface, or the like, and it is not necessary that the entire bottom surface has a uniform height. The side surface (side wall) of the recessed part 441 may also be a recessed surface, a projecting surface, an uneven surface, an inclined surface, or the like.

Due to the difference in height between the surface of the lens formation region and the surface of the lens free region, the performance for holding the lens material 501 can be enhanced, and an occurrence of appearance defects due to insufficient liquid can be prevented. Further, the contact area with the substrate is increased, whereby the peeling resistance of the lens resin part 19 can be improved.

<4. Timing of Formation of Lens Resin Part>

FIGS. 18A and 18B are diagrams for describing a timing at which the process of forming the lens resin part 19 described with reference to FIGS. 3A, 3B, 3C, 3D, and 3E are performed.

FIG. 18A shows a method for forming the lens resin part 19 on the upper surface of the protective substrate 18 by the method described with reference to FIGS. 3A, 3B, 3C, 3D, and 3E after the protective substrate 18 is disposed above the solid-state imaging element 13.

On the other hand, FIG. 18B shows a method in which the lens resin part 19 is formed in advance on the upper surface of the protective substrate 18 with the method described with reference to FIGS. 3A, 3B, 30, 3D, and 3E, and then, the protective substrate 18 having the lens resin part 19 formed thereon is placed above the on-chip lens 16 or the color filter 15 of the solid-state imaging element 13 at any timing.

As described above, the lens resin part 19 may be formed on the protective substrate 18 that has been combined with the solid-state imaging element 13, or the lens resin part 19 may be formed on the protective substrate 18, and then, the protective substrate 18 may be combined with the solid-state imaging element 13.

Further, although FIGS. 3A, 3B, 3C, 3D, and 3E show a lens formation method for forming the lens resin part 19, focusing on one lens resin part 19, the method described with reference to FIGS. 3A, 3B, 3C, 3D, and 3E can also be applied to a wafer-level lens process for simultaneously forming multiple lens resin parts 19 in the planar direction of the protective substrate 18.

That is, as shown in FIG. 19, a large number of lens resin parts 19 can be collectively formed on a device substrate 552 by an imprinting process using a wafer replica substrate 551 having multiple molds 503 shown in FIGS. 3A, 3B, 3C, 3D, and 3E arrayed in the planar direction.

Figure 20:
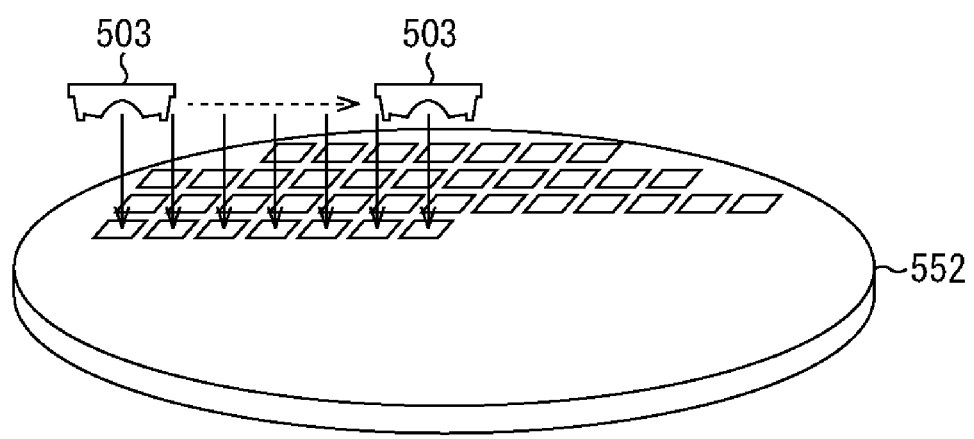
FIG. 20 is a diagram for describing a wafer-level lens process for forming a lens resin part.

Alternatively, as shown in FIG. 20, multiple lens resin parts 19 can be formed on the device substrate 552 in such a way that a single mold 503 is used, and the position of the mold 503 on the device substrate 552 is changed to sequentially form the lens resin part 19 on the device substrate 552.

The device substrate 552 in FIGS. 19 and 20 corresponds to a wafer substrate in which the protective substrate 18 is formed above the solid-state imaging element 13 before the lens resin part 19 is formed as shown in the upper chart in FIGS. 18A and 18B, corresponds to the protective substrate 18 in a wafer form before the lens resin part 19 is formed.

<5. Modification>

Figure 21:
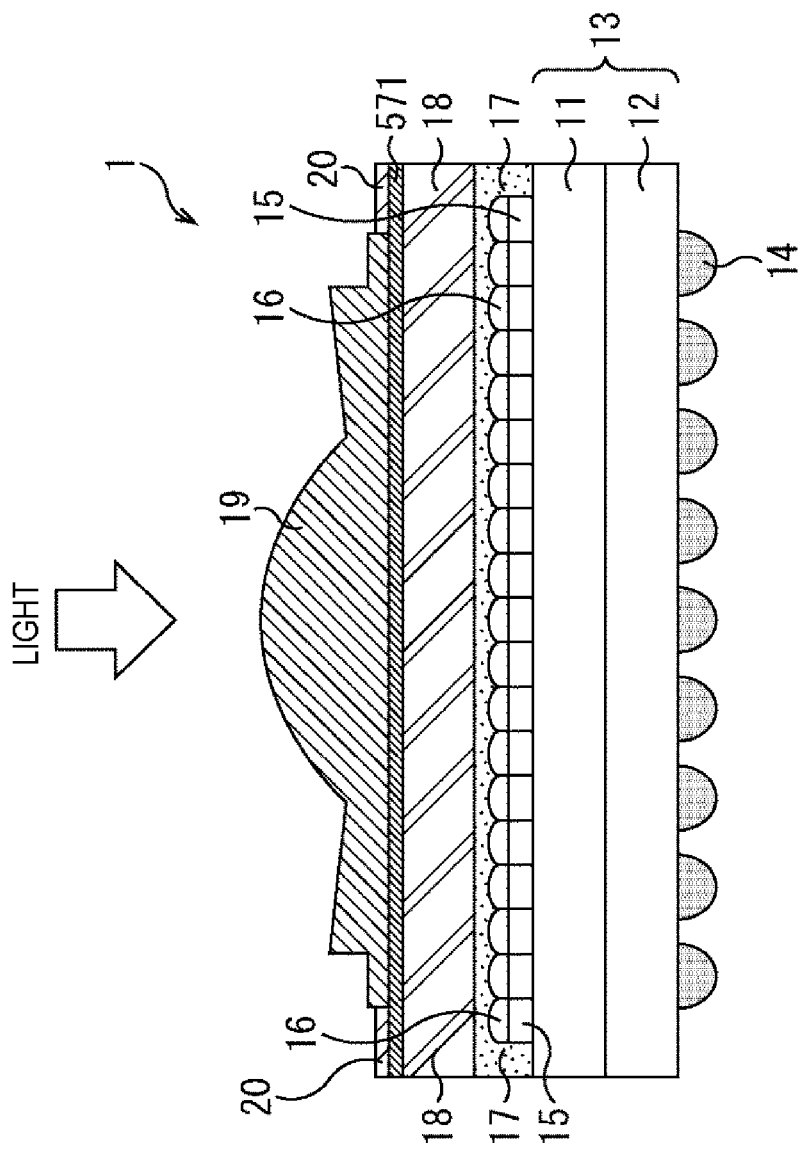
FIG. 21 is a diagram showing a modification of the camera package shown in FIG. 1.
Figure 22:
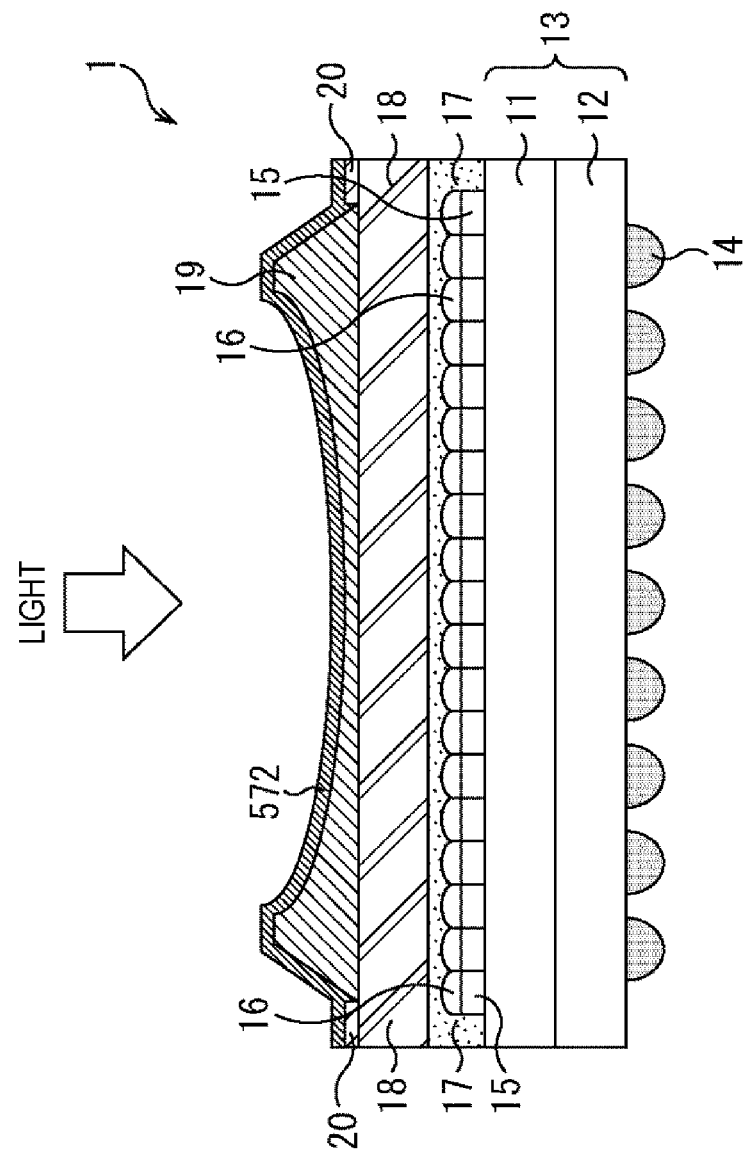
FIG. 22 is a diagram showing another example of the shape of the lens resin part.

FIGS. 21 and 22 show modifications of the camera package 1 shown in FIG. 1.

It has been described in the description with reference to FIGS. 3A, 3B, 3C, 3D, and 3E that an adhesion promoter which improves the adhesion between the lens material 501 and the protective substrate 18 may be formed on the entire upper surface of the protective substrate 18.

FIG. 21 shows a cross-sectional view of the camera package 1 in a case where an adhesion promoter is formed on the upper surface of the protective substrate 18.

As shown in FIG. 21, an adhesion promoter 571 is formed on the entire upper surface of the protective substrate 18, and the lens resin part 19 and the high contact angle film 20 are formed on the adhesion promoter 571.

The high contact angle film 20 has a property of having a larger contact angle than the adhesion promoter 571. Therefore, even in a case where the adhesion promoter 571 is formed on the entire upper surface of the protective substrate 18, the lens resin part 19 having a bulky shape can be formed by an amount corresponding to the volume of the lens resin part 19 as described with reference to FIGS. 3A, 3B, 3C, 3D, and 3E.

It is to be noted that, instead of the adhesion promoter 571, another film, for example, an IR cut filter that blocks IR light, may be formed in the camera package 1. In addition, the IR cut filter and the adhesion promoter 571 may be laminated.

FIG. 22 is a diagram showing another example of the shape of the lens resin part 19.

The lens resin part 19 may have any shape as long as it exhibits performance as a lens, and may have a shape shown in FIG. 22, for example. The shape of the mold 503 is also changed depending on the shape of the lens resin part 19.

Further, in the camera package 1 shown in FIG. 22, an antireflection film 572 is formed on the upper surface of the lens resin part 19 and the upper surface of the high contact angle film 20. As described above, a material that absorbs or reflects light may be added as the material of the high contact angle film 20, or as shown in FIG. 22, the antireflection film 572 may be formed on the upper surface of the lens resin part 19 and the high contact angle film 20. With this configuration, flare and ghost can be suppressed.

<6. First Formation Method for Forming High Contact Angle Film>

The method for forming the lens resin part 19 described with reference to FIGS. 3A, 3B, 3C, 3D, and 3E include the method for forming the lens resin part 19 after the protective substrate 18 is bonded above the solid-state imaging element 13 as described with reference to FIG. 18A and the method for forming the lens resin part 19 before the protective substrate 18 is bonded as described with reference to FIG. 18B.

Figure 23:
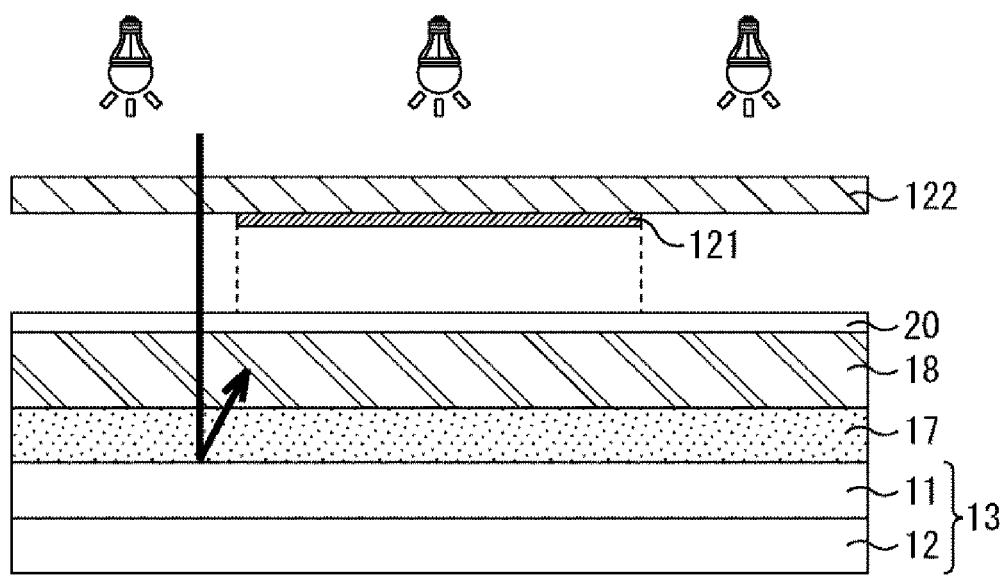
FIG. 23 is a diagram for describing a patterning defect of a high contact angle film.

During patterning of the high contact angle film 20 shown in FIG. 3A in the case where the lens resin part 19 is formed after the protective substrate 18 is bonded as described with reference to FIG. 18A, the high contact angle film 20 is exposed using a photomask 122 having a light-shielding pattern 121 formed in a region of the lens resin part 19 as shown in FIG. 23, for example. During exposure, exposure light may transmit the high contact angle film 20, the protective substrate 18, and the like, enter again the protective substrate 18 by being reflected by the semiconductor substrate (silicon substrate) of the upper structure 11 of the solid-state imaging element 13, and enter the region of the light-shielding pattern 121 of the photomask 122, as indicated by an arrow in FIG. 23. As a result, patterning defect of the high contact angle film 20 may occur.

In view of this, a method for forming the high contact angle film 20 capable of preventing the occurrence of patterning defect of the high contact angle film 20 will be described below.

The first to fourth formation methods for forming the high contact angle film 20 described below are intended to prevent patterning defect of the high contact angle film 20 that occurs when the lens resin part 19 is formed after the protective substrate 18 is bonded above the solid-state imaging element 13. Therefore, the premise is that the protective substrate 18 is bonded above the solid-state imaging element 13 with the sealing resin 17. However, they may be applied to the case where the high contact angle film 20 is formed on the protective substrate 18 before the protective substrate 18 is bonded to the solid-state imaging element 13 described with reference to FIG. 18B.

The first formation method for forming the high contact angle film will be described with reference to FIGS. 24A, 24B, 24C, 24D, 24E, and 24F.

Note that, in FIGS. 24A, 24B, 24C, 24D, 24E, and 24F, the portion below the upper structure 11 of the solid-state imaging element 13 (external terminal 14 side) is not illustrated.

Figure 24A:
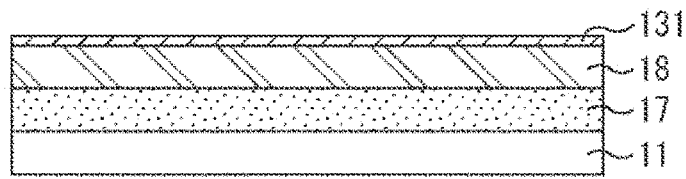
FIGS. 24A, 24B, 24C, 24D, 24E, and 24F are diagrams for describing a first formation method for forming a high contact angle film.

First, as shown in FIG. 24A, the surface of the protective substrate 18 is cleaned with UV ozone or a chemical solution, and then, an adhesion promoter 131 for improving adhesion between the lens material 501 which is to be dropped in the subsequent step (FIG. 3B) and the protective substrate 18 is formed on the upper surface of the protective substrate 18.

Figure 24B:
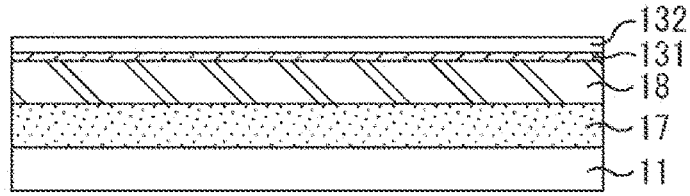

Next, as shown in FIG. 24B, a light absorbing film 132 that absorbs exposure light for patterning the high contact angle film 20 is formed on the upper surface of the adhesion promoter 131 using, for example, a spin coating method. Note that the method for forming the light absorbing film 132 is not limited to the spin coating method, and any method such as spraying, dipping, method using squeegee, and inkjet, may be used as long as a thin film can be formed. The exposure light is, for example, UV light, and the light absorbing film 132 that absorbs UV light can be, for example, a black resist or an antireflection film.

Figure 24C:
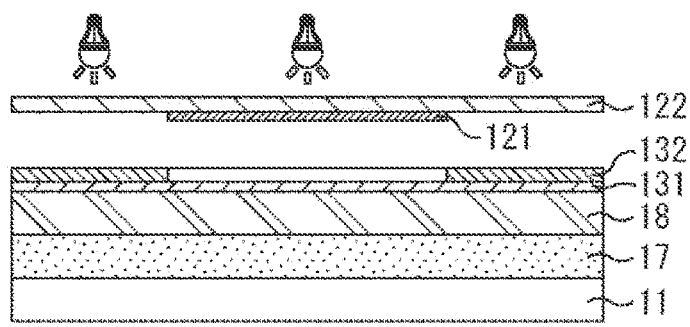

Next, as shown in FIG. 24C, exposure is performed using the photomask 122 having the light-shielding pattern 121 formed in the region of the lens resin part 19. The light absorbing film 132 is formed only around the region where the lens resin part 19 is to be formed, and the light absorbing film 132 in the region where the lens resin part 19 is to be formed is removed.

Figure 24D:
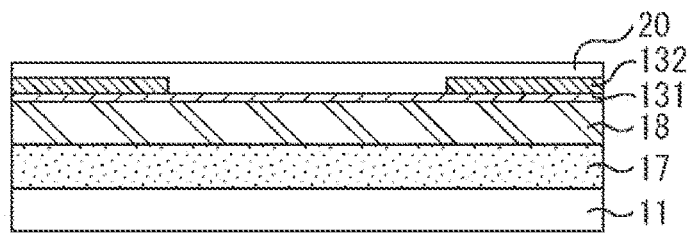
Figure 24E:
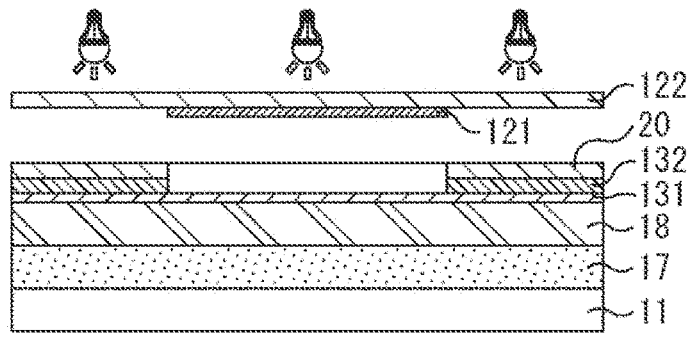

Next, the high contact angle film 20 is patterned in the similar manner to the light absorbing film 132. Specifically, after the high contact angle film 20 is formed on the entire upper surfaces of the adhesion promoter 131 and the light absorbing film 132 as shown in FIG. 24D, exposure is performed using the photomask 122 having the light-shielding pattern 121 formed thereon as shown in FIG. 24E. Thus, as shown in FIG. 24E, the high contact angle film 20 is formed only on the upper surface of the light absorbing film 132, in other words, in the same region as the region where the light absorbing film 132 is formed.

The difference between the cross-sectional configuration in FIG. 1 and FIG. 3A and the cross-sectional configuration in FIG. 24E is that the light absorbing film 132 is formed between the high contact angle film 20 and the protective substrate 18. Due to the light absorbing film 132 formed around the region where the lens resin part 19 is to be formed, light for exposing the region other than the lens resin part 19 is prevented from transmitting the protective substrate 18 and the like and reaching the semiconductor substrate of the upper structure 11 of the solid-state imaging element 13 as indicated by the arrow in FIG. 23. Therefore, the occurrence of patterning defect of the high contact angle film 20 due to the reflection from the semiconductor substrate can be suppressed.

Note that, although the light absorbing film 132 is formed between the adhesion promoter 131 and the high contact angle film 20 in the above example, it may be formed between the sealing resin 17 and the protective substrate 18 or between the upper structure 11 and the sealing resin 17.

Further, the adhesion promoter 131 may be provided between the light absorbing film 132 and the high contact angle film 20 instead of between the protective substrate 18 and the light absorbing film 132. Alternatively, it may be formed both between the protective substrate 18 and the light absorbing film 132 and between the light absorbing film 132 and the high contact angle film 20.

Further, the light absorbing film 132 may be used as a light reflection film that reflects light. In that case, light for exposing the region other than the lens resin part 19 is reflected without transmitting to the protective substrate 18 side, whereby the occurrence of patterning defect of the high contact angle film 20 due to reflection from the semiconductor substrate of the upper structure 11 can also be suppressed. The light reflection film can be constituted by, for example, a metal film such as Al, Ti, W, Ta, or Cu.

In addition to providing the abovementioned light absorbing film 132, an antireflection structure for suppressing reflection of light may further be added to the surface of the substrate of the upper structure 11. For example, an antireflection film or a moth-eye structure may be formed on the surface on the light-receiving surface side of the semiconductor substrate (silicon substrate) of the upper structure 11.

<7. Second Formation Method for Forming High Contact Angle Film>

Next, the second formation method for forming the high contact angle film will be described with reference to FIGS. 25A, 25B, 250, 25D, and 25E.

Note that the portions in FIGS. 25A, 25B, 250, 25D, and 25E corresponding to those in FIGS. 24A, 24B, 24C, 24D, 24E, and 24F are identified by the same reference numerals. Further, the portion below the upper structure 11 of the solid-state imaging element 13 (external terminal 14 side) is not illustrated as in FIGS. 24A, 24B, 24C, 24D, 24E, and 24F.

Figure 25A:
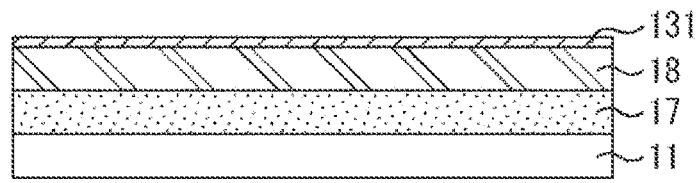
FIGS. 25A, 25B, 25C, 25D, and 25E are diagrams for describing a second formation method for forming a high contact angle film.

First, as shown in FIG. 25A, the surface of the protective substrate 18 is cleaned with UV ozone or a chemical solution, and then, the adhesion promoter 131 is formed on the upper surface of the protective substrate 18 in the similar manner to the first formation method.

Figure 25B:
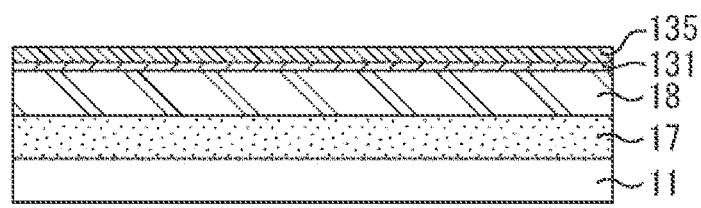

Next, as shown in FIG. 25B, a light absorbing film 135 that absorbs exposure light for patterning the high contact angle film 20 is formed on the upper surface of the adhesion promoter 131 using, for example, a spin coating method. The light absorbing film 135 absorbs the wavelength of light (for example, UV light) for curing the high contact angle film 20 and transmits the wavelength of light (for example, visible light) required for the solid-state imaging element 13. As the light absorbing film 135 having such characteristic, a silicon nitride film, a colorless color filter that absorbs only UV light, or the like can be used, for example.

Note that the method for forming the light absorbing film 135 is not limited to the spin coating method, and any method such as spraying, dipping, method using squeegee, and inkjet, may be used as long as a thin film can be formed.

Figure 25C:
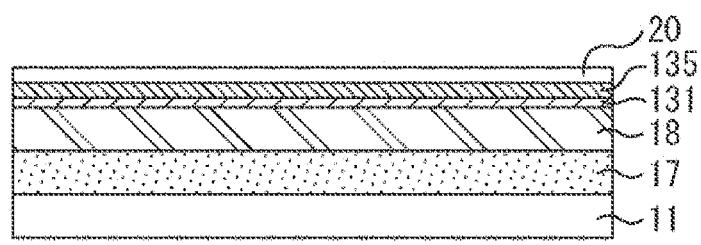
Figure 25D:
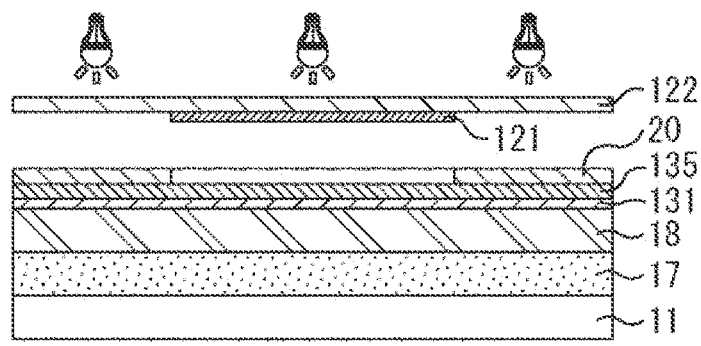
Figure 25E:
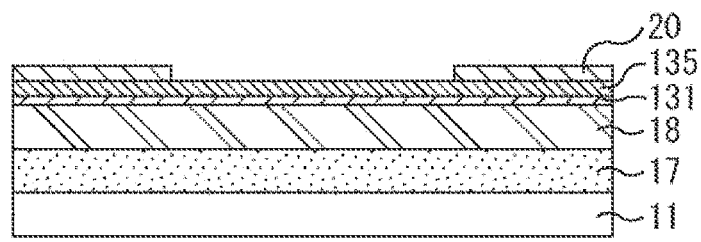

Next, the high contact angle film 20 is patterned on the upper surface of the light absorbing film 135 as shown in FIGS. 25C, 25D, and 25E. That is, after the high contact angle film 20 is formed on the entire upper surface of the light absorbing film 135 as shown in FIG. 25C, exposure is performed using the photomask 122 in which the light-shielding pattern 121 is formed corresponding to the region of the lens resin part 19 as shown in FIG. 25D. As a result, as shown in FIG. 25E, the high contact angle film 20 in the region of the light-shielding pattern 121 is removed without being cured, and the high contact angle film 20 is formed in the region other than the lens resin part 19.

Figure 24F:
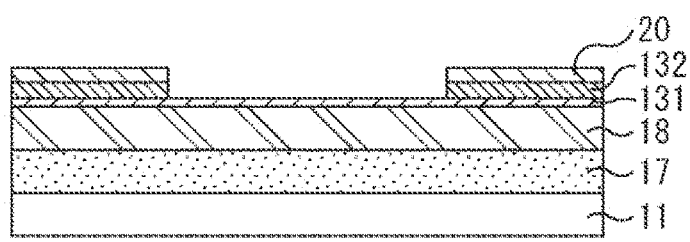

The difference between the cross-sectional configuration in FIG. 24E and the cross-sectional configuration in FIG. 25E is that, in the cross-sectional configuration in FIG. 24F, the light absorbing film 132 is formed only around the region where the lens resin part 19 is to be formed, whereas in the cross-sectional configuration in FIG. 25E, the light absorbing film 135 is formed on the entire upper region of the solid-state imaging element 13 including the region where the lens resin part 19 is to be formed and the region therearound. Therefore, in the third formation method, a film that transmits the wavelength of light (for example, visible light) received by the solid-state imaging element 13 is used for the light absorbing film 135.

Due to the formation of the light absorbing film 135, light for exposing the region other than the lens resin part 19 is prevented from transmitting the protective substrate 18 and the like and reaching the semiconductor substrate of the upper structure 11 of the solid-state imaging element 13 as indicated by the arrow in FIG. 23. Therefore, the occurrence of patterning defect of the high contact angle film 20 due to the reflection from the semiconductor substrate can be suppressed.

Note that, although the light absorbing film 135 is formed between the adhesion promoter 131 and the high contact angle film 20 in the above example, it may be formed between the sealing resin 17 and the protective substrate 18 or between the upper structure 11 and the sealing resin 17.

Further, the adhesion promoter 131 may be provided between the light absorbing film 135 and the high contact angle film 20 instead of between the protective substrate 18 and the light absorbing film 135. Alternatively, it may be formed both between the protective substrate 18 and the light absorbing film 135 and between the light absorbing film 135 and the high contact angle film 20.

In addition to providing the abovementioned light absorbing film 135, an antireflection structure for suppressing reflection of light may further be added to the surface of the substrate of the upper structure 11. For example, an antireflection film or a moth-eye structure may be formed on the surface on the light-receiving surface side of the semiconductor substrate (silicon substrate) of the upper structure 11.

<8. Third Formation Method for Forming High Contact Angle Film>

Next, the third formation method for forming the high contact angle film will be described with reference to FIGS. 26A, 26B, 26C, and 26D.

Note that the portions in FIGS. 26A, 26B, 26C, and 26D corresponding to those in FIGS. 25A, 25B, 250, 25D, and 25E are identified by the same reference numerals. Further, the portion below the upper structure 11 of the solid-state imaging element 13 (external terminal 14 side) is not illustrated as in FIGS. 25A, 25B, 250, 25D, and 25E.

In the third formation method, the high contact angle film 20 is replaced with a high contact angle film 20', and the high contact angle film 20' is patterned on the upper surface of the protective substrate 18 or the adhesion promoter 131. Here, the high contact angle film 20' is added with a light absorbing material as a material and has a characteristic of absorbing exposure light for patterning the high contact angle film 20'.

Figure 26A:
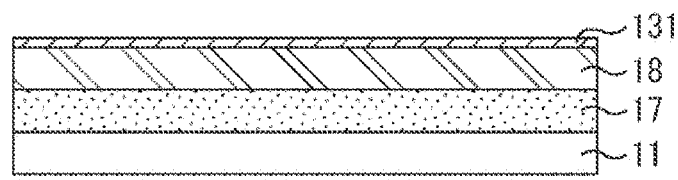
FIGS. 26A, 26B, 26C, and 26D are diagrams for describing a third formation method for forming a high contact angle film.

Specifically, first, as shown in FIG. 26A, the surface of the protective substrate 18 is cleaned with UV ozone or a chemical solution, and then, the adhesion promoter 131 is formed on the upper surface of the protective substrate 18 in the similar manner to the second formation method.

Figure 26B:
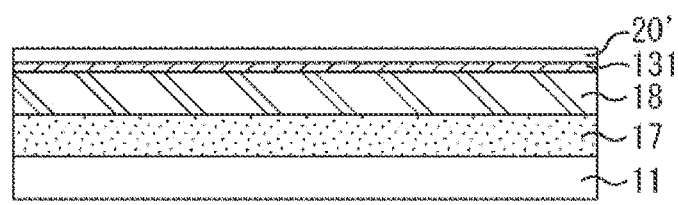
Figure 26C:
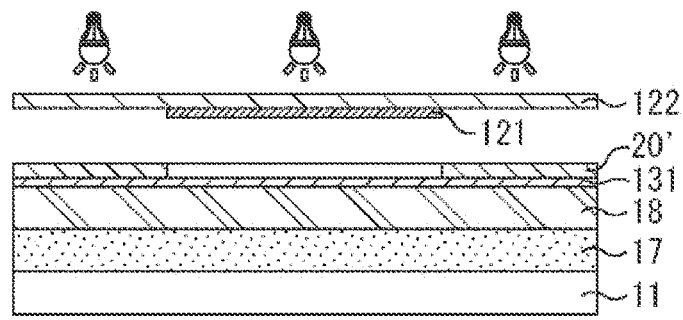

Next, the high contact angle film 20' having optical absorption property is patterned on the upper surface of the adhesion promoter 131. Specifically, after the high contact angle film 20' is formed on the entire upper surface of the adhesion promoter 131 as shown in FIG. 26B, exposure is performed using the photomask 122 in which the light-shielding pattern 121 is formed corresponding to the region of the lens resin part 19 as shown in FIG. 26C. As a result, as shown in FIG. 26D, the high contact angle film 20' in the region of the light-shielding pattern 121 is removed without being cured, and the high contact angle film 20' is formed in the region other than the lens resin part 19.

Note that any method, such as spin coating, spraying, dipping, method using squeegee, and inkjet, with which it is possible to form a thin film may be used for forming the high contact angle film 20' on the entire upper surface of the adhesion promoter 131.

Figure 26D:
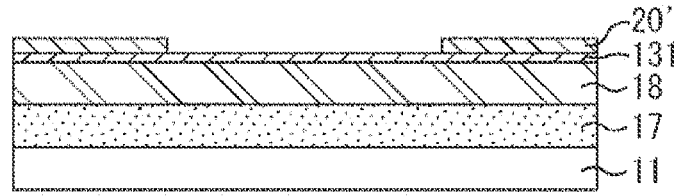

The difference between the cross-sectional configuration shown in FIG. 24E and the cross-sectional configuration shown in FIG. 26D is that, in the cross-sectional configuration shown in FIG. 24E, the patterned light absorbing film 132 is formed, whereas in the cross-sectional configuration shown in FIG. 26D, the light absorbing film 132 is not formed. Instead, in the cross-sectional configuration shown in FIG. 26D, the high contact angle film 20' having optical absorption property is used in place of the high contact angle film 20 having no optical absorption property.

Due to the high contact angle film 20' having optical absorption property, light for exposing the region other than the lens resin part 19 is prevented from transmitting the protective substrate 18 and the like and reaching the semiconductor substrate of the upper structure 11 of the solid-state imaging element 13 as indicated by the arrow in FIG. 23. Therefore, the occurrence of patterning defect of the high contact angle film 20' due to the reflection from the semiconductor substrate can be suppressed.

Note that, in addition to the configuration using the high contact angle film 20' having optical absorption property, an antireflection structure for suppressing reflection of light may further be added to the surface of the substrate of the upper structure 11. For example, an antireflection film or a moth-eye structure may be formed on the surface on the light-receiving surface side of the semiconductor substrate (silicon substrate) of the upper structure 11.

<9. Fourth Formation Method for Forming High Contact Angle Film>

Next, the fourth formation method for forming the high contact angle film will be described with reference to FIGS. 27A, 27B, 27C, 27D, and 27E.

Note that the portions in FIGS. 27A, 27B, 27C, 27D, and 27E corresponding to those in FIGS. 26A, 26B, 26C, and 26D are identified by the same reference numerals. Further, the portion below the upper structure 11 of the solid-state imaging element 13 (external terminal 14 side) is not illustrated as in FIGS. 26A, 26B, 26C, and 26D.

Figure 27A:
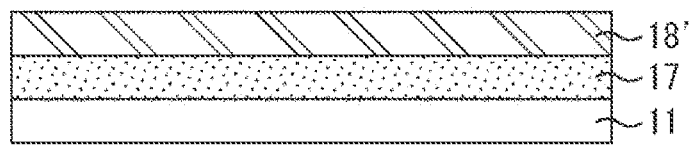
FIGS. 27A, 27B, 27C, 27D, and 27E are diagrams for describing a fourth formation method for forming a high contact angle film.

In the fourth formation method, as shown in FIG. 27A, a protective substrate 18' is used in place of the protective substrate 18 as the protective substrate bonded to the upper structure 11 of the solid-state imaging element 13 using the sealing resin 17. The protective substrate 18' is a transparent substrate including a material having optical absorption property, and is, for example, a glass substrate using borosilicate glass.

Figure 27B:
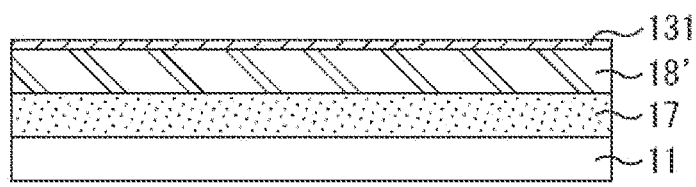

Thereafter, as shown in FIG. 27B, the surface of the protective substrate 18' is cleaned with UV ozone or a chemical solution, and then, the adhesion promoter 131 is formed on the upper surface of the protective substrate 18'.

Figure 27C:
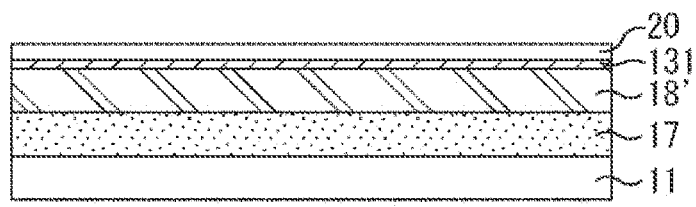
Figure 27D:
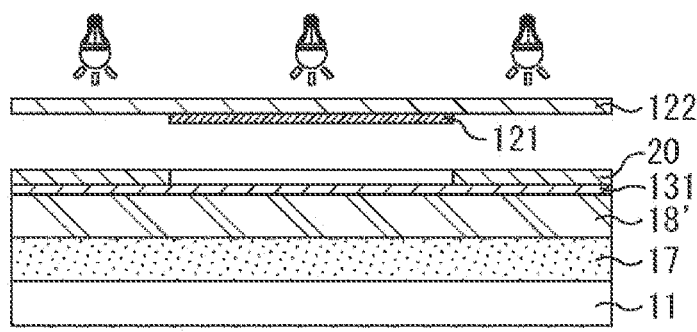

Then, the high contact angle film 20 is patterned on the upper surface of the adhesion promoter 131 in the similar manner. That is, after the high contact angle film 20 is formed on the entire upper surface of the adhesion promoter 131 as shown in FIG. 27C, exposure is performed using the photomask 122 in which the light-shielding pattern 121 is formed corresponding to the region of the lens resin part 19 as shown in FIG. 27D. As a result, as shown in FIG. 27E, the high contact angle film 20 in the region of the light-shielding pattern 121 is removed without being cured, and the high contact angle film 20 is formed in the region other than the lens resin part 19.

Note that any method, such as spin coating, spraying, dipping, method using squeegee, and inkjet, with which it is possible to form a thin film may be used for forming the high contact angle film 20 on the entire upper surface of the adhesion promoter 131.

Figure 27E:
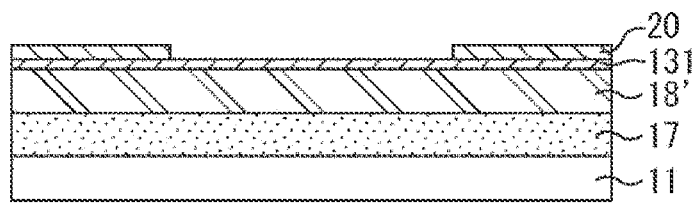

The difference between the cross-sectional configuration shown in FIG. 27E and the cross-sectional configuration shown in FIG. 26D is that, in the cross-sectional configuration shown in FIG. 26D, the high contact angle film 20' patterned on the adhesion promoter 131 has optical absorption property, whereas in the cross-sectional configuration shown in FIG. 27E, the high contact angle film 20 does not have optical absorption property, but the protective substrate 18' has optical absorption property.

Due to the protective substrate 18' having optical absorption property, light for exposing the region other than the lens resin part 19 is prevented from transmitting the protective substrate 18' and the like and reaching the semiconductor substrate of the upper structure 11 of the solid-state imaging element 13 as indicated by the arrow in FIG. 23. Therefore, the occurrence of patterning defect of the high contact angle film 20 due to the reflection from the semiconductor substrate of the upper structure 11 can be suppressed.

In addition to providing the protective substrate 18' having optical absorption property, an antireflection structure for suppressing reflection of light may further be added to the surface of the substrate of the upper structure 11. For example, an antireflection film or a moth-eye structure may be formed on the surface on the light-receiving surface side of the semiconductor substrate (silicon substrate) of the upper structure 11.

Note that, although the high contact angle film 20 having no optical absorption property is used in the fourth formation method described above, the high contact angle film 20' having optical absorption property may be used. That is, light for exposing the region other than the lens resin part 19 may be prevented from reaching the semiconductor substrate of the upper structure 11 of the solid-state imaging element 13 by using both the protective substrate 18' having optical absorption property and the high contact angle film 20' having optical absorption property.

In the abovementioned first and second formation methods for forming the high contact angle film, a light absorbing film (light absorbing film 132 or 135) having optical absorption property is formed between the high contact angle film 20 and the upper structure 11, and in the third and fourth formation methods for forming the high contact angle film, the high contact angle film 20' or the protective substrate 18' having optical absorption property is used without using a light absorbing film.

With these methods, light for exposing the region other than the lens resin part 19 is prevented from transmitting the protective substrate 18 and the like and reaching the semiconductor substrate of the upper structure 11 of the solid-state imaging element 13 as indicated by the arrow in FIG. 23. Therefore, the occurrence of patterning defect of the high contact angle film 20 due to the reflection from the semiconductor substrate can be suppressed.

Further, in a case where UV light is used as light for exposing the high contact angle film 20, the irradiation of the sealing resin 17 with UV light can be suppressed, so that the deterioration of the sealing resin 17 due to UV light can be reduced. Further, in a case where the solid-state imaging element 13 is an imaging element that receives visible light (RGB light), a UV blocking effect of cutting (blocking) UV light is also exhibited. In addition, it is also possible to suppress flare and ghost.

<10. Formation of Mold>

The abovementioned example has described the case where the high contact angle film 20 is utilized during a process of molding the lens resin part 19 by transferring the concave-convex shape of the mold 503 to the lens material 501. The formation of the high contact angle film can also be used for a process of forming the mold 503 in a similar manner.

FIGS. 28A, 28B, 28C, and 28D show an example of a process of forming the mold 503.

Figure 28A:
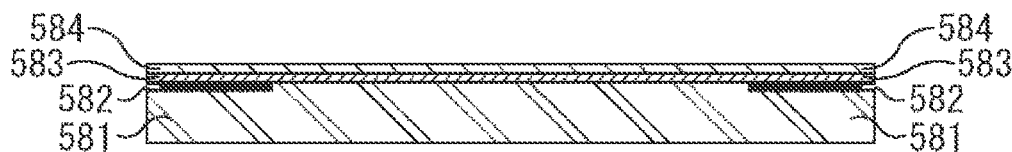
FIGS. 28A, 28B, 28C, and 28D are diagrams for describing application to a process of forming a mold.

As shown in FIG. 28A, a light-shielding film 582, an adhesion promoter 583, and a high contact angle film 584 are formed in this order on a substrate 581. The light-shielding film 582 is formed in a region other than a region in which a mold material 591 that is to be the mold 503 is to be formed in a step shown in-D of FIG. 28D to be described later. The adhesion promoter 583 and the high contact angle film 584 are formed on the entire surface.

Figure 28B:
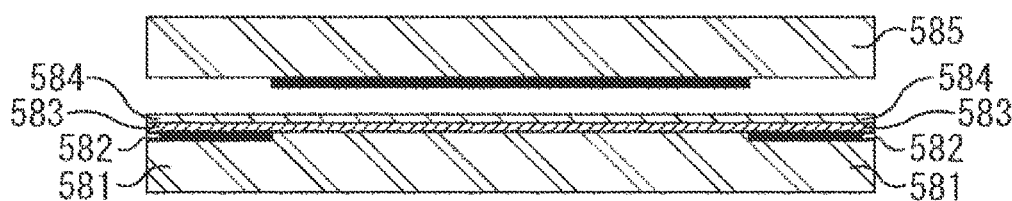
Figure 28C:
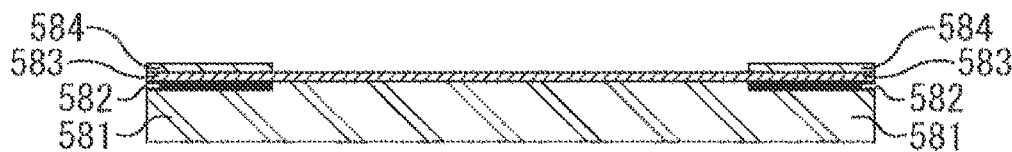

Next, as shown in FIGS. 28B and 28C, the high contact angle film 584 is exposed and etched using a mask 585 in which a pattern is formed corresponding to a region where the high contact angle film 584 is to be formed, whereby the high contact angle film 584 is patterned in a desired region. The region in which the high contact angle film 584 is formed is a region other than the region in which the mold 503 is to be formed as in the step shown in FIG. 3A.

Figure 28D:
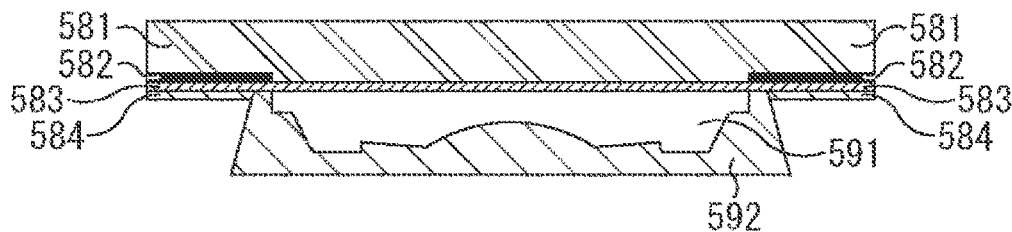

Then, as shown in FIG. 28D, the material (mold material) 591 for the mold 503 is dropped on an upper surface of the adhesion promoter 583 formed on the substrate 581, a mold 592 on which the concave-convex shape of the mold 503 is transferred is pressed against the mold material 591, and the mold material 591 is cured. Thus, the mold 503 is manufactured.

During the process of manufacturing the mold 503 described above, the high contact angle film 584 is formed in the region other than the region where the mold 503 is to be formed, whereby the mold 503 can be manufactured by dropping the mold material 591 only in an amount corresponding to the volume of the mold 503. Thus, the mold 503 can be efficiently manufactured. It is to be noted that, although the mold 592 is pressed against the substrate 581 in the above example, pressing step is not necessarily needed, and the mold 592 may be controlled to have a predetermined space from the substrate 581.

<11. Schematic Structure of Camera Package without Having High Contact Angle Film>

Next, a method for forming the lens resin part 19 without using the high contact angle film 20 will be described.

Figure 29:
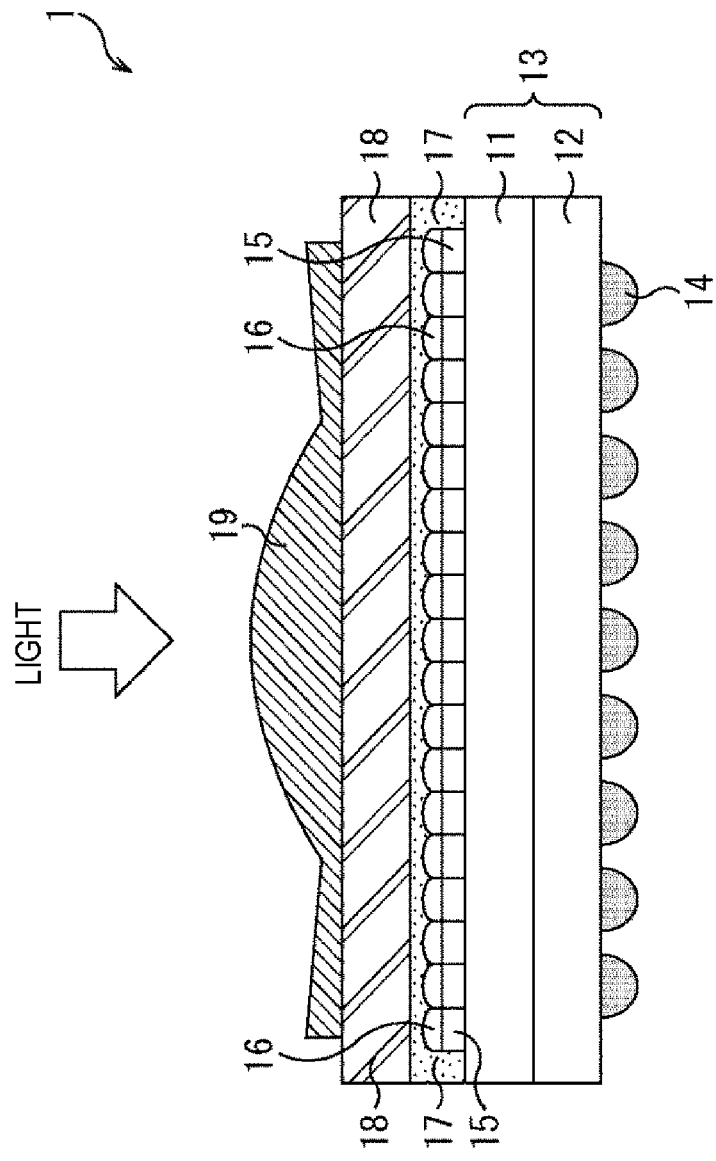
FIG. 29 is a schematic structural diagram of a camera package as a semiconductor device to which the present disclosure is applied.

FIG. 29 shows a schematic structure of a camera package 1 which does not have the high contact angle film 20.

The configuration of the camera package 1 in FIG. 29 is similar to that of the camera package 1 shown in FIG. 1 except that the high contact angle film 20 is not formed around the lens resin part 19, so that the description thereof will be omitted.

A lens formation method for forming the lens resin part 19 on the protective substrate 18 without using the high contact angle film 20 will be described with reference to FIGS. 30A, 30B, 30C, and 30D.

Note that, although FIGS. 30A, 30B, 30C, and 30D show a lens formation method for forming one lens resin part 19, this method can also be applied to a wafer-level lens process for simultaneously forming multiple lens resin parts 19 in the planar direction of the protective substrate 18.

Figure 30A:
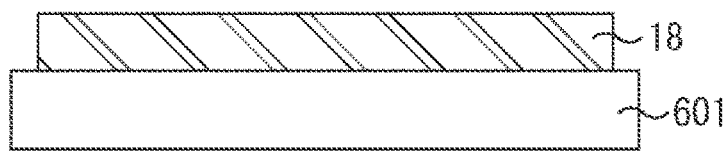
FIGS. 30A, 30B, 30C, and 30D are diagrams for describing a lens formation method for forming a lens resin part.

First, as shown in FIG. 30A, the protective substrate 18 is placed and fixed on a chuck 601 by suction, and with this state, contamination on the surface of the protective substrate 18 is removed by UV ozone cleaning using ultraviolet light (UV) and ozone (O3), cleaning using a chemical solution, or the like. The cleaning using chemical solution may be performed by a cleaning method such as two-fluid cleaning or brush cleaning by using, for example, isopropyl alcohol (IPA), ethanol, acetone, etc. After the surface of the protective substrate 18 is cleaned, an adhesion promoter (not shown) for improving the adhesion between a lens material 602 to be dropped in the next step and the protective substrate 18 is formed.

Figure 30B:
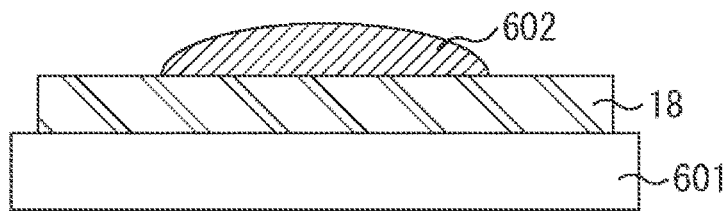

Next, as shown in FIG. 30B, the lens material 602 is dropped to a predetermined position on the protective substrate 18 where the lens resin part 19 is to be formed. The dropping position of the lens material 602 can be controlled with high accuracy with respect to an alignment mark formed at a predetermined position on the protective substrate 18. The lens material 602 includes, for example, a resin material that is cured by ultraviolet light.

Figure 30C:
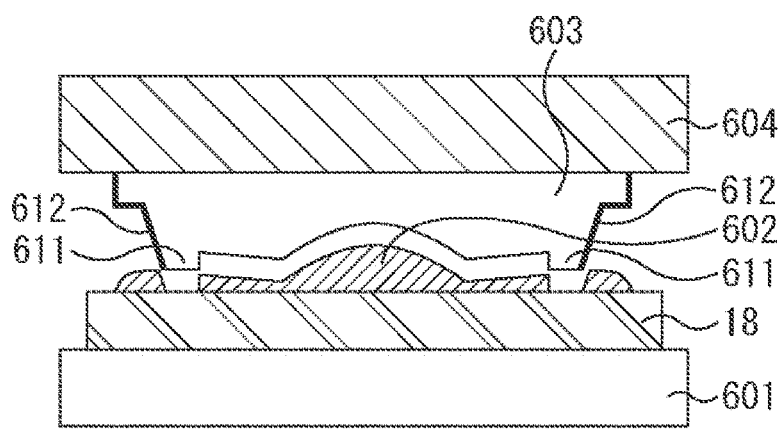

Next, as shown in FIG. 30C, a mold 603 which is attached to a mounting section 604 of an imprinting device and which has a concave-convex shape of the lens resin part 19 is pressed against the protective substrate 18 with a predetermined load at a predetermined speed. Thus, the concave-convex shape of the mold 603 is transferred to the lens material 602 dropped on the protective substrate 18. At that time, an abutting section 611 of the mold 603 which is a protruding part closest to the protective substrate 18 abuts the protective substrate 18, so that a distance between (a height from) the mounting section 604 and (to) the protective substrate 18 is controlled with high accuracy. Similarly to the dropping position of the lens material 602, the position of the mold 603 in the planar direction is controlled with high accuracy with respect to an alignment mark formed at a predetermined position on the protective substrate 18. The surface of the mold 603 that comes into contact with the lens material 602 may be subjected to a mold release treatment in advance so that it can be easily separated from the cured lens material 602.

Figure 30D:
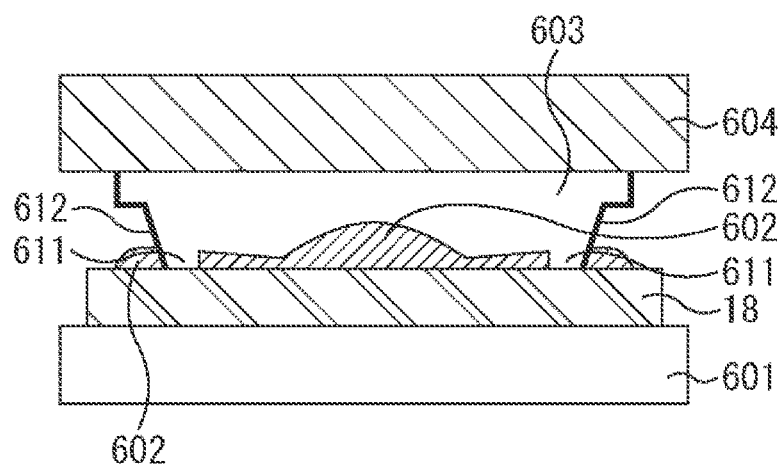

Finally, as shown in FIG. 30D, the lens material 602 is irradiated with ultraviolet light from above the mounting section 604 in a state where the mold 603 is pressed against the lens material 602, by which the lens material 602 is cured. Thus, the lens resin part 19 is formed. The mold 603 and the mounting section 604 include a light transmissive material. A light-shielding film (mask) 612 that does not transmit ultraviolet light is formed on the outer peripheral portion of the mold 603 in the planar direction, and the lens material 602 protruding from the abutting section 611 is not irradiated with ultraviolet light. Therefore, the lens material 602 outside the abutting section 611 can be removed without being cured.

Note that a thermosetting resin material may be used as the lens material 602 in place of an ultraviolet light curable resin material.

Figure 31:
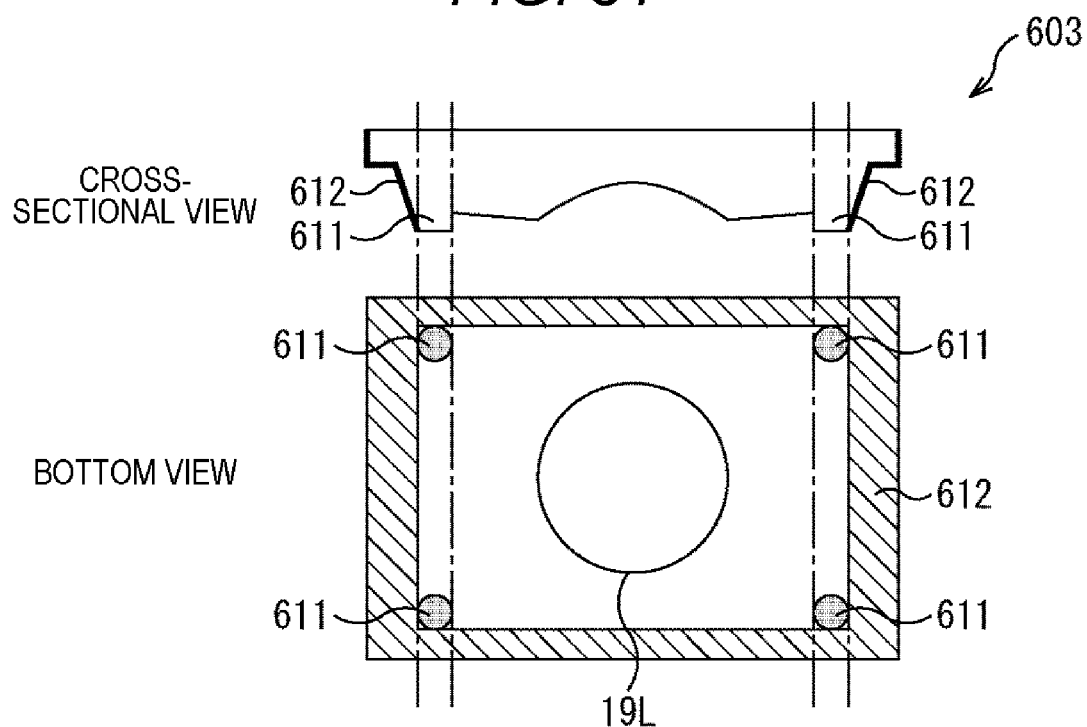
FIG. 31 shows a cross-sectional view and a plan view of a mold.

FIG. 31 shows a cross-sectional view of a plane passing through the abutting section 611 of the mold 603 and a plan view (bottom view) of a lower surface which is a surface pressed against the lens material 602.

The mold 603 includes four abutting sections 611, and each of the four abutting sections 611 is disposed inside the outer peripheral portion in plan view. Each abutting section 611 is a columnar body having a cylindrical shape. In the present specification, the columnar body indicates a column or a cone having a surface substantially parallel to an abutting direction as a side surface. The side surface does not need to be perpendicular to the protective substrate 18 which is an abutment surface, and may be inclined at a predetermined angle. The abutting section 611 may also be a columnar body having a shape of a prism such as a triangular prism or a quadrangular prism. Furthermore, the abutting section 611 may also be a columnar body having a shape of a polygonal pyramid such as a triangular pyramid or a quadrangular pyramid, or a conical shape.

Furthermore, a tip of the columnar body which abuts the protective substrate 18 may have any shape. In the example in FIG. 31, a contact surface where the abutting section 611 contacts the protective substrate 18 when the mold 603 is pressed against the protective substrate 18 has a circular shape as indicated in gray in the bottom view. However, the tip of the abutting section 611 may have a shape allowing the abutting section 611 to come in point contact with the protective substrate 18 as will be described later with reference to FIGS. 35A and 35B.

Furthermore, in the present embodiment, the four abutting sections 611 are arranged symmetrically with respect to the center of a planar region of the mold 603, but they are not necessarily arranged symmetrically. However, considering the flow of the lens material 602 described later, they are preferably arranged symmetrically.

It is only sufficient that the abutting sections 611 can control the plane for controlling the height of the cured lens resin part 19, and therefore, it is only required that the number of abutting sections 611 formed on the mold 603 is three or more without being limited to four.

The light-shielding film 612 is formed on an outer peripheral portion outside the four abutting sections 611 as indicated by a hatched area in the bottom view.

Figure 32:
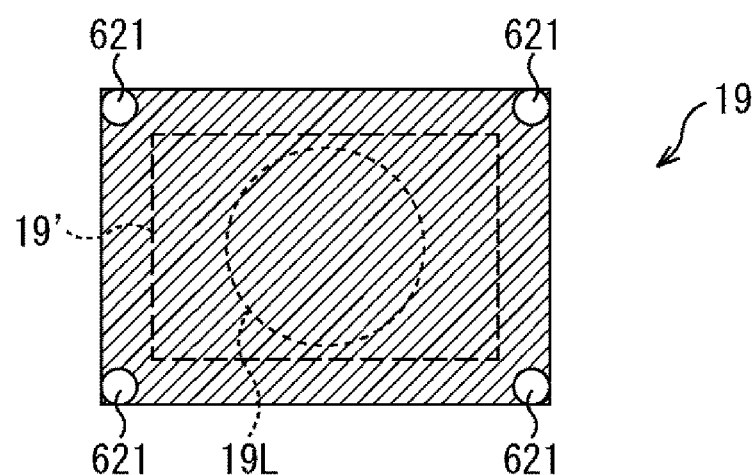
FIG. 32 is a plan view of the lens resin part.

FIG. 32 is a plan view of the lens resin part 19 after an excessive lens material 602 is removed after the curing treatment.

In the region of the light-shielding film 612 shown in FIG. 31, the lens material 602 is removed without being cured, so that the planar shape of the lens resin part 19 is rectangle as shown in FIG. 32. The lens material 602 is not present in four regions 621 respectively corresponding to the four abutting sections 611 of the mold 603.

Note that, in a case where the light-shielding film 612 formed on the mold 603 is formed up to an inner side of the four abutting sections 611, the lens resin part 19 has a planar shape which is rectangle as indicated by a broken line 19', and traces of the four regions 621 respectively corresponding to the abutting sections 611 do not remain.

In the plan views in FIGS. 31 and 32, a lens part 19L at the center indicates a region which exhibits a lens function of refracting the incident light and allowing the same to enter the pixels of the upper structure 11 in the cured lens resin part 19.

<12. Operation and Effect of Mold>

In the mold 603 used in the lens formation method in FIGS. 30A, 30B, 30C, and 30D, a space is formed for allowing the lens material 602 to flow toward the outside in a state in which the abutting sections 611 abut the protective substrate 18.

Further, the space generated between the mold 603 and the protective substrate 18 with the abutting sections 611 abutting against the protective substrate 18 allows the lens material 602 to flow therein from the outside in a case where cure shrinkage of the lens material 602 occurs.

An energy-curable resin material cured by energy such as ultraviolet light or heat shrinks when being cured. According to the structure of the mold 603 described above, when the lens material 602 shrinks, the lens material 602 protruding outside is supplied from a gap between the mold 603 and the protective substrate 18 other than the abutting sections 611, so that no wrinkle or void is generated in the lens part 19L which exhibits the lens function, as shown in FIGS. 33A and 33B.

Figure 34B:
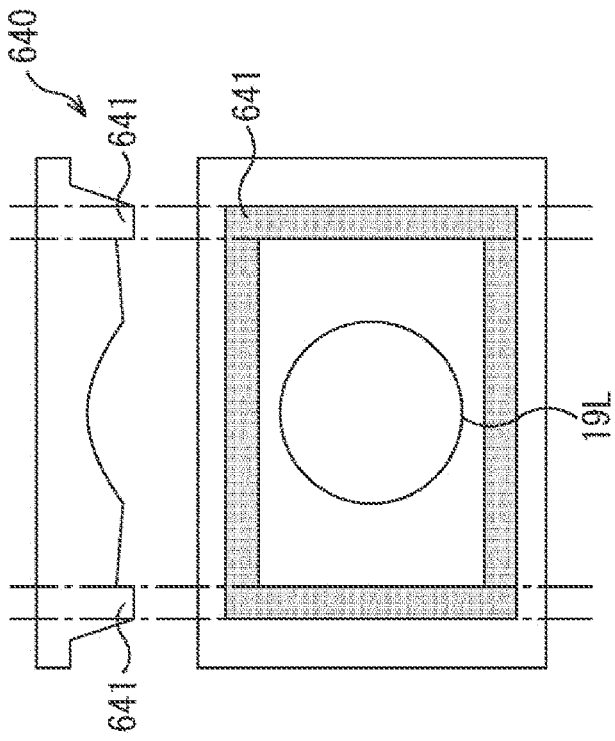
FIGS. 34A and 34B are diagrams for describing operation and effect in a case where the mold in FIG. 31 is used.
Figure 34A:
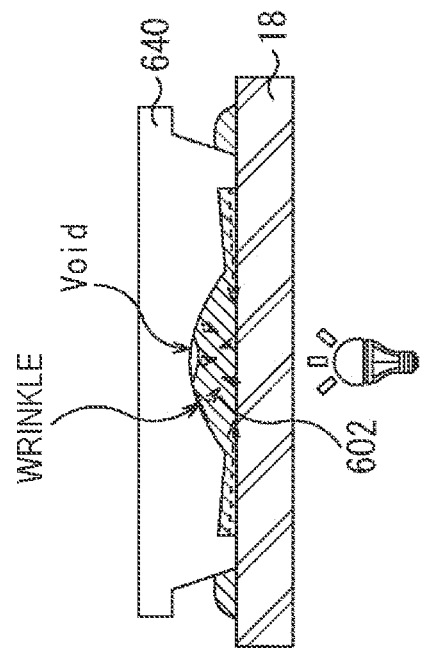

In comparison, a case where the lens shape is imprinted using a mold 640 which includes an abutting section 641 having a rectangular shape surrounding an entire circumference as shown in FIGS. 34A and 34B is considered, for example. The abutting section 641 of the mold 640 is in contact with the protective substrate 18 on the entire circumference as indicated in gray in FIG. 34B. In a case where the lens material 602 is cured by using such mold 640 and the lens material 602 shrinks, the lens material 602 is not supplied from outside the abutting section 641, and the inner lens material 602 sealed by the abutting section 641 shrinks, so that voids and wrinkles due to peeling occur.

Therefore, by imprinting using the mold 603 according to the present disclosure, the space for allowing the resin material to flow toward the outside or flow therein from the outside is formed, so that occurrence of wrinkles and voids can be prevented.

Furthermore, a distance between the abutting sections 611 of the mold 603 and the protective substrate 18 in a height direction is controlled in a plane with high accuracy, so that it is possible to control the lens thickness and shape of the lens resin part 19 with high accuracy only by pressing the mold 603 against the protective substrate 18.

Therefore, by imprinting using the mold 603 provided with the abutting sections 611, it is possible to form the lens resin part 19 at low cost while controlling the lens shape with high accuracy with a simple device configuration.

<13. Modifications of Mold>

Figure 35A:
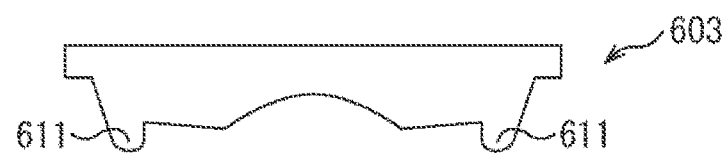
FIGS. 35A, 35B, and 35C are diagrams showing a modification of the mold shown in FIG. 31.
Figure 35B:
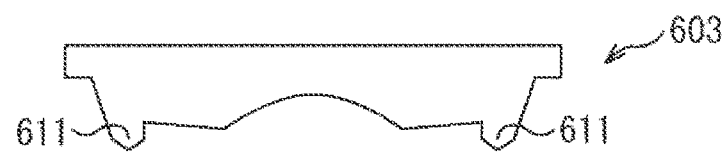
Figure 35C:
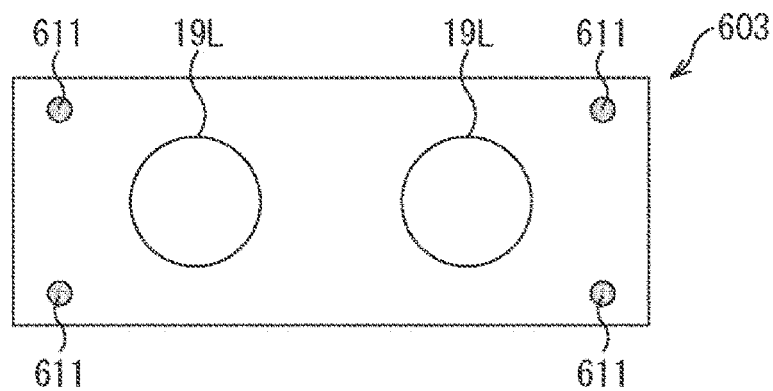

FIGS. 35A, 35B, and 35C show modifications of the mold 603. Note that, in FIGS. 35A, 35B, and 35C, the light-shielding film 612 is not illustrated.

The tips of the abutting sections 611 of the mold 603 described above have a cylindrical shape, and when the mold 603 is pressed against the protective substrate 18, the abutting sections 611 come in circular (surface) contact with the protective substrate 18.

On the other hand, in a first modification of the mold 603 shown in FIG. 35A, the tips of the abutting sections 611 have a substantially spherical (hemispherical) shape. When the mold 603 according to the first modification is pressed against the protective substrate 18, the abutting sections 611 come in point contact with the protective substrate 18.

Further, in a second modification of the mold 603 shown in FIG. 35B, the tips of the abutting sections 611 have a shape of a polygonal pyramid such as a triangular pyramid. When the mold 603 according to the second modification is pressed against the protective substrate 18, the abutting sections 611 come in point contact with the protective substrate 18. Note that the tips may have a conical shape in place of the polygonal pyramid shape.

As described above, the tips of the abutting sections 611 may have a shape that comes in point contact with the protective substrate 18.

Further, as shown in FIG. 35C, the three or more abutting sections 611 of the mold 603 may be provided not for each lens but for two or more lenses.

<14. Another Embodiment of Mold>

Next, another embodiment of the mold 603 will be described.

Figure 36:
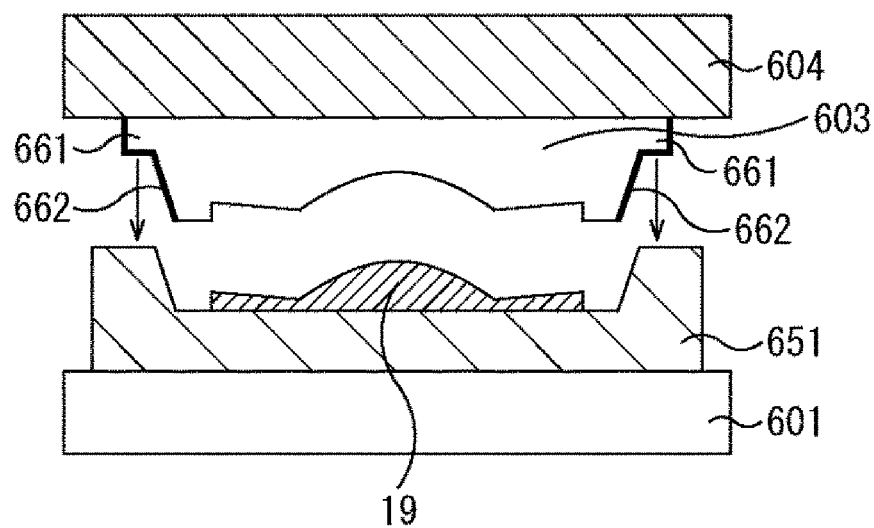
FIG. 36 is a diagram showing another embodiment of the mold.

A mold 603 shown in FIG. 36 includes abutting sections 661 in place of the abutting sections 611 of the mold 603 shown in FIG. 31, and a light shielding film 662 in place of the light-shielding film 612 of the mold 603 shown in FIG. 31.

The abutting sections 661 are configured to abut against a surface different from the surface of a substrate 651 on which the lens resin part 19 is to be formed.

In FIG. 36, the substrate 651 on which the lens resin part 19 is to be formed has a cavity shape, and has a surface different in height from the surface on which the lens resin part 19 is to be formed. The abutting sections 661 of the mold 603 are provided on the outer peripheral portion of the mold 603, and are configured to abut against the upper surface higher than the surface on which the lens resin part 19 is to be formed. The abutting sections 661 control the height of the lens resin part 19 by abutting against the upper surface different from the surface on which the lens resin part 19 is to be formed.

When the abutting sections 661 abut against the upper surface on the higher side of the substrate 651, a space in which the lens material 602 can flow can be formed between the lower surface on the lower side of the substrate 651 having a cavity shape and the mold 603. The space allows extra lens material 602 to release to the outside or allows the lens material 602 to return to the inside when cure shrinkage occurs.

Figure 37:
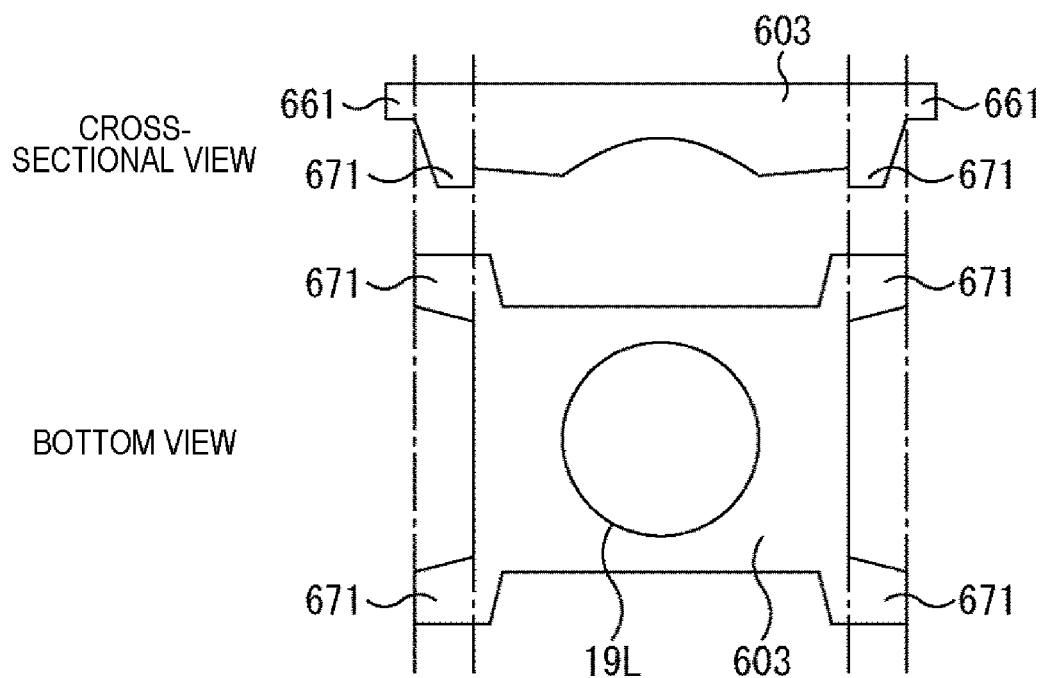
FIG. 37 shows a cross-sectional view and a plan view of the mold shown in FIG. 36.

FIG. 37 shows a cross-sectional view of the mold 603 shown in FIG. 36 and a plan view (bottom view) of a lower surface which is a surface pressed against the lens material 602.

In a case where the substrate 651 (FIG. 36) has a difference in height between the surface on which the lens resin part 19 is to be formed and a surface of a different height, it is possible to align the mold 603 and the substrate 651 in the planar direction by using an inclined surface connecting the surfaces.

As shown in the cross-sectional view and the plan view of FIG. 37, the mold 603 shown in FIG. 36 is provided with guide sections 671 with tapered shapes formed so as to be in contact with the inclined surfaces at four corners of the substrate 651, and the guide sections 671 are guided by the inclined surfaces of the cavity shape of the substrate 651, so that the position of the mold 603 in the planar direction is controlled. Except for the four corners of the guide sections 671 of the mold 603, the mold 603 is recessed more inwardly (in the direction to the lens part 19L) than the inclined surfaces of the cavity shape of the substrate 651 such that a void as a flow path of the lens material 602 is formed.

<15. Detailed Structure of Solid-State Imaging Element>

Next, the detailed structure and manufacturing method of the solid-state imaging element 13 of the camera package 1 will be described.

Figure 38:
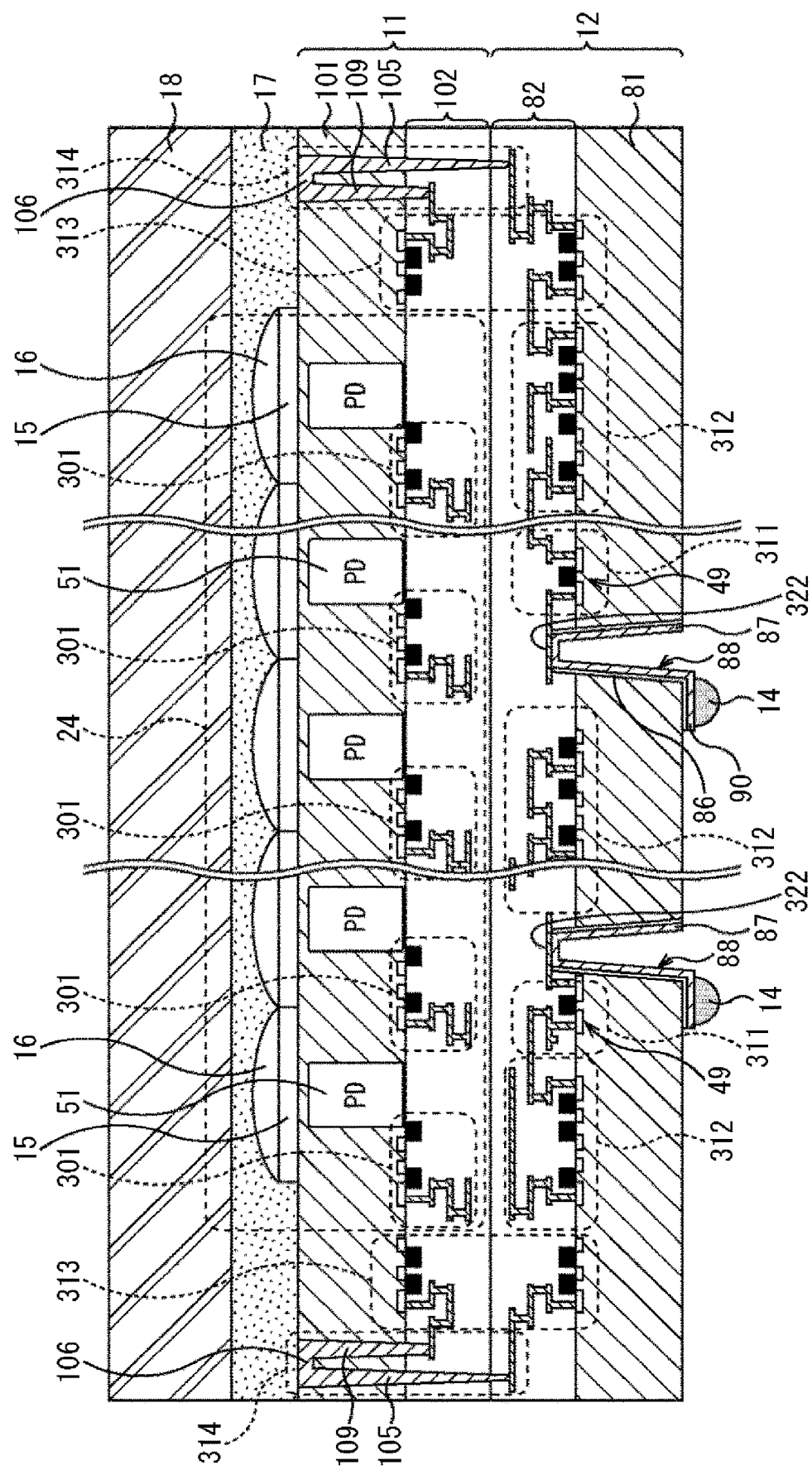
FIG. 38 is a diagram showing a detailed cross-sectional structure of the solid-state imaging element.

FIG. 38 is a diagram showing a detailed cross-sectional structure of the solid-state imaging element 13. In FIG. 38, the lens resin part 19 of the camera package 1 is not shown.

The pixel array unit 24 is provided in the region of the camera package 1 including the upper structure 11 and the portion above the upper structure 11. The pixel array unit 24 includes a plurality of pixels 31 (FIG. 2) which is arrayed, each pixel having the on-chip lens 16, the color filter 15, the pixel transistor, and the photodiode 51. Pixel transistor regions 301 are also formed in the region (pixel array region) of the pixel array unit 24. In the pixel transistor region 301, at least one pixel transistor among a transfer transistor, an amplification transistor, and a reset transistor is formed.

A plurality of external terminals 14 is arranged in a region on the lower surface of the semiconductor substrate 81 provided in the lower structure 12 and below the pixel array unit 24 provided in the upper structure 11.

Note that, in the description with reference to FIG. 38, the "region on the lower surface of the semiconductor substrate 81 provided in the lower structure 12 and below the pixel array unit 24 provided in the upper structure 11" is referred to as a first specific region, and the "region on the upper surface of the semiconductor substrate 81 provided in the lower structure 12 and below the pixel array unit 24 provided in the upper structure 11" is referred to as a second specific region.

At least a part of the plurality of external terminals 14 arranged in the first specific region is used as a signal input terminal 14A for inputting a signal from the outside to the camera package 1 or a signal output terminal 14B for outputting a signal from the camera package 1 to the outside. In other words, the signal input terminal 14A and the signal output terminal 14B are external terminals 14 excluding a power supply terminal and a ground terminal from the external terminals 14. In the present disclosure, the signal input terminal 14A and signal output terminal 14B are referred to as signal input/output terminals 14C.

Through vias 88 passing through the semiconductor substrate 81 are formed in the first specific region and in the vicinity of the signal input/output terminals 14C. Note that, in the present disclosure, a through via hole which passes through the semiconductor substrate 81 and via wiring formed therein may be simply collectively referred to as the through via 88.

This through via hole desirably has a structure formed by etching the lower surface of the semiconductor substrate 81 to a conductive pad 322 (hereinafter sometimes referred to as a via pad 322) which is a part of a multilayer wiring layer 82 formed above the upper surface of the semiconductor substrate 81 and which constitutes a terminal end (bottom) of the via hole.

The signal input/output terminal 14C disposed in the first specific region is electrically connected to the through via 88 (more specifically, the via wiring formed in the through via hole) also disposed in the first specific region.

The input/output circuit unit 49 provided with the input circuit unit 42 or the output circuit unit 47 is disposed in the second specific region and in a region in the vicinity of the signal input/output terminal 14C and the abovementioned through via.

The signal input/output terminal 14C disposed in the first specific region is electrically connected to the input/output circuit unit 49 via the through via 88 and the via pad 322, or a part of the multilayer wiring layer 82.

A region in which the input/output circuit unit 49 is disposed is referred to as an input/output circuit region 311. A signal processing circuit region 312 is formed adjacent to the input/output circuit region 311 on the upper surface of the semiconductor substrate 81 provided in the lower structure 12. In the signal processing circuit region 312, the image signal processor 26 described with reference to FIG. 2 is formed.

A region in which the pixel peripheral circuit unit including all or a part of the row drive unit 22 and the column signal processor 25 described with reference to FIG. 2 is disposed is referred to as a pixel peripheral circuit region 313. The pixel peripheral circuit region 313 is located in a region outside the pixel array unit 24 on a lower surface of a semiconductor substrate 101 provided on the upper structure 11 and the upper surface of the semiconductor substrate 81 provided on the lower structure 12.

The signal input/output terminal 14C may be provided in a region under the input/output circuit region 311 located on the lower structure 12, or may be provided in a region under the signal processing circuit region 312. Alternatively, the signal input/output terminal 14C may be provided below the pixel peripheral circuit unit, such as the row drive unit 22 or the column signal processor 25, which is disposed in the lower structure 12.

In the present disclosure, a wiring connecting structure which connects wiring included in a multilayer wiring layer 102 of the upper structure 11 and wiring included in the multilayer wiring layer 82 of the lower structure 12 is sometimes referred to as an upper/lower wiring connecting structure, and a region in which the structure is disposed is sometimes referred to as an upper/lower wiring connecting region 314.

The upper/lower wiring connecting structure includes a first through electrode (silicon through electrode) 109 which passes through the semiconductor substrate 101 from the upper surface of the upper structure 11 and reaches the multilayer wiring layer 102, a second through electrode (chip through electrode) 105 which passes through the semiconductor substrate 101 and the multilayer wiring layer 102 from the upper surface of the upper structure 11 and reaches the multilayer wiring layer 82 of the lower structure 12, and a connecting wiring 106 for connecting the two through electrodes (through silicon via, TSV). In the present disclosure, such an upper/lower wiring connecting structure is sometimes referred to as a twin contact structure.

The upper/lower wiring connecting region 314 is located outside the pixel peripheral circuit region 313.

In the present embodiment, the pixel peripheral circuit region 313 is formed in both the upper structure 11 and the lower structure 12, but it may be formed in only one of them.

Furthermore, in the present embodiment, the upper/lower wiring connecting region 314 is located outside the pixel array unit 24 and outside the pixel peripheral circuit region 313, but it may also be located outside the pixel array unit 24 and inside the pixel peripheral circuit region 313.

Moreover, the present embodiment employs, as a structure for electrically connecting the multilayer wiring layer 102 of the upper structure 11 and the multilayer wiring layer 82 of the lower structure 12, the twin contact structure for connecting them by using the two through electrodes, the silicon through electrode 109 and the chip through electrode 105.

As a structure for electrically connecting the multilayer wiring layer 102 of the upper structure 11 and the multilayer wiring layer 82 of the lower structure 12, a share contact structure may be used, for example, in which each of a wiring layer 103 of the upper structure 11 and a wiring layer 83 of the lower structure 12 is commonly connected to one through electrode.

<16. Method for Manufacturing Camera Package>

Next, a method for manufacturing the camera package 1 will be described with reference to FIGS. 39 to 53.

First, the lower structure 12 and the upper structure 11 which are in the form of wafer are manufactured separately.

As the lower structure 12, the multilayer wiring layer 82 which serves as the input/output circuit unit 49 and a part of the row drive unit 22 or the column signal processor 25 is formed in a region where each chip unit of the semiconductor substrate 81 is to be formed. The semiconductor substrate 81 at that time is not yet thinned, and has a thickness of, for example, about 600 μm.

In contrast, as the upper structure 11, photodiodes 51 and source/drain regions of pixel transistors of the respective pixels 31 are formed in a region where each chip unit of the semiconductor substrate 101 is to be formed. Further, the multilayer wiring layer 102 that constitutes the row drive signal lines 32, vertical signal lines 33, and the like is formed on one surface of the semiconductor substrate 101. The semiconductor substrate 101 at that time is also not yet thinned, and has a thickness of, for example, about 600 μm.

Figure 39:
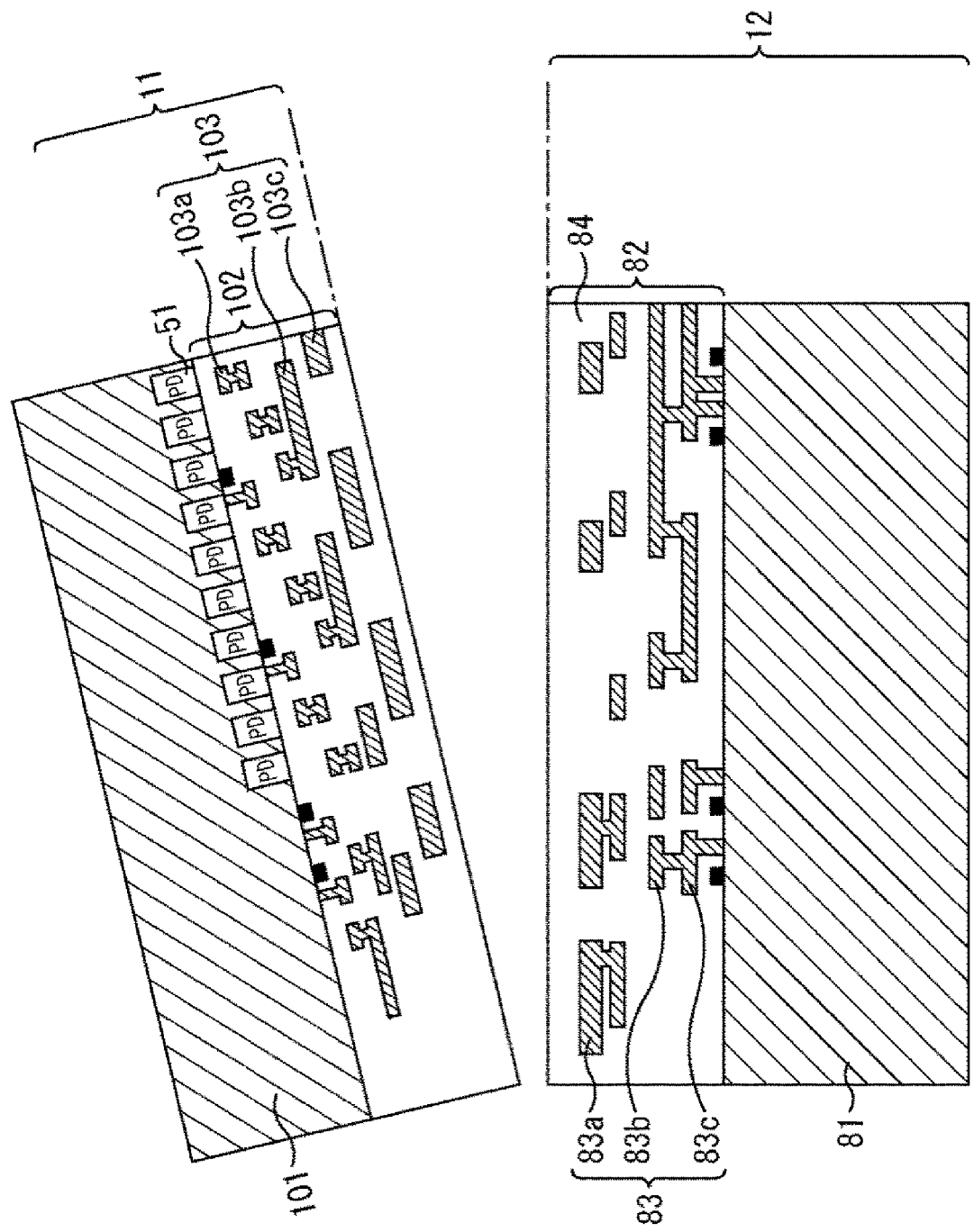
FIG. 39 is a diagram for describing a method for manufacturing the camera package.
Figure 40:
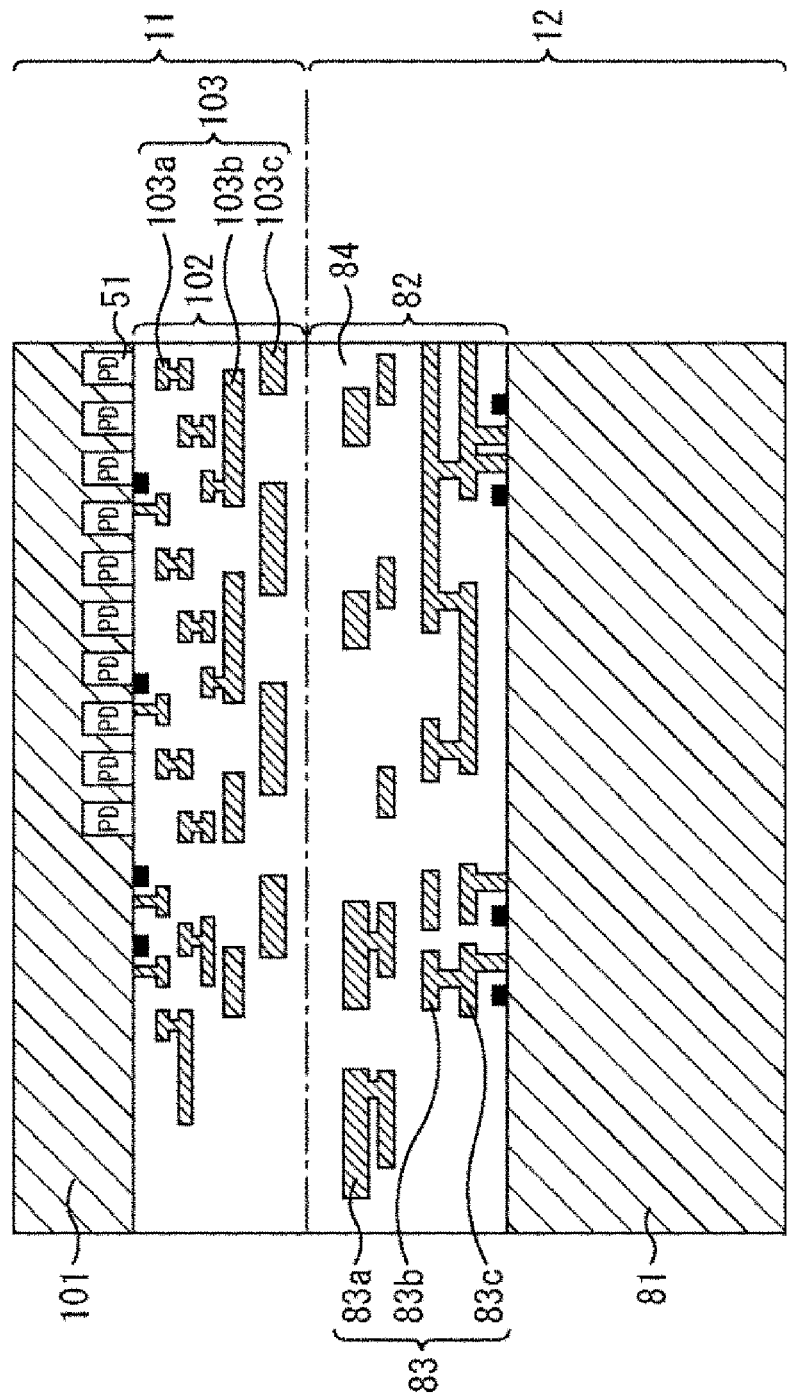
FIG. 40 is a diagram for describing the method for manufacturing the camera package.

Then, the lower structure 12 and the upper structure 11 which are thus manufactured and which are in the form of wafer are bonded to each other with the multilayer wiring layer 82 side facing the multilayer wiring layer 102 side as shown in FIG. 39, and then, the semiconductor substrate 101 of the upper structure 11 is thinned as shown in FIG. 40. The bonding may be performed using, for example, plasma bonding or bonding with an adhesive, and in the present embodiment, plasma bonding is used. In the case of plasma bonding, a film such as a plasma TEOS film, a plasma SiN film, a SiON film (block film), or a SiC film is formed on bonding surfaces of the upper structure 11 and the lower structure 12, respectively. The bonding surfaces are subjected to a plasma treatment, overlapped with each other, and then, subjected to annealing. Thus, they are bonded to each other.

Figure 41:
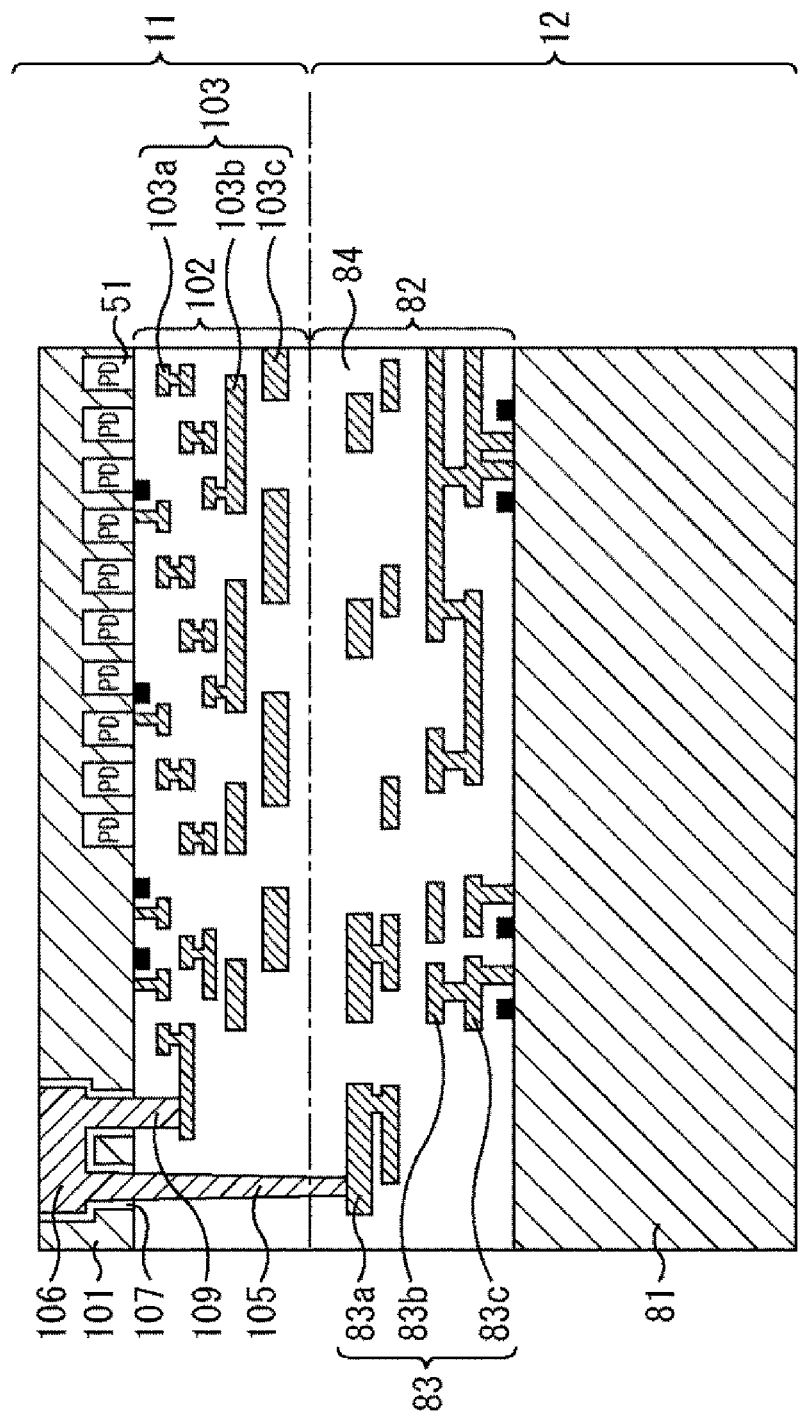
FIG. 41 is a diagram for describing the method for manufacturing the camera package.

After the semiconductor substrate 101 of the upper structure 11 is thinned, the silicon through electrode 109, the chip through electrode 105, and the connecting wiring 106 for connecting them are formed in a region which is to be the upper/lower wiring connecting region 314 using a damascene method and the like, as shown in FIG. 41.

Figure 42:
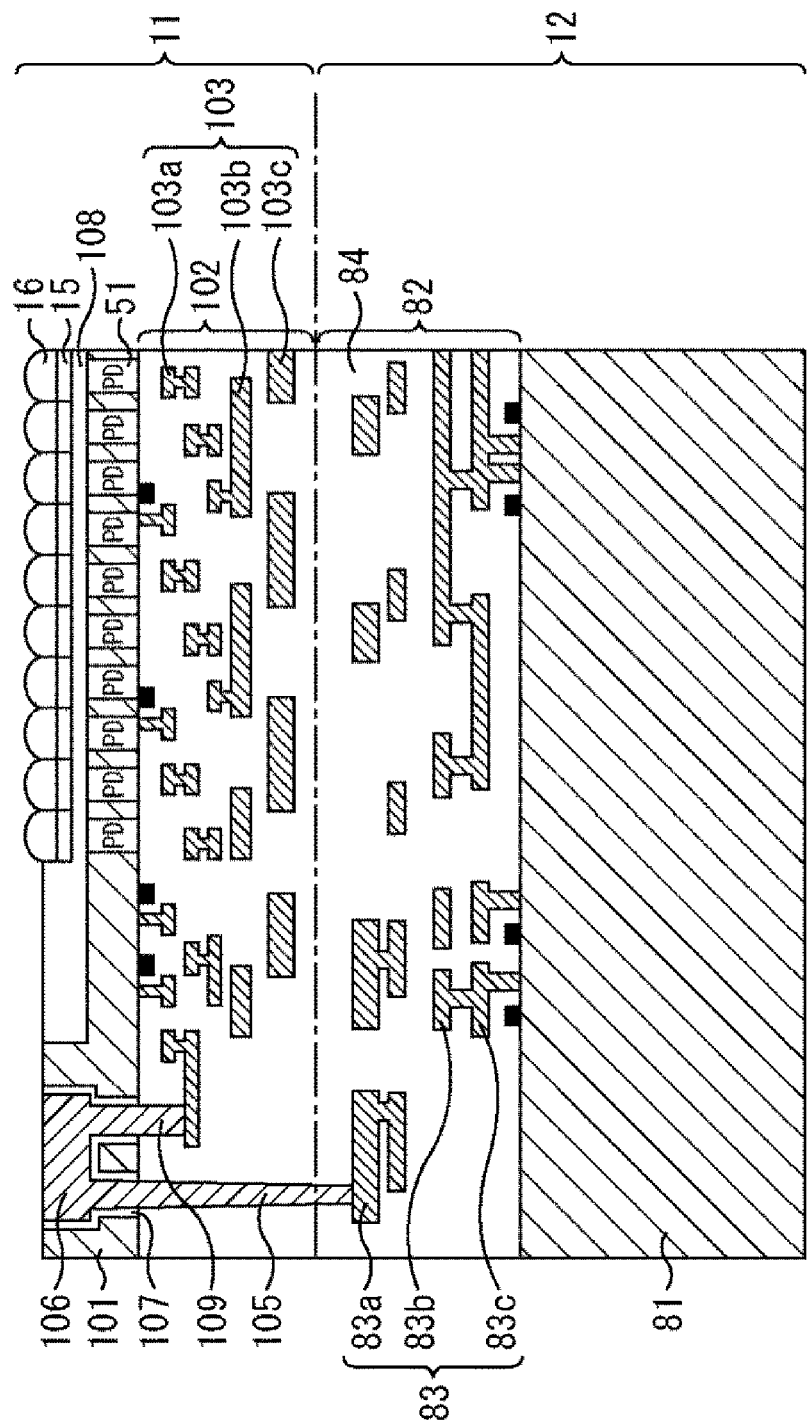
FIG. 42 is a diagram for describing the method for manufacturing the camera package.

Next, as shown in FIG. 42, the color filter 15 and the on-chip lens 16 are formed on the photodiode 51 of each pixel 31 via a flattening film 108.

Figure 43:
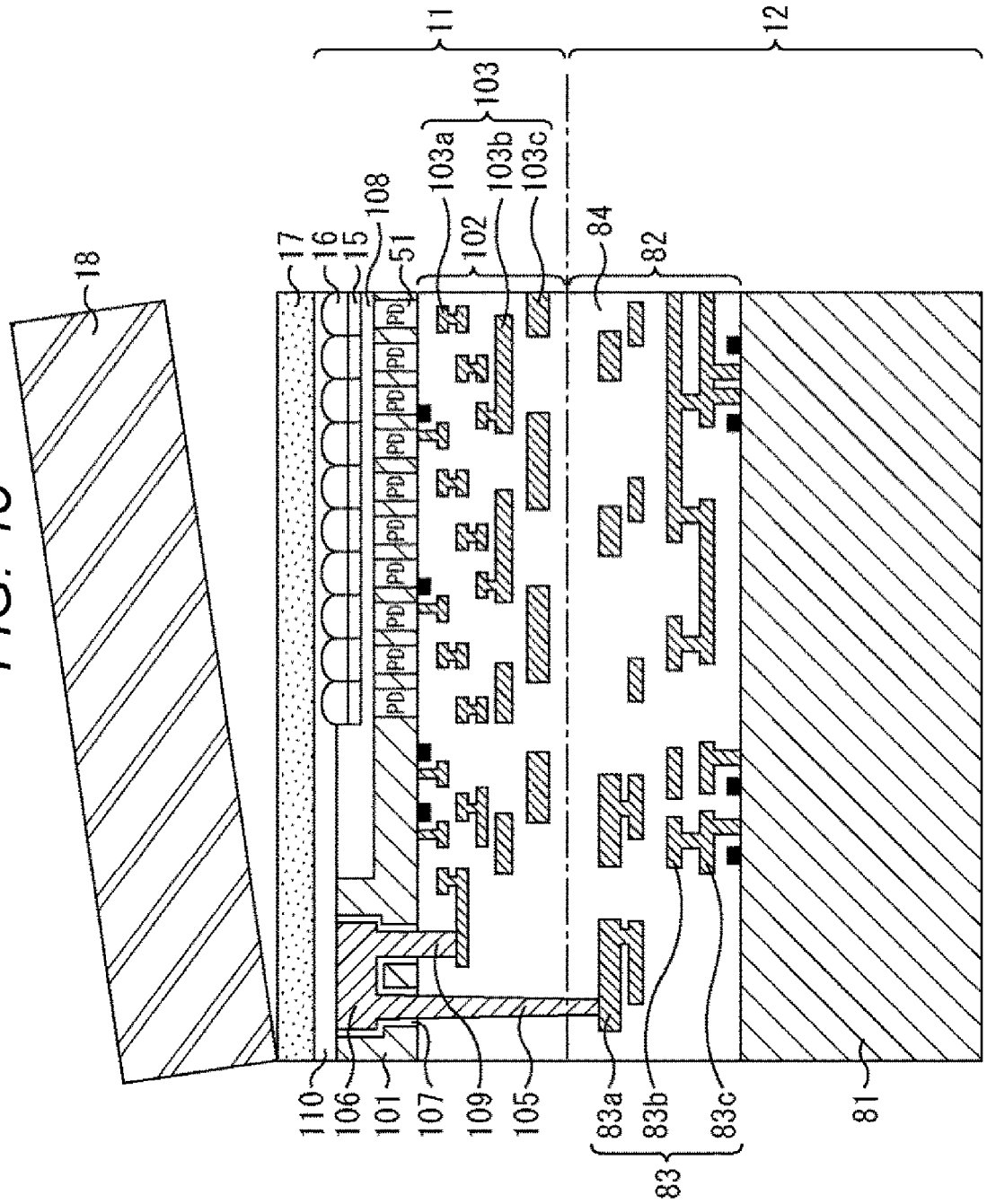
FIG. 43 is a diagram for describing the method for manufacturing the camera package.
Figure 44:
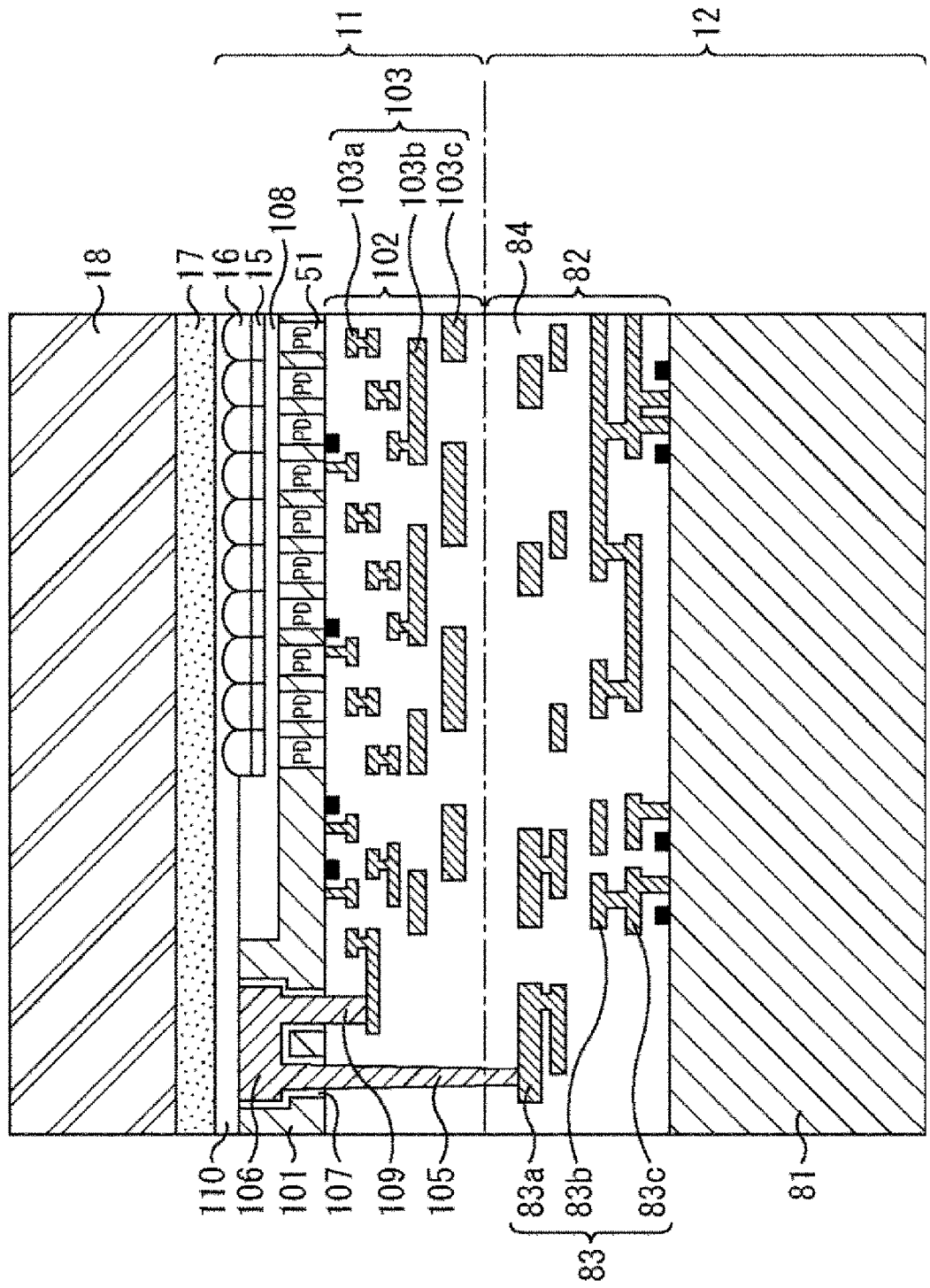
FIG. 44 is a diagram for describing the method for manufacturing the camera package.

Then, the sealing resin 17 is applied to the entire surface, on which the on-chip lenses 16 are provided, of the solid-state imaging element 13 obtained by bonding the upper structure 11 and the lower structure 12 via a flattening film 110 as shown in FIG. 43, and the protective substrate 18 is bonded with a cavityless structure as shown in FIG. 44.

In this case, in a case where the method in which the lens resin part 19 is formed on the protective substrate 18, and then, the resultant is bonded to the solid-state imaging element 13 as described with reference to FIG. 18B is used, the lens resin part 19 is already formed on the protective substrate 18.

On the other hand, in a case where the method in which the lens resin part 19 is formed on the protective substrate 18 after the protective substrate 18 is placed on the solid-state imaging element 13 as described with reference to FIG. 18A is used, the lens resin part 19 is formed on the protective substrate 18 in a predetermined step after the state shown in FIG. 44 is obtained.

Figure 45:
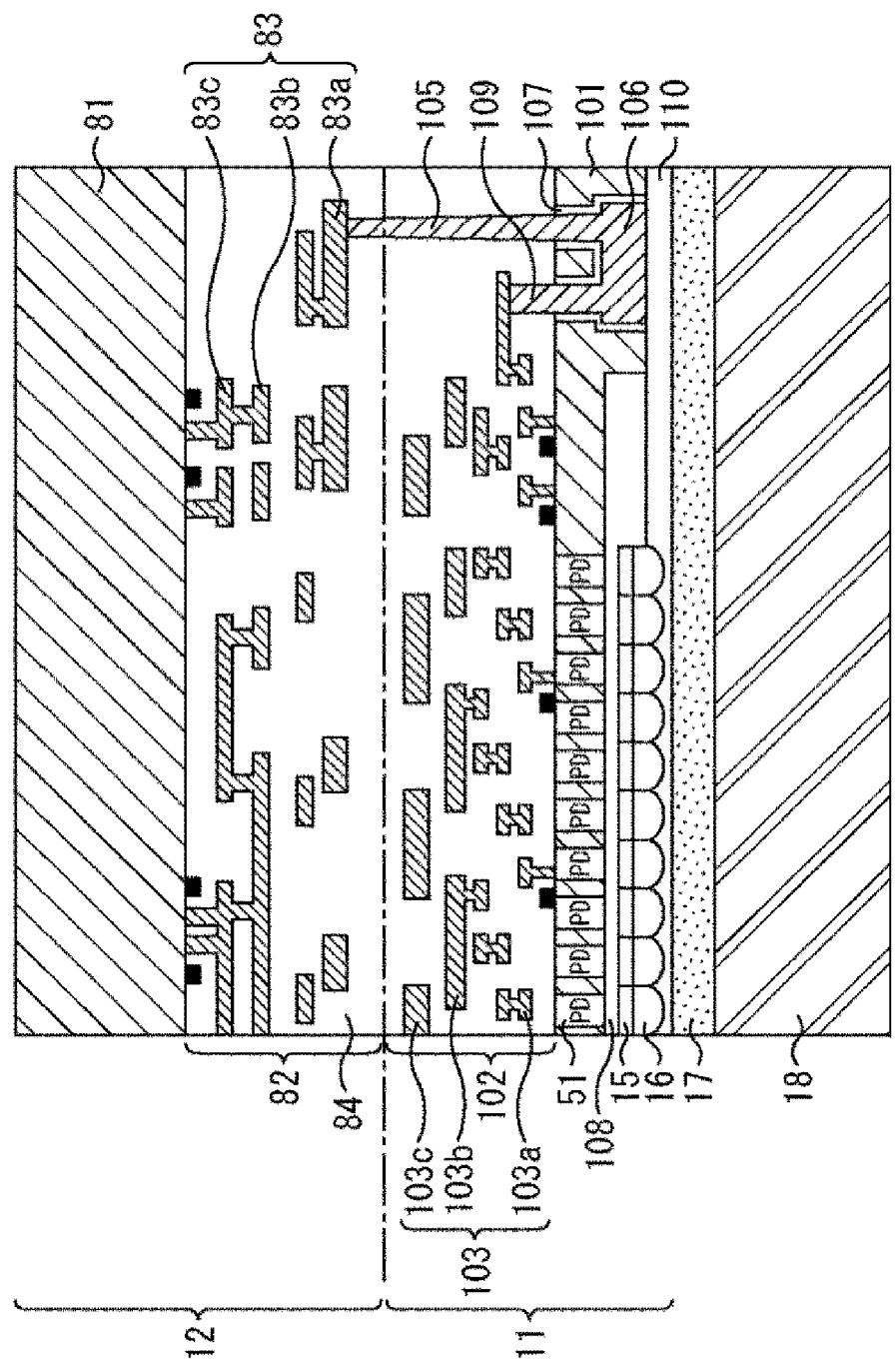
FIG. 45 is a diagram for describing the method for manufacturing the camera package.

Next, as shown in FIG. 45, after the entire solid-state imaging element 13 is inverted, the semiconductor substrate 81 of the lower structure 12 is thinned to a thickness that does not affect the device characteristics, for example, about 30 μm to 100 μm.

Figure 46:
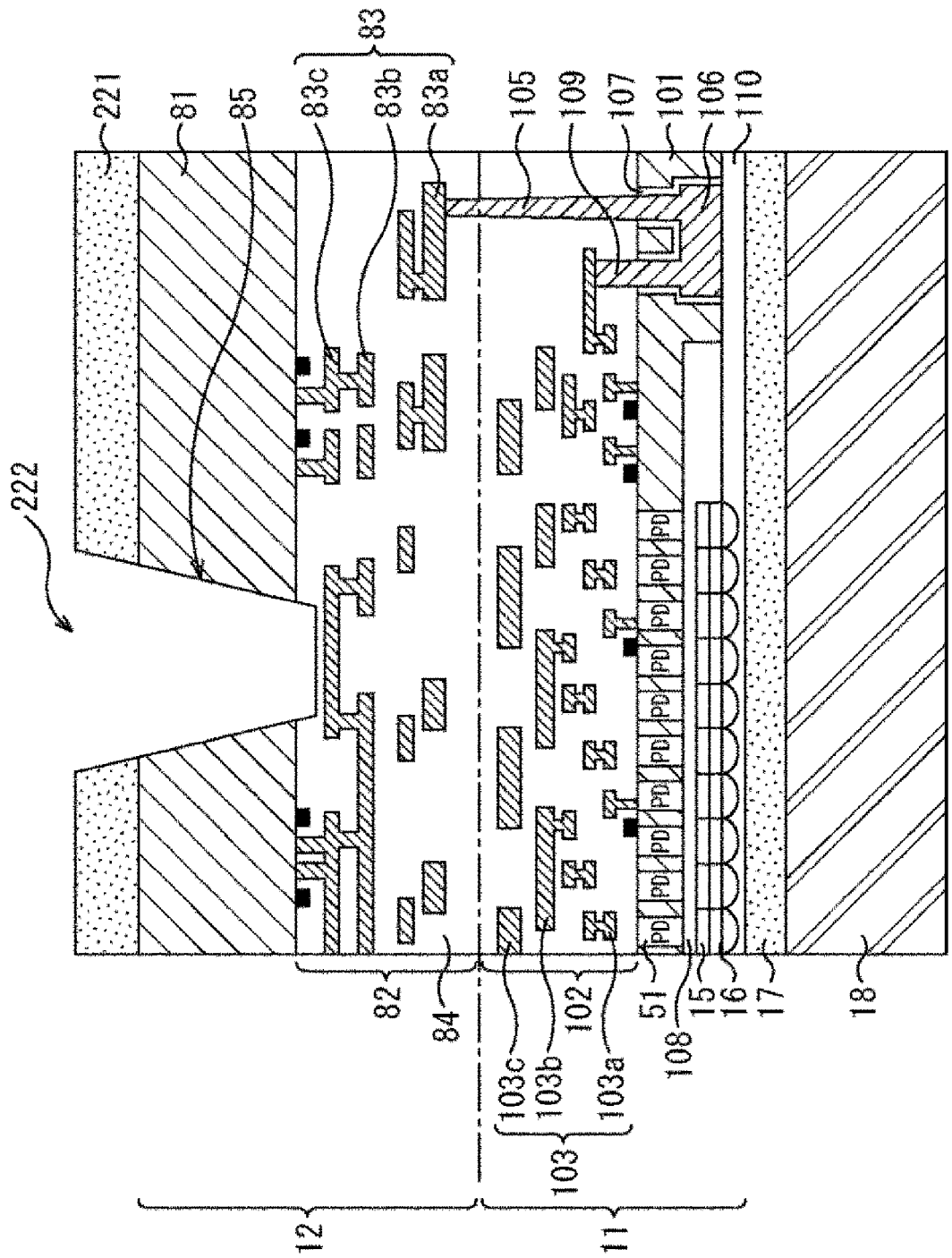
FIG. 46 is a diagram for describing the method for manufacturing the camera package.

Next, as shown in FIG. 46, a photoresist 221 is patterned so that the position where the through via 88 (not shown) is formed on the thinned semiconductor substrate 81 is opened, and then, the semiconductor substrate 81 and a part of an interlayer insulating film 84 are removed by dry etching, and an opening 222 is formed.

Figure 47:
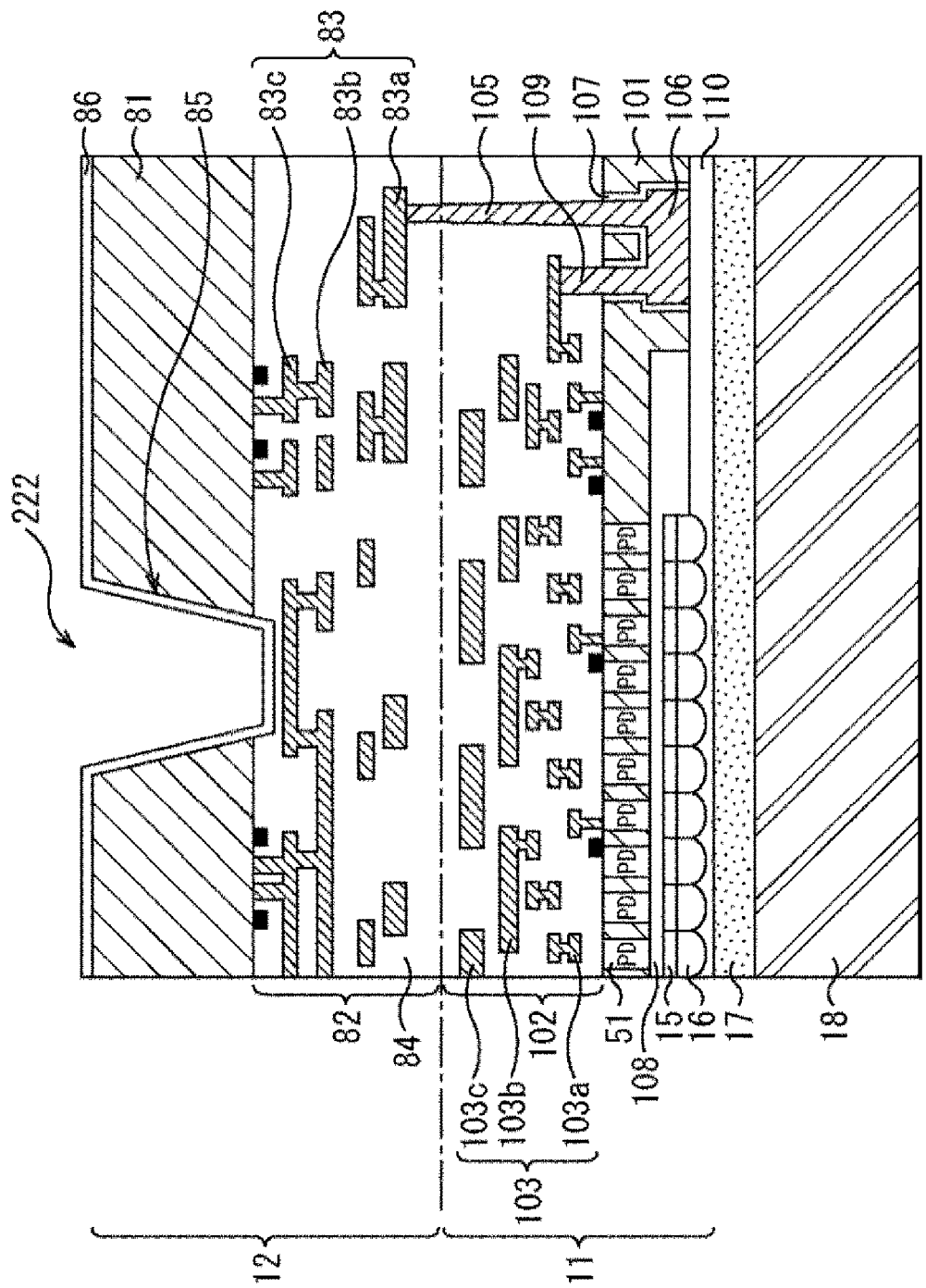
FIG. 47 is a diagram for describing the method for manufacturing the camera package.

Next, as shown in FIG. 47, an insulating film (isolation film) 86 is formed on the entire upper surface of the semiconductor substrate 81 including the opening 222 by, for example, a plasma CVD method. The insulating film 86 can be, for example, a SiO2 film or a SiN film.

Figure 48:
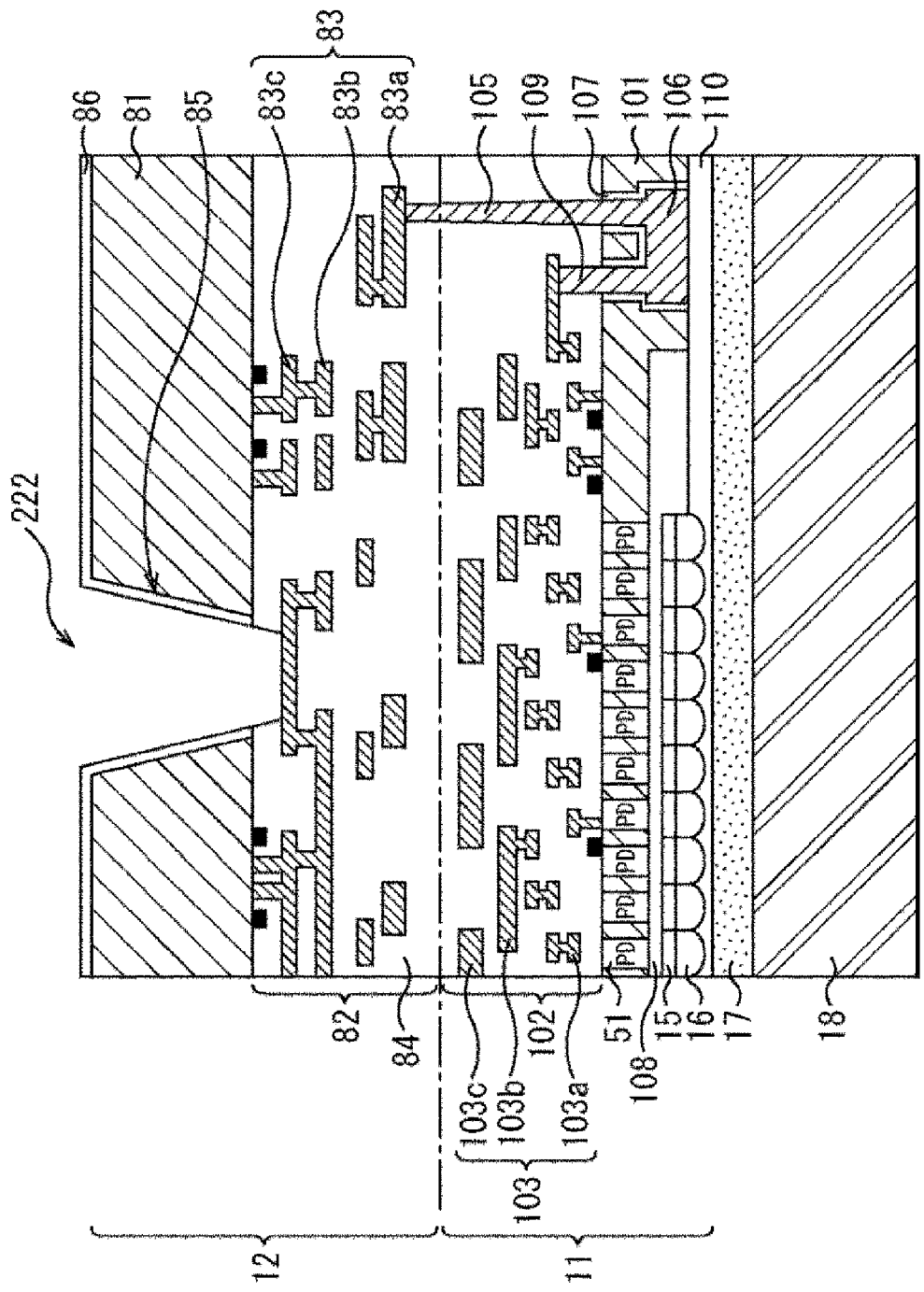
FIG. 48 is a diagram for describing the method for manufacturing the camera package.

Next, as shown in FIG. 48, the insulating film 86 on the bottom surface of the opening 222 is removed using an etchback process, by which the wiring layer 83c closest to the semiconductor substrate 81 is exposed.

Figure 49:
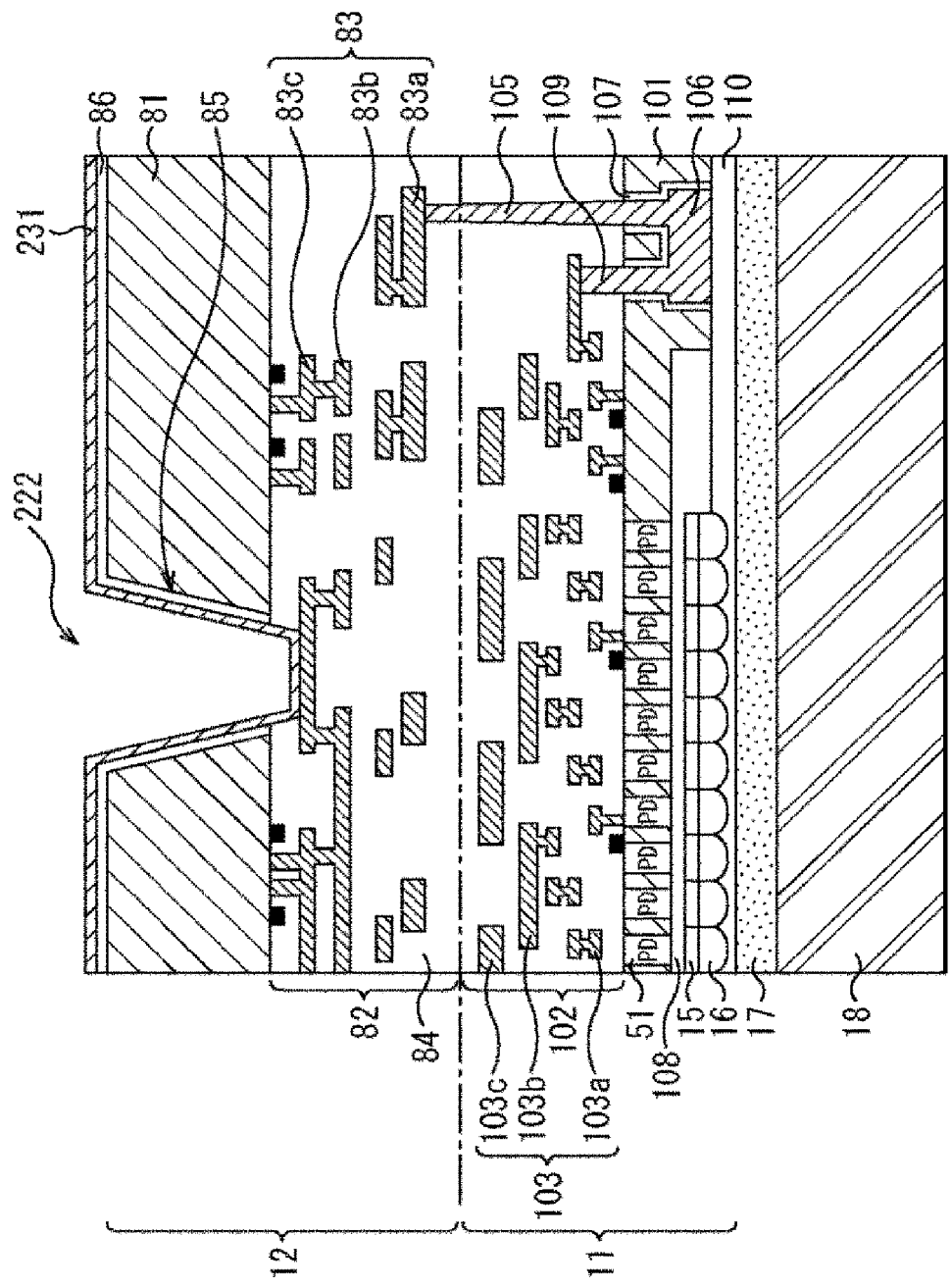
FIG. 49 is a diagram for describing the method for manufacturing the camera package.

Next, as shown in FIG. 49, a barrier metal film (not shown) and a Cu seed layer 231 are formed using a sputtering method. The barrier metal film is for preventing diffusion of a connection conductor 87 (Cu) shown in FIG. 50, and the Cu seed layer 231 serves as an electrode when the connection conductor 87 is embedded with an electrolytic plating method. As the material of the barrier metal film, tantalum (Ta), titanium (Ti), tungsten (W), zirconium (Zr), a nitride film thereof, a carbonized film thereof, and the like can be used. In the present embodiment, titanium is used as the barrier metal film.

Figure 50:
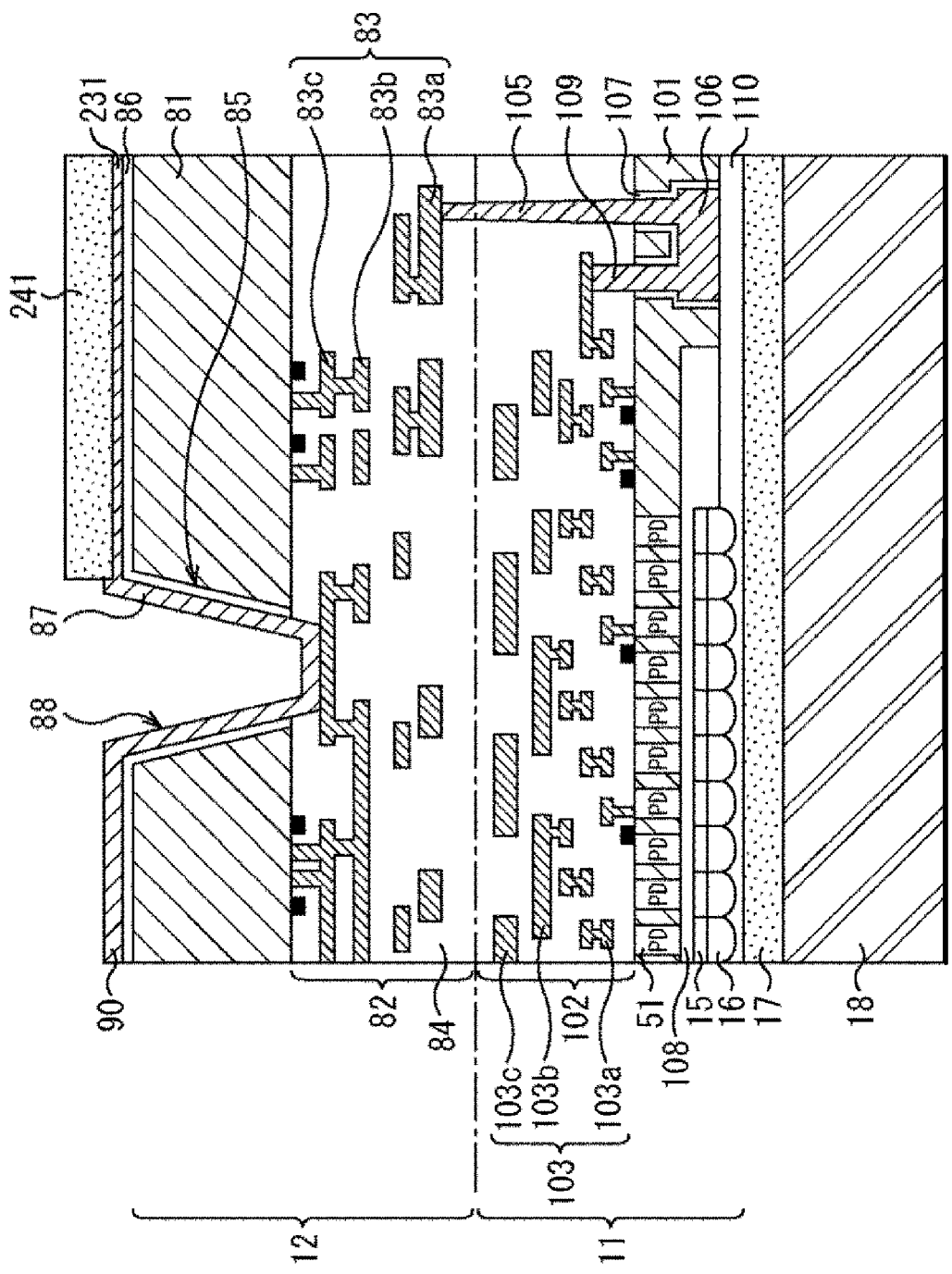
FIG. 50 is a diagram for describing the method for manufacturing the camera package.

Next, as shown in FIG. 50, after a resist pattern 241 is formed in a required region on the Cu seed layer 231, copper (Cu) as the connection conductor 87 is plated using the electrolytic plating method. As a result, the through via 88 is formed, and rewiring 90 is also formed above the semiconductor substrate 81.

Figure 51:
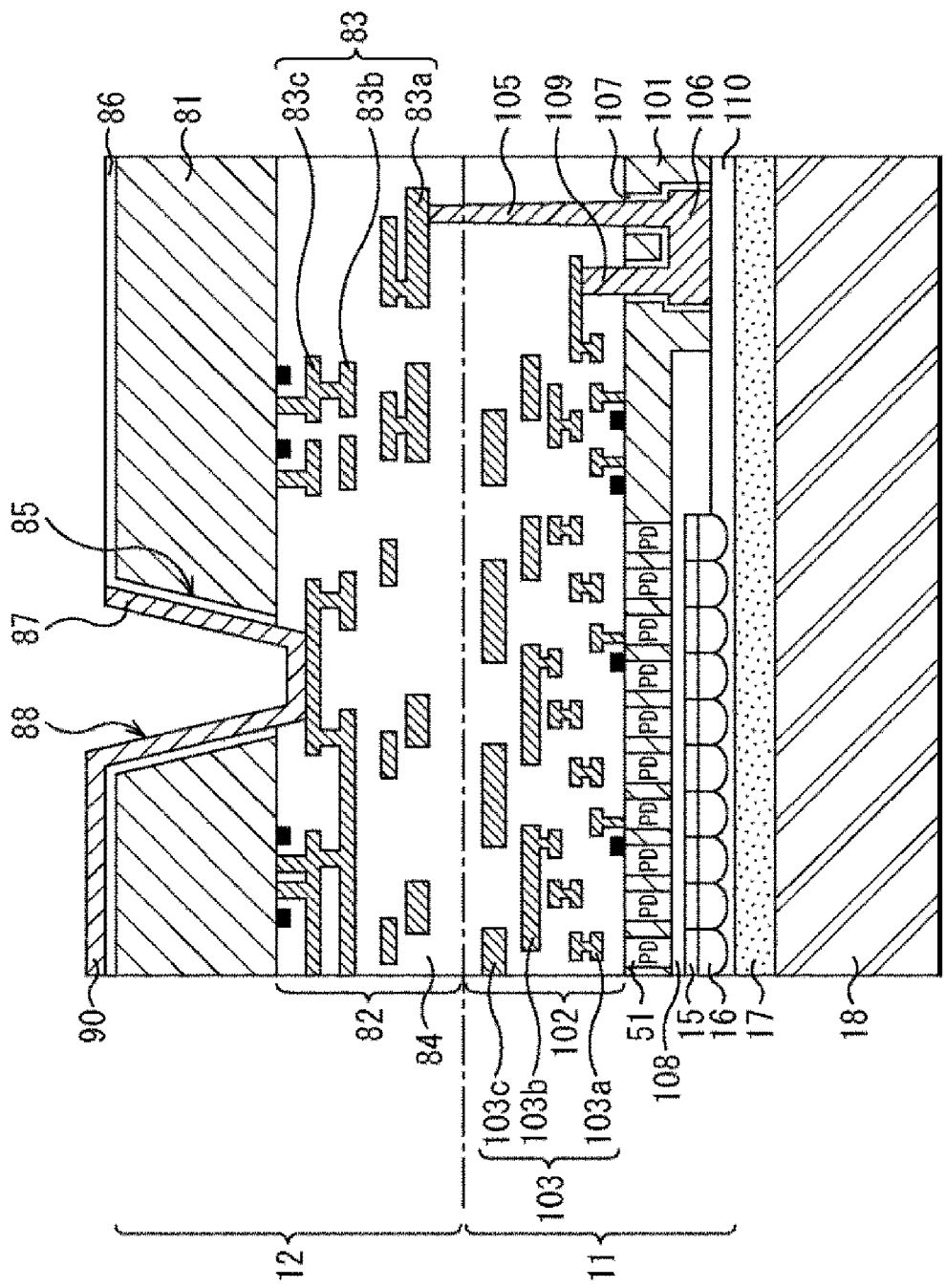
FIG. 51 is a diagram for describing the method for manufacturing the camera package.

Next, as shown in FIG. 51, after the resist pattern 241 is removed, the barrier metal film (not shown) and the Cu seed layer 231 under the resist pattern 241 are removed by wet etching.

Figure 52:
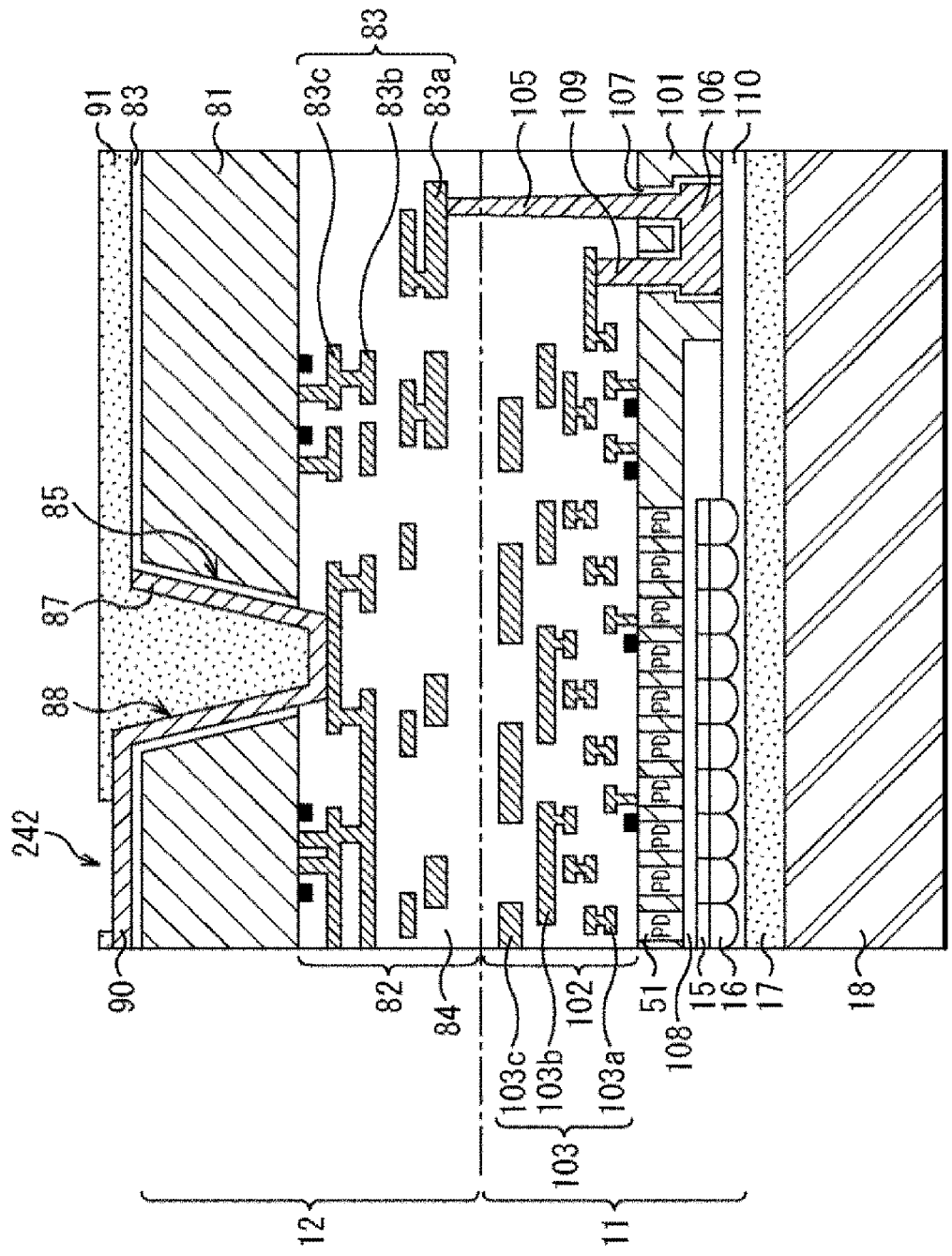
FIG. 52 is a diagram for describing the method for manufacturing the camera package.

Next, as shown in FIG. 52, a solder mask 91 is formed to protect the rewiring 90, and then, the solder mask 91 only in a region where the external terminals 14 are mounted is removed, by which a solder mask opening 242 is formed.

Figure 53:
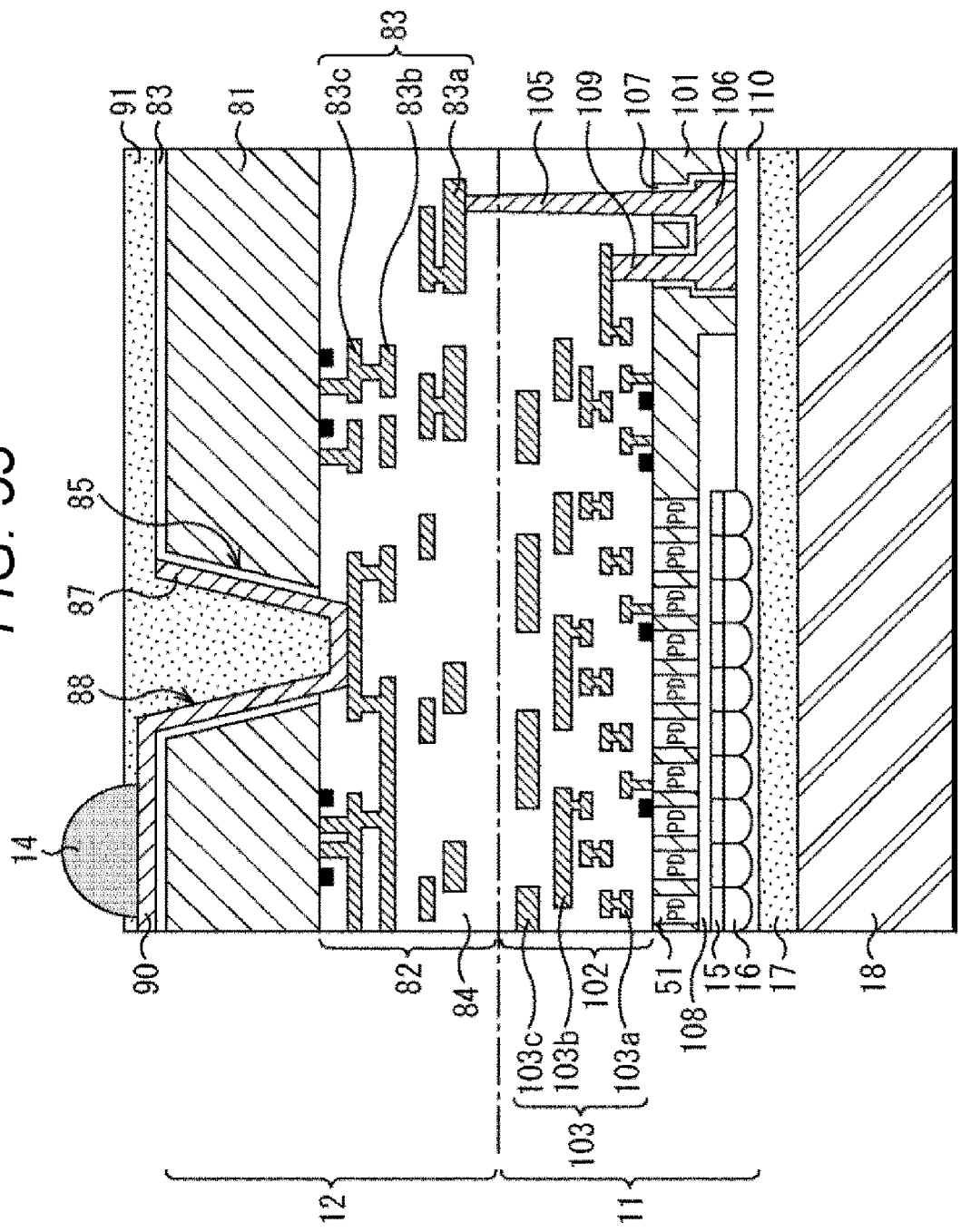
FIG. 53 is a diagram for describing the method for manufacturing the camera package.

Then, as shown in FIG. 53, the external terminal 14 is formed in the solder mask opening 242 by a solder ball mounting method or the like.

As described above, according to the method for manufacturing the solid-state imaging element 13, first, the upper structure 11 (first semiconductor substrate) on which the photodiodes 51 for photoelectric conversion, the pixel transistor circuit, and the like are formed, and the lower structure 12 (second semiconductor substrate) in which the input/output circuit unit 49 for outputting the pixel signal output from the pixel 31 to the outside of the camera package 1 is located below the pixel array unit 24 are bonded to each other with the wiring layers facing each other. Then, the through via 88 which passes through the lower structure 12 is formed, and the external terminal 14 electrically connected to the outside of the camera package 1 via the input/output circuit unit 49 and the through via 88 is formed. In this way, the camera package 1 shown in FIG. 1 can be manufactured.

<17. Configuration Example of Camera Module>

A mold to which the present disclosure is applied can be used for forming a mold in a wafer-level lens process for simultaneously forming a plurality of lenses in a planar direction of a wafer substrate by imprinting.

In the following, a configuration of a camera module formed by using the wafer-level lens process for simultaneously forming a plurality of lenses in the planar direction of the wafer substrate will be described first, and a specific step in which the mold according to the present disclosure can be used in the process for forming the camera module will be described next.

Figure 54:
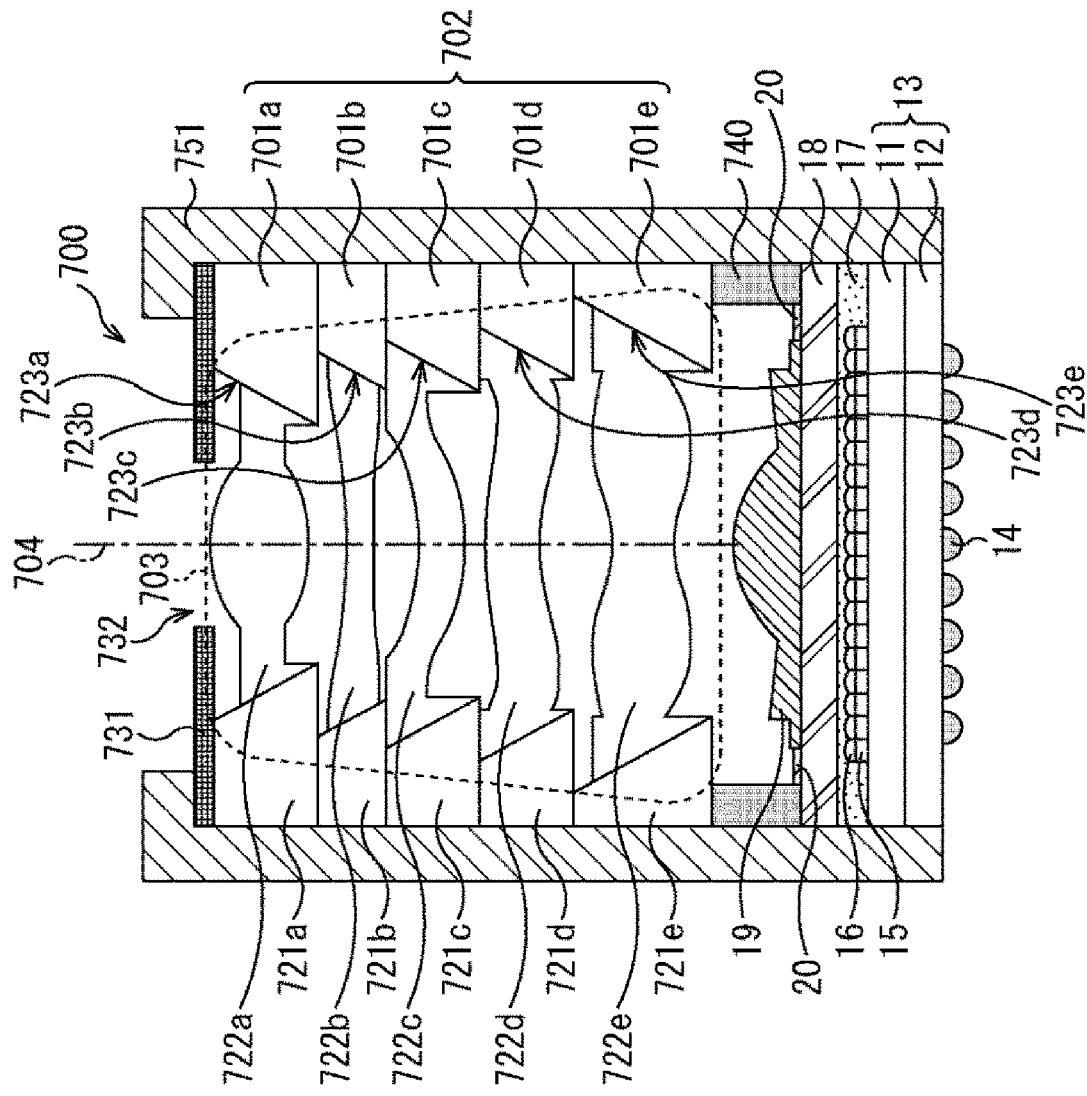
FIG. 54 is a cross-sectional view showing a first configuration example of a camera module.

FIG. 54 is a cross-sectional view of a camera module 700.

The camera module 700 includes a multilayer lens structure (lens module) 702 in which a plurality of lens-equipped substrates 701a to 701e is stacked. The multilayer lens structure 702 constitutes one optical unit 703. A dash-dot-dash line 704 represents an optical axis of the optical unit 703.

The camera package 1 shown in FIG. 1 is disposed under the multilayer lens structure 702. The camera package 1 is fixed to the multilayer lens structure 702 via a structural material 740 formed using, for example, an epoxy resin.

In the camera module 700, light entering the camera module 700 from above passes through the multilayer lens structure 702 and enters the on-chip lenses 16, the color filter 15, and photoelectric conversion elements such as photodiodes (not shown) formed on the upper structure 11 of the camera package 1.

The multilayer lens structure 702 includes five lens-equipped substrates 701a to 701e which are stacked. In a case where the five lens-equipped substrates 701a to 701e are not particularly distinguished, they are simply referred to as the lens-equipped substrates 701.

Note that, although the multilayer lens structure 702 includes five lens-equipped substrates 701a to 701e in the example in FIG. 54, the number of lens-equipped substrates 701 to be stacked may be two or more except for five, or may be one.

Each of the lens-equipped substrates 701 constituting the multilayer lens structure 702 has a configuration in which a lens resin part 722 is added to a carrier substrate 721. The carrier substrate 721 has a through hole 723, and the lens resin part 722 is formed inside the through hole 723. The lens resin part 722 indicates a portion in which a lens part and a part that extends to the carrier substrate 721 and that supports the lens part are integrated by the material constituting the lens part.

Note that, in a case where the carrier substrates 721, the lens resin parts 722, or the through holes 723 of the lens-equipped substrates 701a to 701e are distinguished from each other, they are referred to as carrier substrates 721a to 81e, lens resin parts 722a to 82e, or through-holes 723a to 83e corresponding to the lens-equipped substrates 701a to 41e as shown in FIG. 54.

The through hole 723 of each of the lens-equipped substrates 701 constituting the multilayer lens structure 702 has a cross section with a so-called funnel shape in which an opening width decreases toward the bottom.

A diaphragm plate 731 is disposed on the multilayer lens structure 702. The diaphragm plate 731 has, for example, a layer including a material having optical absorption property or light shielding property. The diaphragm plate 731 is provided with an opening 732.

The multilayer lens structure 702, the camera package 1, the diaphragm plate 731, etc. are housed in a lens barrel 751.

As described above, the camera package 1 shown in FIG. 1 can constitute the camera module 700 in combination with the multilayer lens structure 702 in which a plurality of lens-equipped substrates 701 is stacked.

Figure 55:
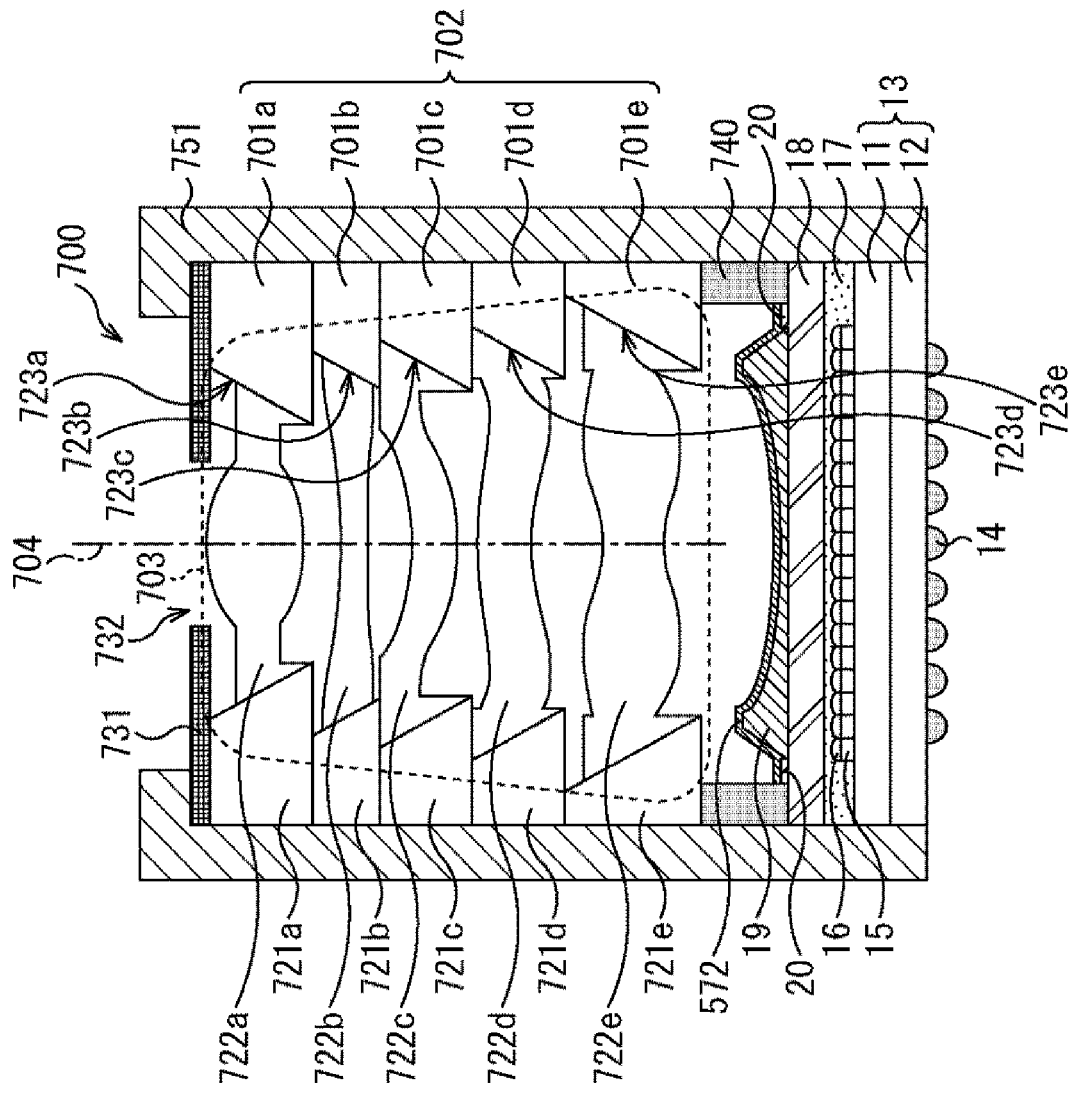
FIG. 55 is a cross-sectional view showing a second configuration example of the camera module.

Further, the camera module 700 can be constructed by combining the camera package 1 shown in FIG. 22 and the multilayer lens structure 702 as shown in FIG. 55, or by combining the camera package 1 shown in FIG. 29 and the multilayer lens structure 702.

Figure 56:
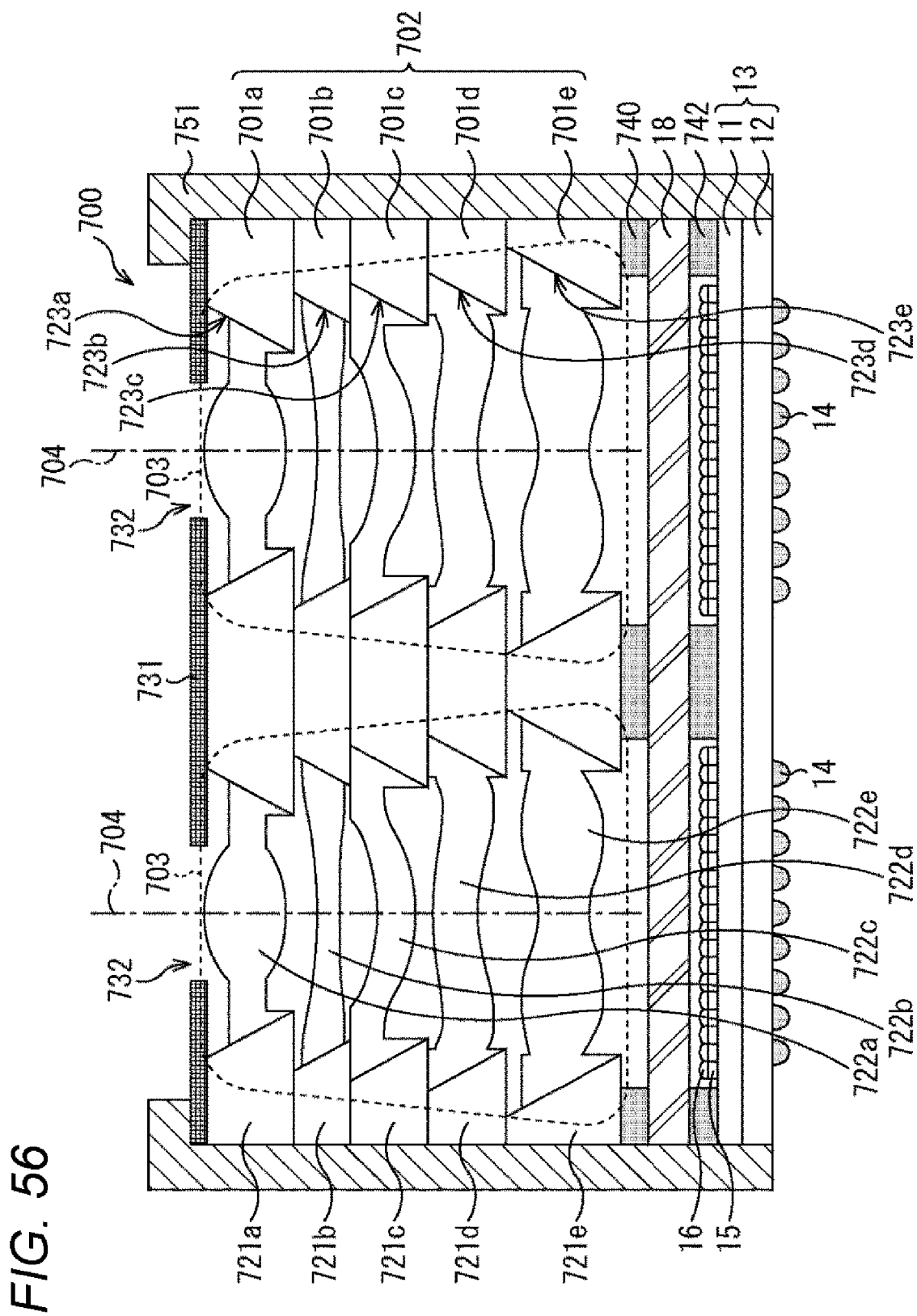
FIG. 56 is a cross-sectional view showing a third configuration example of the camera module.

Moreover, as shown in FIG. 56, the camera module 700 may be configured as a compound eye camera module in which the multilayer lens structure 702 is provided with a plurality of optical units 703, and the camera package 1 is also provided with a plurality of light receiving regions corresponding to the plurality of optical units 703.

Note that the camera package 1 of the camera module 700 shown in FIG. 56 employs a configuration in which the sealing resin 17 embedded between the on-chip lens 16 and the protective substrate 18 and the lens resin part 19 and the high contact angle film 20 formed on the upper surface of the protective substrate 18 are omitted.

In the example of FIG. 56, the plurality of optical units 703 formed in the multilayer lens structure 702 has the same configuration, but may have different configurations. That is, the plurality of optical units 703 may have different optical parameters due to a difference in shape and number among the lens resin parts 722. For example, the plurality of optical units 703 may include an optical unit 703 having a short focal length for imaging a near view and an optical unit 703 having a long focal length for imaging a distant view.

FIGS. 57A, 57B, 57C, 57D, 57E, and 57F are diagrams for describing a manufacturing method for manufacturing the multilayer lens structure 702 described with reference to FIGS. 54 to 56 in a form of substrate.

First, as shown in FIG. 57A, a lens-equipped substrate 701W-e which is in a form of substrate and which is located in the lowermost layer in the multilayer lens structure 702 is prepared. Note that the lens-equipped substrate 701W-e refers to a lens-equipped substrate in a form of substrate (wafer) before being diced into lens-equipped substrates 701e. Similarly, later-described lens-equipped substrates 701W-a to 701W-d in a form of substrate refer to lens-equipped substrates in a form of substrate (wafer) before being diced into lens-equipped substrates 701a to 701e.

Next, as shown in FIG. 57B, the lens-equipped substrate 701W-d in a form of substrate located in the second lowest layer in the multilayer lens structure 702 is bonded on the lens-equipped substrate 701W-e in a form of substrate.

Next, as shown in FIG. 57C, the lens-equipped substrate 701W-c in a form of substrate located in the third lowest layer in the multilayer lens structure 702 is bonded on the lens-equipped substrate 701W-d in a form of substrate.

Next, as shown in FIG. 57D, the lens-equipped substrate 701W-b in a form of substrate located in the fourth lowest layer in the multilayer lens structure 702 is bonded on the lens-equipped substrate 701W-c in a form of substrate.

Next, as shown in FIG. 57E, the lens-equipped substrate 701W-a in a form of substrate located in the fifth lowest layer in the multilayer lens structure 702 is bonded on the lens-equipped substrate 701W-b in a form of substrate.

Finally, as shown in FIG. 57E, the diaphragm plate 731W located on the lens-equipped substrate 701a in the multilayer lens structure 702 is bonded onto the lens-equipped substrate 701W-a in a form of substrate. The diaphragm plate 731W refers to a diaphragm plate in a form of substrate (wafer) before being diced into diaphragm plates 731.

As described above, the five lens-equipped substrates 701W-a to 701W-e in a form of substrate are sequentially stacked one by one from the lens-equipped substrate 701W in the lower layer to the lens-equipped substrate 701W in the upper layer in the multilayer lens structure 702, so that the multilayer lens structure 702W in a form of substrate is obtained.

Note that it is also possible to form the multilayer lens structure 702W in a form of substrate by sequentially stacking the lens-equipped substrates one by one from the lens-equipped substrate 701W in the upper layer to the lens-equipped substrate 701W in the lower layer.

<18. Direct Bonding Between Lens-Equipped Substrates>

Figure 58A:
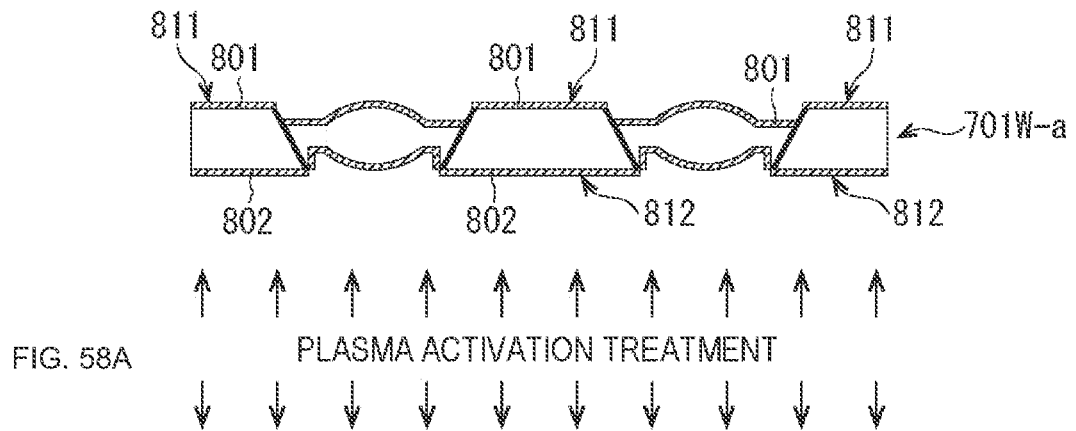
FIGS. 58A and 58B are diagrams for describing bonding between two lens-equipped substrates in a form of substrate.
Figure 58B:
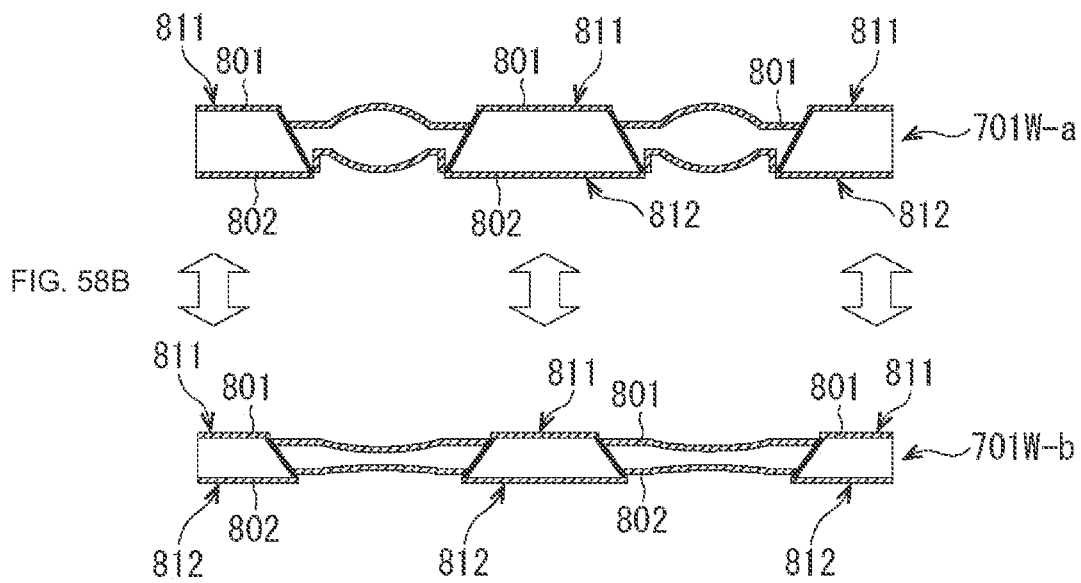

FIGS. 58A and 58B are diagrams for describing bonding between the lens-equipped substrate 701W-a in a form of substrate and the lens-equipped substrate 701W-b in a form of substrate as an example of bonding two lens-equipped substrates 701W in a form of substrate.

Note that, in the description with reference to FIGS. 58A and 58B, portions of the lens-equipped substrate 701W-b corresponding to those of the lens-equipped substrate 701W-a are designated by the same reference numerals as the lens-equipped substrate 701W-a.

An upper surface layer 801 is formed on the upper surface of each of the lens-equipped substrate 701W-a and the lens-equipped substrate 701W-b. A lower surface layer 802 is formed on the lower surface of each of the lens-equipped substrate 701W-a and the lens-equipped substrate 701W-b. Then, as shown in FIG. 58A, a plasma activation treatment is performed on the surfaces of the lens-equipped substrates 701W-a and 701W-b which are to be bonded to each other, that is, on the entire lower surface of the lens-equipped substrate 701W-a including a back flat part 812 and the entire upper surface of the lens-equipped substrate 701W-b including a front flat part 811. Any kind of gas capable of plasma treatment such as O2, N2, He, Ar, or H2 may be used as a gas used for the plasma activation treatment. Note that it is preferable to use a gas same as the constituent element of the upper surface layer 801 and the lower surface layer 802 as the gas used for the plasma activation treatment, because using such gas can suppress alteration of films of the upper surface layer 801 and the lower surface layer 802.

Then, as shown in FIG. 58B, the back flat part 812 of the lens-equipped substrate 701W-a and the front flat part 811 of the lens-equipped substrate 701W-b which have activated surfaces are bonded to each other.

Due to the process of bonding the lens-equipped substrates described above, a hydrogen bond is formed between hydrogen of an OH group on the surface of the lower surface layer 802 of the lens-equipped substrate 701W-a and hydrogen of an OH group on the surface of the upper surface layer 801 of the lens-equipped substrate 701W-b. As a result, the lens-equipped substrates 701W-a and 701W-b are fixed. The process of bonding the lens-equipped substrates described above can be performed under atmospheric pressure conditions.

The lens-equipped substrates 701W-a and 701W-b that have undergone the abovementioned bonding process are annealed. As a result, dehydration condensation occurs in the state where the OH groups are bonded by hydrogen bonding, and a covalent bond through oxygen is formed between the lower surface layer 802 of the lens-equipped substrate 701W-a and the upper surface layer 801 of the lens-equipped substrate 701W-b. Alternatively, an element contained in the lower surface layer 802 of the lens-equipped substrate 701W-a and an element contained in the upper surface layer 801 of the lens-equipped substrate 701W-b are covalently bonded. Due to the bonding described above, the two lens-equipped substrates are firmly fixed. The state where the two lens-equipped substrates 701W are fixed by a covalent bond formed between the lower surface layer 802 of the upper lens-equipped substrate 701W and the upper surface layer 801 of the lower lens-equipped substrate 701W as described above is referred to as direct bonding in the present specification. The direct bonding according to the present disclosure does not use resin for fixing multiple lens-equipped substrates 701W, and thus, can provide an operation or effect that the multiple lens-equipped substrates 701W can be fixed without causing cure shrinkage or thermal expansion which may be caused when resin is used.

The annealing treatment mentioned above can also be performed under atmospheric pressure conditions. In order to cause dehydration condensation, the annealing treatment may be performed at 100° C. or higher, 150° C. or higher, or 200° C. or higher. On the other hand, the annealing treatment may be performed at 400° C. or less, 350° C. or less, or 300° C. or less from the viewpoint of protecting an energy-curable resin for forming the lens resin part 722 from heat and suppressing degassing from the energy-curable resin.

Suppose that the abovementioned process of bonding the lens-equipped substrates 701W or the abovementioned direct bonding process of bonding the lens-equipped substrates 701W is performed under a condition other than the atmospheric pressure condition. When the lens-equipped substrates 701W-a and 701W-b which are bonded to each other are returned to an environment with atmospheric pressure, a pressure difference occurs between the outside of the lens resin parts 722 and the space between the lens resin parts 722 which are bonded to each other. Due to this pressure difference, pressure is applied to the lens resin parts 722, so that the lens resin parts 722 may be likely to deform.

Performing both the abovementioned bonding process of bonding the lens-equipped substrates 701W and the abovementioned direct bonding process of bonding the lens-equipped substrates 701W under atmospheric pressure condition provides an operation or effect capable of preventing deformation of the lens resin parts 722 which may be likely to occur when the bonding is performed under a condition other than atmospheric pressure.

By directly bonding the plasma-activated substrates, in other words, by bonding the substrates by plasma, it is possible to suppress fluidity and thermal expansion which may occur when, for example, a resin is used as an adhesive, whereby positional accuracy during bonding between the lens-equipped substrates 701W-a and 701W-b can be enhanced.

As described above, the upper surface layer 801 or the lower surface layer 802 is formed on the back flat part 812 of the lens-equipped substrate 701W-a and the front flat part 811 of the lens-equipped substrate 701W-b. Dangling bonds are easily formed in the upper surface layer 801 and the lower surface layer 802 by the plasma activation treatment performed earlier. That is, the lower surface layer 802 formed on the back flat part 812 of the lens-equipped substrate 701W-a and the upper surface layer 801 formed on the front flat part 811 of the lens-equipped substrate 701W-b have a function of increasing the bonding strength.

Further, in a case where the upper surface layer 801 or the lower surface layer 802 includes an oxide film, they are not affected by a change in film quality due to plasma (O2). Therefore, this configuration also provides an effect of suppressing corrosion of the lens resin part 722 due to plasma.

As described above, the lens-equipped substrate 701W-a in a form of substrate having multiple lens-equipped substrates 701a formed thereon and the lens-equipped substrate 701W—in a form of substrate having multiple lens-equipped substrates 701b formed thereon are directly bonded after being subjected to a surface activation treatment using plasma, in other words, are bonded using plasma bonding.

The similar method is also applied to bond another two lens-equipped substrates 701W in a form of substrate.

<19. Method for Manufacturing Lens-Equipped Substrate>

Next, a method for manufacturing the lens-equipped substrate 701W in a form of substrate will be described with reference to FIGS. 59A, 59B, 59C, 59D, 59E, 59F, and 59G.

First, as shown in FIG. 59A, a carrier substrate 721W having a plurality of through holes 723 is prepared. A light-shielding film 911 for preventing reflection of light is formed on the side wall of each of the through holes 723. Although FIGS. 59A, 59B, 59C, 59D, 59E, 59F, and 59G show only two through holes 723 due to space limitation, a large number of through holes 723 are actually formed in the carrier substrate 721W in a planar direction. Further, an alignment mark (not shown) for positional alignment is formed in a region near the outer periphery of the carrier substrate 721W.

A front flat part 811 on the upper side of the carrier substrate 721W and a back flat part 812 on the lower side are flat surfaces that is flat enough to be bonded by plasma bonding as described above. The thickness of the carrier substrate 721W serves as a spacer for determining the distance between lenses when the carrier substrate 721W is finally diced into lens-equipped substrates 701 and the obtained lens-equipped substrate 701 is stacked on another lens-equipped substrate 701.

It is preferable to use a base material having a low thermal expansion coefficient of 10 ppm/° C. or less for the carrier substrate 721W.

Next, as shown in FIG. 59B, the carrier substrate 721W is placed on a mold substrate 921 in which a plurality of concave molds 922 is arranged at regular intervals. More specifically, the back flat part 812 of the carrier substrate 721W and a flat surface 923 of the mold substrate 921 are overlapped so that the concave molds 922 are located inside the through holes 723 of the carrier substrate 721W. The molds 922 of the mold substrate 921 are formed so as to correspond one-to-one with the through holes 723 of the carrier substrate 721W, and the position of the carrier substrate 721W and the position of the mold substrate 921 in the planar direction are adjusted so that the center of the mold 922 and the center of the corresponding through hole 723 coincide with each other along the optical axis direction. The mold substrate 921 is constructed using a hard mold material such as metal, silicon, quartz, or glass, for example.

Next, as shown in FIG. 59C, an energy-curable resin 931 is filled (dropped) inside the through holes 723 of the carrier substrate 721W and the mold substrate 921 which are overlapped with each other. The lens resin parts 722 are formed by using the energy-curable resin 931. Therefore, the energy-curable resin 931 is preferably defoamed in advance so as not to contain air bubbles. A vacuum defoaming process or a defoaming process using centrifugal force is preferably used as the defoaming process. Further, the vacuum defoaming process is preferably performed after filling. By performing the defoaming process, the lens resin parts 722 can be molded without entraining air bubbles.

Next, as shown in FIG. 59D, a mold substrate 941 is placed above the overlapped mold substrate 921 and the carrier substrate 721W. A plurality of concave molds 942 is provided on the mold substrate 941 at regular intervals, and the mold substrate 941 is placed after being positioned with high accuracy so that the center of the through hole 723 and the center of the corresponding mold 942 coincide with each other along the optical axis direction in a manner similar to the manner of placing the mold substrate 921. The mold substrate 941 is constructed using a hard mold material such as metal, silicon, quartz, or glass, for example.

Regarding the height direction which is the vertical direction of the page, the position of the mold substrate 941 is fixed such that a distance between the mold substrate 941 and the mold substrate 921 is adjusted to a predetermined distance by a control device which controls the distance between the mold substrate 941 and the mold substrate 921. During this process, the space between the mold 942 of the mold substrate 941 and the mold 922 of the mold substrate 921 is equal to the thickness of the lens resin part 722 calculated by optical design.

Alternatively, as shown in FIG. 59E, a flat surface 943 of the mold substrate 941 and the front flat part 811 of the carrier substrate 721W may be overlapped as in the case where the mold substrate 921 is placed. In this case, the distance between the mold substrate 941 and the mold substrate 921 is the same as the thickness of the carrier substrate 721W, and highly accurate alignment in the planar direction and the height direction can be achieved.

When the distance between the mold substrate 941 and the mold substrate 921 is controlled to be a preset distance, the energy-curable resin 931 is dropped and added inside of the through hole 723 of the carrier substrate 721W in an amount controlled so as to prevent the energy-curable resin 931 from overflowing from the space enclosed by the through hole 723 of the carrier substrate 721W and the mold substrate 941 and the mold substrate 921 above and below the carrier substrate 721W in the step shown in FIG. 59C. As a result, the manufacturing cost can be reduced without wasting the material of the energy-curable resin 931.

Subsequently, the energy-curable resin 931 is cured in the state shown in FIG. 59E. The energy-curable resin 931 is cured by, for example, applying heat or UV light as energy and being left to stand for a predetermined time. The amount of deformation of the energy-curable resin 931 due to shrinkage can be minimized by pushing the mold substrate 941 downward or performing alignment during curing.

A thermoplastic resin may be used instead of the energy-curable resin 931. In that case, in the state shown in FIG. 59E, the energy-curable resin 931 is formed into a lens shape by raising the temperature of the mold substrate 941 and the mold substrate 921, and is cured by cooling.

Next, as shown in FIG. 59E, the control device that controls the positions of the mold substrate 941 and the mold substrate 921 moves the mold substrate 941 upward and the mold substrate 921 downward, thereby releasing the mold substrate 941 and the mold substrate 921 from the carrier substrate 721W. When the mold substrate 941 and the mold substrate 921 are released from the carrier substrate 721W, the lens resin part 722 is formed inside the through hole 723 of the carrier substrate 721W.

Note that the surfaces of the mold substrate 941 and the mold substrate 921 which come into contact with the carrier substrate 721W may be coated with a release agent such as a fluorine-based or silicon-based release agent, for example. By doing so, the carrier substrate 721W can be easily released from the mold substrate 941 and the mold substrate 921. Further, as a method of easily releasing the mold from the contact surface with the carrier substrate 721W, various coatings such as fluorine-containing diamond like carbon (DLC) may be applied.

Next, as shown in FIG. 59G, the upper surface layer 801 is formed on the surfaces of the carrier substrate 721W and the lens resin part 722, and the lower surface layer 802 is formed on the back surfaces of the carrier substrate 721W and the lens resin part 722. The front flat part 811 and the back flat part 812 of the carrier substrate 721W may be flattened by performing, as necessary, chemical mechanical polishing (CMP) and the like before or after the upper surface layer 801 and the lower surface layer 802 are formed.

As described above, the lens resin parts 722 are formed by imprinting (press-molding) the energy-curable resin 931 in the through holes 723 formed in the carrier substrate 721W using the mold substrate 941 and the mold substrate 921, whereby the lens-equipped substrate 701W in a form of substrate can be manufactured.

The shapes of the mold 922 and the mold 942 are not limited to the concave shape described above, and are determined, as appropriate, depending on the shape of the lens resin part 722. As shown in FIGS. 54 to 56, the lenses of the lens-equipped substrates 701a to 701e may have various shapes derived by optical system design, for example, may have a biconvex shape, a biconcave shape, a planoconvex shape, a plano-concave shape, a convex meniscus shape, a concave meniscus shape, and further a higher-order aspherical shape.

Further, the shapes of the mold 922 and the mold 942 may be such that the formed lens shape has a moth-eye structure.

According to the manufacturing method described above, a variation in distance in the planar direction between the lens resin parts 722 due to cure shrinkage of the energy-curable resin 931 can be eliminated by intervention of the carrier substrate 721W, so that the distance between lenses can be controlled with high accuracy. Further, the above-mentioned manufacturing method provides an effect of reinforcing the energy-curable resin 931 having low strength with the carrier substrate 721W having high strength. This makes it possible to provide a lens array substrate having a plurality of lenses with good handleability formed thereon, and further, provide an effect of suppressing warpage of the lens array substrate.

The method for forming the mold 503 described with reference to FIGS. 28A, 28B, 28C, and 28D can be used for forming the mold 922 and the mold 942 used in the abovementioned method for manufacturing the lens-equipped substrate 701W in a form of substrate.

<20. Example of Application to Electronic Device>

The abovementioned camera package 1 and camera module 700 can be mounted in an electronic device using a camera package in an image capturing unit (photoelectric conversion unit) such as: an imaging device such as a digital still camera and a video camera; a portable terminal device having an imaging function; and a copying machine using a camera package in an image reading unit.

Figure 60:
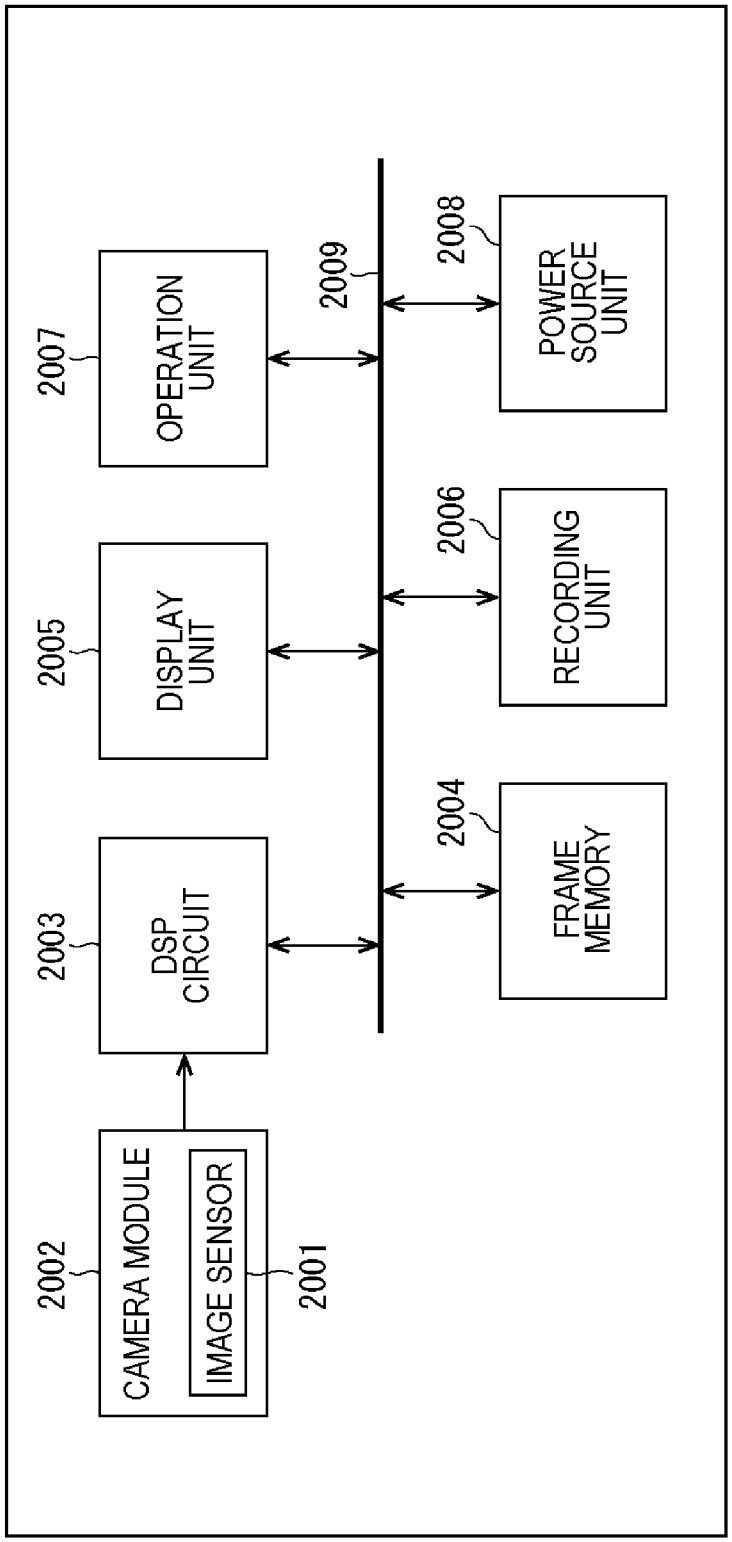
FIG. 60 is a block diagram showing a configuration example of an imaging device serving as an electronic device to which the present disclosure is applied.

FIG. 60 is a block diagram showing a configuration example of an imaging device that is an electronic device to which the present disclosure is applied.

An imaging device 2000 in FIG. 60 includes a camera module 2002 and a digital signal processor (DSP) circuit 2003 which is a camera signal processing circuit. The imaging device 2000 also includes a frame memory 2004, a display unit 2005, a recording unit 2006, an operation unit 2007, and a power source unit 2008. The DSP circuit 2003, the frame memory 2004, the display unit 2005, the recording unit 2006, the operation unit 2007, and the power source unit 2008 are connected to each other via a bus line 2009.

An image sensor 2001 in the camera module 2002 captures incident light (image light) from a subject, converts an amount of incident light formed into an image on an imaging surface into an electric signal on a pixel-by-pixel basis, and outputs the electric signal as a pixel signal. As the camera module 2002, the abovementioned camera module 700 is employed, and the image sensor 2001 corresponds to the abovementioned solid-state imaging element 13. In a case where the configuration of the camera package 1 is employed as an imaging unit of the imaging device 2000, the camera module 2002 is replaced with the camera package 1.

The display unit 2005 includes, for example, a panel-type display device such as a liquid crystal panel or an organic electro luminescence (EL) panel, and displays a moving image or a still image captured by the image sensor 2001. The recording unit 2006 records a moving image or a still image captured by the image sensor 2001 on a recording medium such as a hard disk or a semiconductor memory.

The operation unit 2007 issues operation commands for various functions of the imaging device 2000 in response to an operation performed by a user. The power source unit 2008 appropriately supplies various power supplies, which are operation power supplies for the DSP circuit 2003, the frame memory 2004, the display unit 2005, the recording unit 2006, and the operation unit 2007, to these power supply targets.

As described above, high image quality and miniaturization can be achieved by using the camera module 700 equipped with the multilayer lens structure 702 that is positioned and bonded (stacked) with high accuracy as the camera module 2002. Therefore, in the imaging device 2000 such as a video camera, a digital still camera, and a camera module for mobile devices such as mobile phones, it is also possible to achieve both miniaturization of the semiconductor package and high image quality of the captured image.

<Use Example of Image Sensor>

Figure 61:
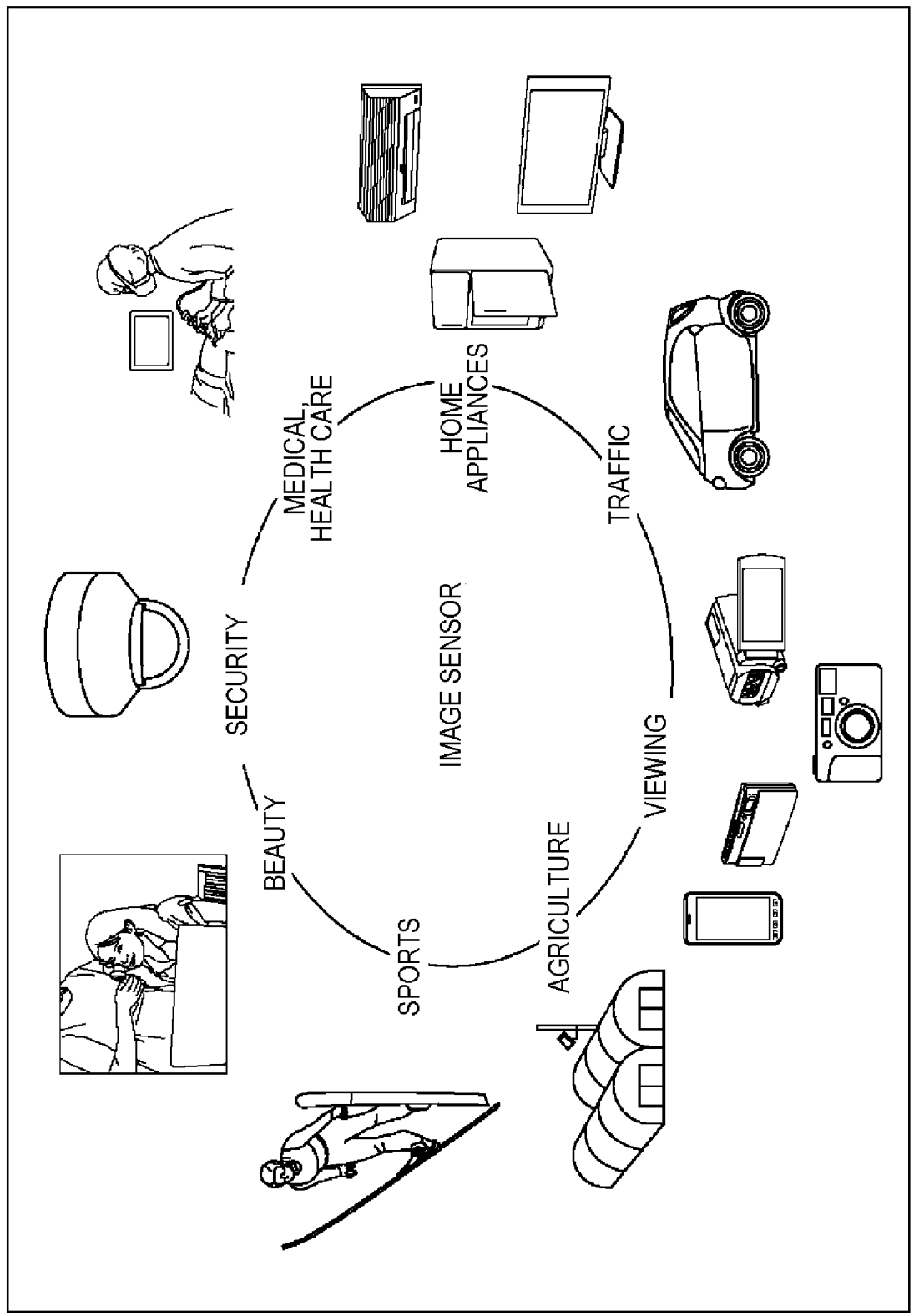
FIG. 61 is a diagram for describing a use example of an image sensor.

FIG. 61 is a diagram showing use examples of an image sensor using the abovementioned camera package 1 or camera module 700.

The image sensor using the camera package 1 or the camera module 700 can be used in various cases for sensing light such as visible light, infrared light, ultraviolet light, and X-ray as described below, for example.

- Devices that capture images used for viewing, such as digital cameras and mobile devices with camera functions
- Devices used for traffic such as: in-vehicle sensors that capture an image of an environment in front of, at the rear of, and around automobile, the interior of the automobile, etc. for safe driving such as automatic stop, recognition of the condition of driver, etc.; surveillance cameras that monitor traveling vehicles or road; or distance measurement sensors that measure the distance between vehicles, etc.
- Devices used in home appliances such as TVs, refrigerators, and air conditioners to capture an image of user's gesture and perform operations according to the gesture
- Devices used for medical and healthcare, such as endoscopes and devices that perform angiography by receiving infrared light
- Devices used for security, such as surveillance cameras for crime prevention and cameras for personal authentication
- Devices used for beauty, such as skin measuring devices that capture an image of the skin and microscopes that capture the image of the scalp
- Devices used for sports such as action cameras and wearable cameras for sporting use, etc.
- Devices used for agriculture, such as cameras for monitoring the condition of fields and crops <21. Example of Application to In-Vivo Information Acquisition System>

The technology according to the present disclosure (present technology) can be applied to various products as described above. For example, the technology according to the present disclosure may be applied to an in-vivo information acquisition system for acquiring in-vivo information of a patient using a capsule endoscope.

Figure 62:
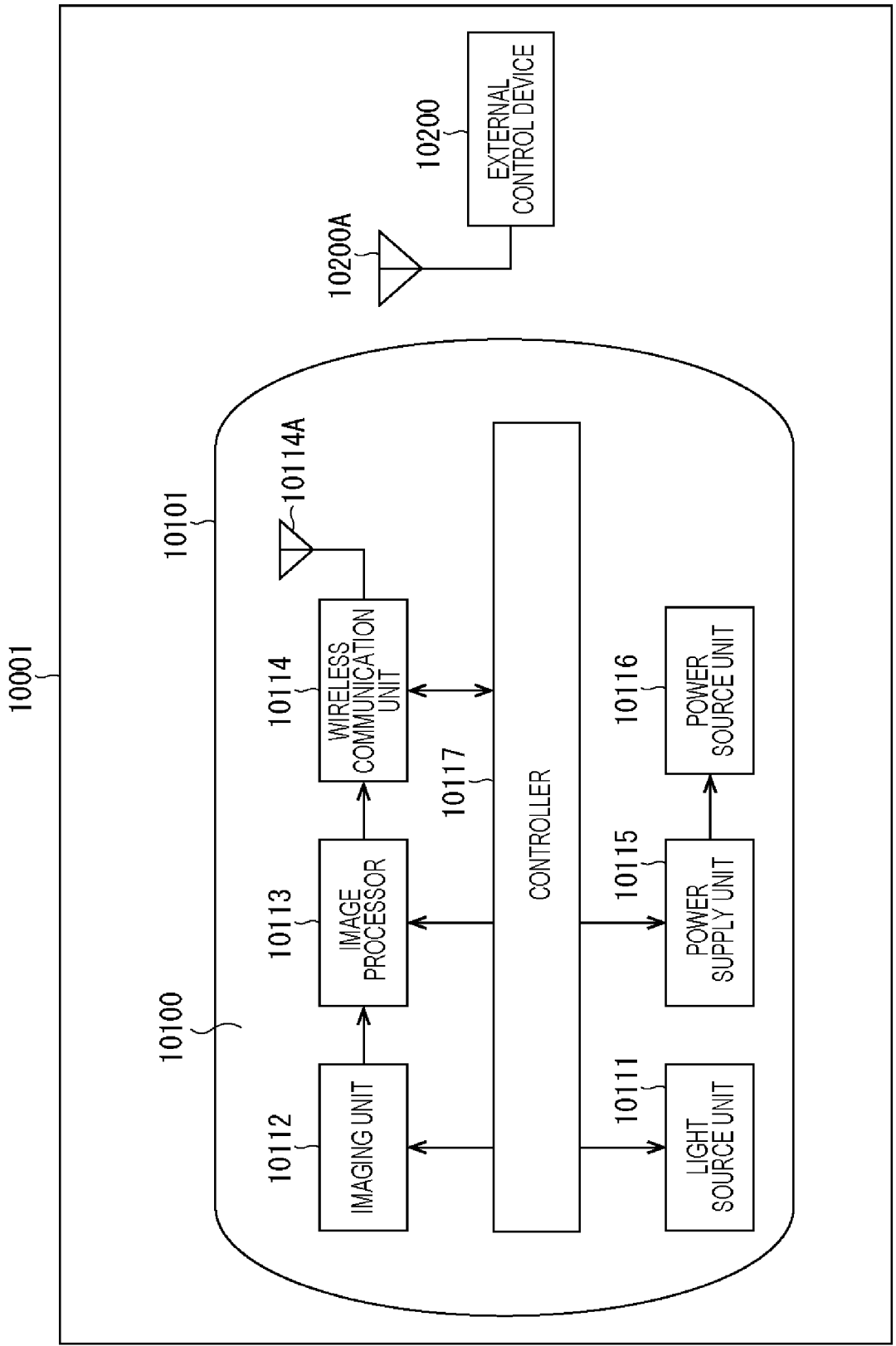
FIG. 62 is a block diagram showing an example of a schematic configuration of an in-vivo information acquisition system.

FIG. 62 is a block diagram showing an example of a schematic configuration of the in-vivo information acquisition system for acquiring in-vivo information of a patient using a capsule endoscope, to which the technology (the present technology) according to the present disclosure may be applied.

An in-vivo information acquisition system 10001 includes a capsule endoscope 10100 and an external control device 10200.

The capsule endoscope 10100 is swallowed by a patient during examination. The capsule endoscope 10100 has an imaging function and a wireless communication function. The capsule endoscope 10100 sequentially captures images (hereinafter also referred to as in-vivo images) of the interior of organs such as the stomach and the intestines at predetermined intervals, and sequentially transmits information regarding the in-vivo images to the external control device 10200 outside the body in a wireless manner, while moving through the interior of the relevant organs by peristaltic movement or the like until being excreted naturally from the patient.

The external control device 10200 centrally controls the operation of the in-vivo information acquisition system 10001. Further, the external control device 10200 receives information regarding the in-vivo images transmitted from the capsule endoscope 10100, and generates image data for displaying the in-vivo images on a display device (not illustrated) on the basis of the received information regarding the in-vivo images.

In this way, with the in-vivo information acquisition system 10001, in-vivo images indicating the patient's internal conditions can be obtained continually from the time the capsule endoscope 10100 is swallowed to the time the capsule endoscope 10100 is excreted.

The configurations and functions of the capsule endoscope 10100 and the external control device 10200 will be described in further detail.

The capsule endoscope 10100 includes a capsule-shaped housing 10101, and includes a light source unit 10111, an imaging unit 10112, an image processor 10113, a wireless communication unit 10114, a power supply unit 10115, a power source unit 10116, and a controller 10117 which are housed in the capsule-shaped housing 10101.

The light source unit 10111 includes a light source such as a light-emitting diode (LED), for example, and irradiates the imaging field of the imaging unit 10112 with light.

The imaging unit 10112 includes an imaging element, and an optical system including multiple lenses provided in front of the imaging element. Reflected light (hereinafter referred to as observation light) of light emitted toward a body tissue which is an observation target is condensed by the optical system and enters the imaging element. The imaging unit 10112 photoelectrically converts, by the imaging element, the observation light entering the imaging element, and generates an image signal corresponding to the observation light. The image signal generated by the imaging unit 10112 is provided to the image processor 10113.

The image processor 10113 includes a processor such as a central processing unit (CPU) or a graphics processing unit (GPU), and performs various kinds of signal processing on the image signal generated by the imaging unit 10112. The image processor 10113 provides the image signal subjected to signal processing to the wireless communication unit 10114 as RAW data.

The wireless communication unit 10114 performs a predetermined process such as a modulation process on the image signal that has been subjected to signal processing by the image processor 10113, and transmits the resultant image signal to the external control device 10200 via an antenna 10114A. In addition, the wireless communication unit 10114 receives, from the external control device 10200, a control signal related to drive control of the capsule endoscope 10100 via the antenna 10114A. The wireless communication unit 10114 provides the control signal received from the external control device 10200 to the controller 10117.

The power supply unit 10115 includes an antenna coil for receiving power, a power regeneration circuit for regenerating power from a current produced in the antenna coil, a booster circuit, and the like. In the power supply unit 10115, the principle of what is called contactless charging is used to generate power.

The power source unit 10116 includes a secondary battery, and stores power generated by the power supply unit 10115. Although arrows or the like indicating the destination to which power from the power source unit 10116 is supplied are not illustrated in FIG. 62 for preventing the illustration from being complex, power stored in the power source unit 10116 is supplied to the light source unit 10111, the imaging unit 10112, the image processor 10113, the wireless communication unit 10114, and the controller 10117, and may be used to drive these units.

The controller 10117 includes a processor such as a CPU, and appropriately controls drives of the light source unit 10111, the imaging unit 10112, the image processor 10113, the wireless communication unit 10114, and the power supply unit 10115 in accordance with a control signal transmitted from the external control device 10200.

The external control device 10200 may be a processor such as a CPU or GPU, or a device such as a microcomputer or a control board on which a processor and a storage element such as a memory are mounted. The external control device 10200 controls the operation of the capsule endoscope 10100 by transmitting a control signal to the controller 10117 of the capsule endoscope 10100 via an antenna 10200A. In the capsule endoscope 10100, for example, a light irradiation condition under which the light source unit 10111 irradiates an observation target with light may be changed by a control signal from the external control device 10200. In addition, an imaging condition (such as a frame rate and an exposure level in the imaging unit 10112, for example) may be changed by a control signal from the external control device 10200. In addition, the content of processing in the image processor 10113 and a condition (such as a transmission interval and the number of images to transmit, for example) under which the wireless communication unit 10114 transmits the image signal may be changed by a control signal from the external control device 10200.

In addition, the external control device 10200 performs various types of image processing on the image signal transmitted from the capsule endoscope 10100, and generates image data for displaying a captured in-vivo image on the display device. As the image processing, various known signal processing may be performed, such as a development process (demosaicing process), an image quality-improving process (such as a band enhancement process, a superresolution process, a noise reduction (NR) process, and/or a shake correction process), and/or a scaling process (electronic zoom process). The external control device 10200 controls the drive of the display device, and causes the display device to display a captured in-vivo image on the basis of the generated image data. Alternatively, the external control device 10200 may also cause a recording device (not shown) to record the generated image data, or cause a printing device (not shown) to make a printout of the generated image data.

An example of the in-vivo information acquisition system to which the technology according to the present disclosure can be applied has been described above. The technology according to the present disclosure can be applied to the imaging unit 10112 in the configuration described above. Specifically, the camera package 1 or the camera module 700 can be applied as the imaging unit 10112. By applying the technology according to the present disclosure to the imaging unit 10112, the capsule endoscope 10100 can be further miniaturized, so that the burden on the patient can be further reduced. In addition, a clearer surgical site image can be obtained with the capsule endoscope 10100 being reduced in size, whereby the accuracy of examination is improved.

<22. Example of Application to Endoscopic Surgical System>

For example, the technology according to the present disclosure may be applied to an endoscopic surgical system.

Figure 63:
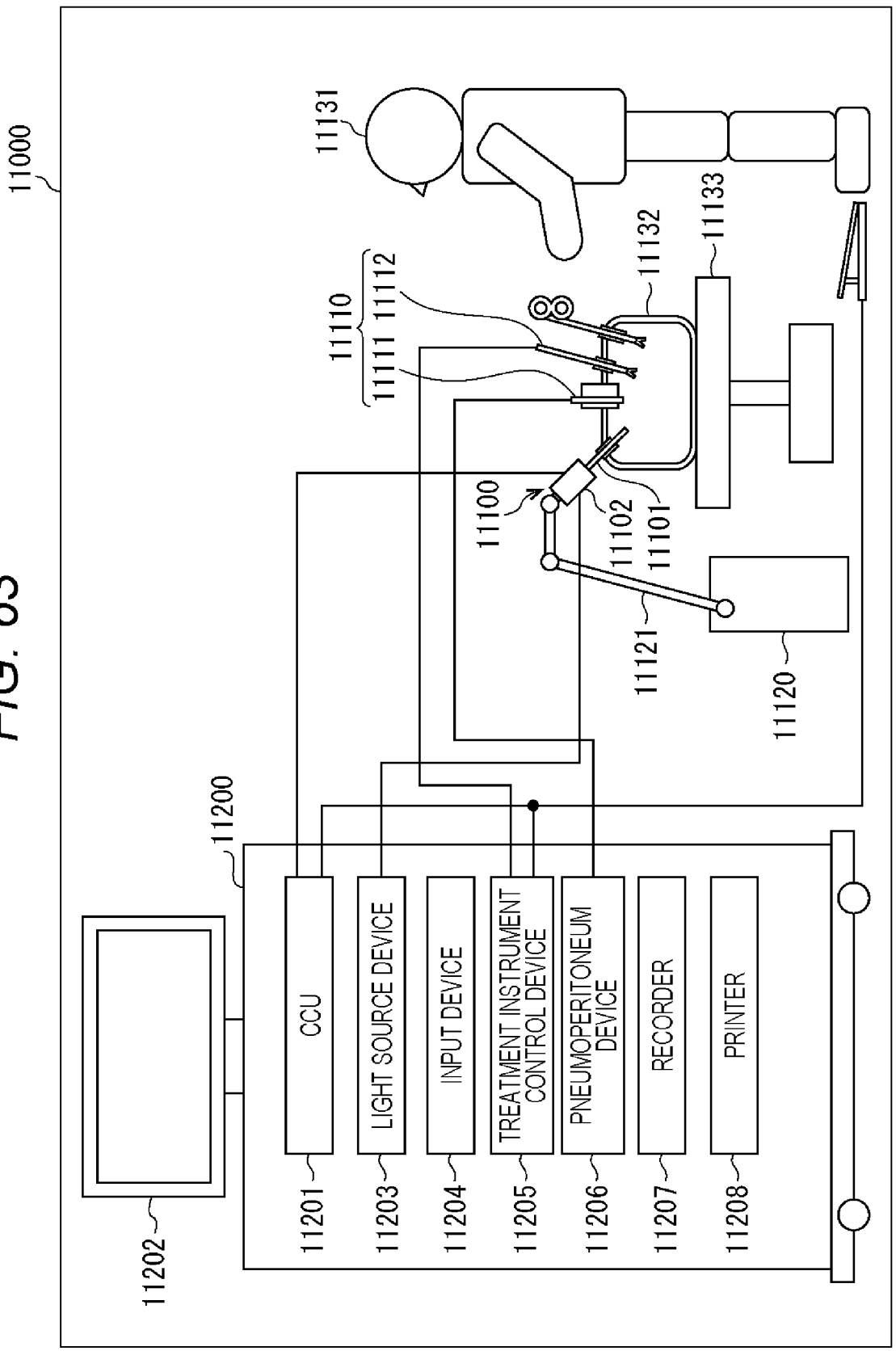
FIG. 63 is a diagram showing an example of a schematic configuration of an endoscopic surgical system.

FIG. 63 is a diagram showing an example of a schematic configuration of an endoscopic surgical system to which the technology according to the present disclosure can be applied.

FIG. 63 illustrates a state in which an operator (surgeon) 11131 performs surgery on a patient 11132 on a patient bed 11133 using an endoscopic surgical system 11000. As illustrated, the endoscopic surgical system 11000 includes an endoscope 11100, other surgical instruments 11110 such as a pneumoperitoneum tube 11111 and an energy treatment instrument 11112, a supporting arm device 11120 for supporting the endoscope 11100, and a cart 11200 on which various devices for endoscopic surgery are mounted.

The endoscope 11100 includes a lens tube 11101 inserted into the body cavity of a patient 11132 by a predetermined length from a distal end and a camera head 11102 connected to a proximal end of the lens tube 11101. The illustrated example shows that the endoscope 11100 is a so-called rigid scope having a rigid lens tube 11101. However, the endoscope 11100 may be a so-called flexible scope having a flexible lens tube.

An opening in which an objective lens is fitted is provided at the distal end of the lens tube 11101. A light source device 11203 is connected to the endoscope 11100, and light generated by the light source device 11203 is guided to the distal end of the lens tube by a light guide extending in the lens tube 11101 and is emitted to a target to be observed in the body cavity of the patient 11132 through the objective lens. Note that the endoscope 11100 may be a forward-viewing endoscope, an oblique-viewing endoscope, or a side-viewing endoscope.

An optical system and an imaging element are provided in the camera head 11102, and light reflected by the target to be observed (observation light) is condensed on the imaging element by the optical system. The imaging element photoelectrically converts the observation light and generates an electric signal corresponding to the observation light, that is, an image signal corresponding to an observation image. The image signal is transmitted to a camera control unit (CCU) 11201 as RAW data.

The CCU 11201 includes a central processing unit (CPU), a graphics processing unit (GPU), and the like, and centrally controls the operations of the endoscope 11100 and the display device 11202. Moreover, the CCU 11201 receives the image signal from the camera head 11102 and applies various types of image processing for displaying an image based on the image signal, for example, a development process (demosaicing process) and the like on the image signal.

The display device 11202 displays the image based on the image signal which has been subjected to the image processing by the CCU 11201 under the control of the CCU 11201.

The light source device 11203 includes a light source such as a light emitting diode (LED), for example, and supplies irradiation light for imaging a surgical site or the like to the endoscope 11100.

An input device 11204 is an input interface for the endoscopic surgical system 11000. A user may input various kinds of information and instructions to the endoscopic surgical system 11000 via the input device 11204. For example, the user inputs an instruction to change the imaging conditions (type of irradiation light, magnification, focal length, etc.) by the endoscope 11100.

A treatment instrument control device 11205 controls driving of the energy treatment instrument 11112 for tissue cauterization, incision, blood vessel sealing, and the like. A pneumoperitoneum device 11206 injects gas into the body cavity through the pneumoperitoneum tube 11111 to inflate the body cavity of the patient 11132 for the purpose of ensuring a field of view by the endoscope 11100 and obtaining a working space of the operator. A recorder 11207 is a device capable of recording various kinds of information regarding surgery. A printer 11208 is a device capable of printing various kinds of information regarding surgery in various formats such as a text, an image, or a graph.

Note that the light source device 11203 for supplying irradiation light for imaging the surgical site to the endoscope 11100 may include, for example, an LED, a laser light source, or a white light source obtained by combining them. In a case where the white light source includes a combination of RGB laser light sources, an output intensity and an output timing of each color (each wavelength) can be controlled with high accuracy, whereby the light source device 11203 can adjust white balance of the captured image. Furthermore, in this case, images respectively corresponding to the R, G, and B can also be captured in time division by irradiating the target to be observed with laser light from each of the RGB laser light sources in time division, and controlling the driving of the imaging element of the camera head 11102 in synchronization with the irradiation timing. According to this method, a color image can be obtained without providing a color filter in the imaging element.

Furthermore, the driving of the light source device 11203 may be controlled such that the intensity of light to be output is changed every predetermined time. The driving of the imaging element of the camera head 11102 is controlled in synchronization with a timing of changing the light intensity to obtain the images in time division, and the obtained images are synthesized, whereby an image with a high dynamic range that does not have so-called blocked up shadows and blown-out highlights can be generated.

Furthermore, the light source device 11203 may be configured to be able to supply light of a predetermined wavelength band adapted to special light observation. In the special light observation, so-called narrow band imaging is performed in which a predetermined tissue such as a blood vessel in a mucosal surface layer is imaged with high contrast by applying, for example, light in a narrower band than that of irradiation light (in other words, white light) used in normal observation using wavelength dependency of absorption of light in a body tissue. Alternatively, in the special light observation, fluorescence observation for obtaining an image with fluorescence generated by applying excitation light may be performed. In the fluorescence observation, it is possible to irradiate the body tissue with excitation light to observe fluorescence from the body tissue (autofluorescence observation) or to locally inject a reagent such as indocyanine green (ICG) to the body tissue and irradiate the body tissue with excitation light corresponding to a fluorescent wavelength of the reagent, thereby obtaining a fluorescent image, for example. The light source device 11203 can be configured to be able to supply narrow band light and/or excitation light adapted to such special light observation.

Figure 64:
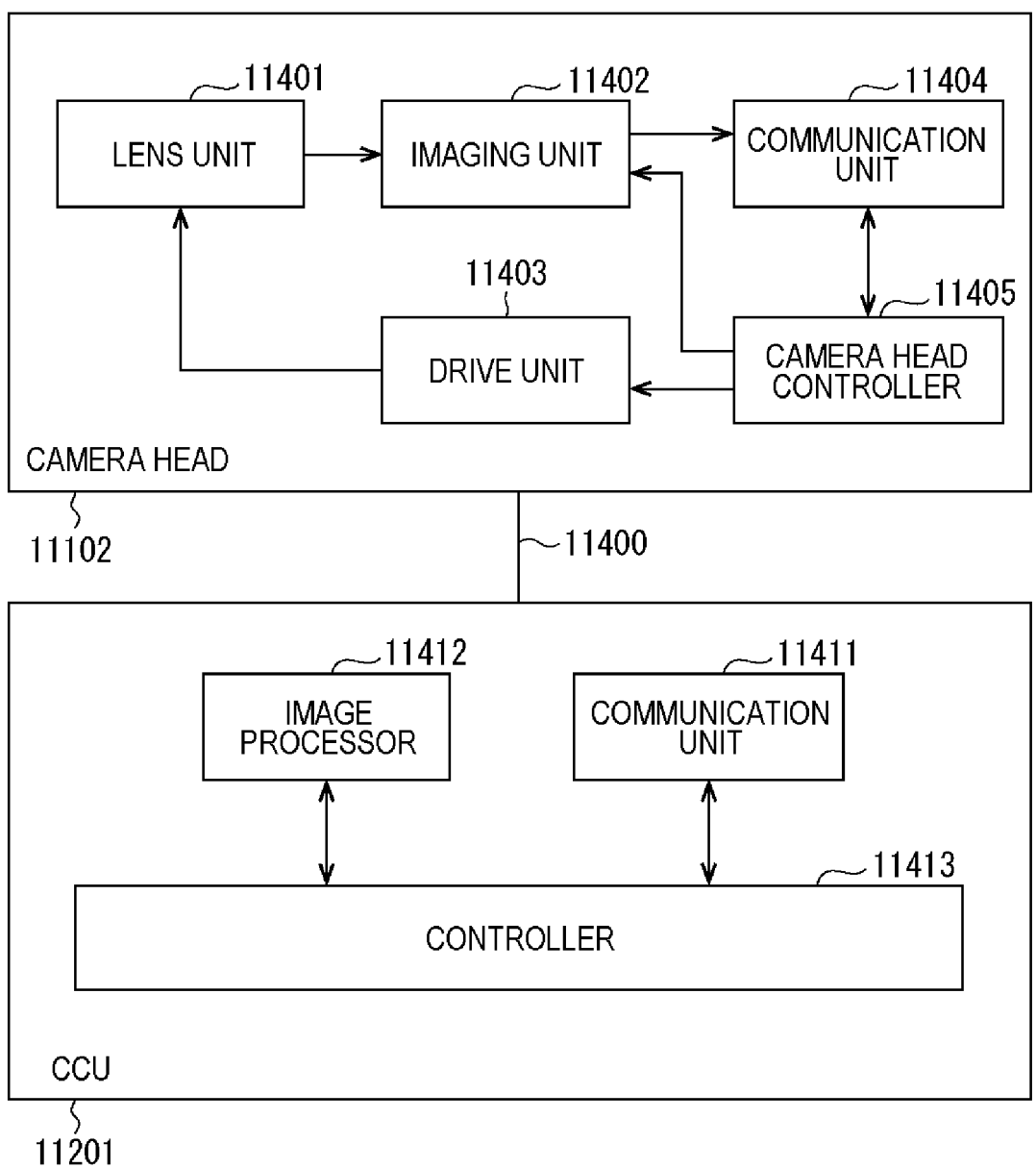
FIG. 64 is a block diagram showing an example of a functional configuration of a camera head and a CCU.

FIG. 64 is a block diagram showing an example of functional configurations of the camera head 11102 and the CCU 11201 shown in FIG. 63.

The camera head 11102 includes a lens unit 11401, an imaging unit 11402, a drive unit 11403, a communication unit 11404, and a camera head controller 11405. The CCU 11201 includes a communication unit 11411, an image processor 11412, and a controller 11413. The camera head 11102 and the CCU 11201 are connected to each other so as to be able to communicate by a transmission cable 11400.

The lens unit 11401 is an optical system provided at a connecting portion with the lens tube 11101. The observation light captured from the distal end of the lens tube 11101 is guided to the camera head 11102 and enters the lens unit 11401. The lens unit 11401 is constructed by combining a plurality of lenses including a zoom lens and a focus lens.

The imaging unit 11402 includes an imaging element. The number of imaging element constituting the imaging unit 11402 may be one (so-called single plate type) or two or more (so-called multiple plate type). In a case where the imaging unit 11402 is of the multiple-plate type, the image signals corresponding to RGB may be generated by the respective imaging elements, and a color image may be obtained by combining them, for example. Alternatively, the imaging unit 11402 may include a pair of imaging elements for obtaining right-eye and left-eye image signals corresponding to three-dimensional (3D) display. By the 3D display, the operator 11131 may grasp a depth of the living tissue in the surgical site more accurately. Note that, in a case where the imaging unit 11402 is of the multiple-plate type, a plurality of systems of lens units 11401 may be provided so as to correspond to the respective imaging elements.

Furthermore, the imaging unit 11402 is not necessarily provided in the camera head 11102. For example, the imaging unit 11402 may be provided inside the lens tube 11101 immediately after the objective lens.

The drive unit 11403 includes an actuator and moves the zoom lens and the focus lens of the lens unit 11401 by a predetermined distance along an optical axis under the control of the camera head controller 11405. Thus, the magnification and focal point of the image captured by the imaging unit 11402 may be appropriately adjusted.

The communication unit 11404 includes a communication device for transmitting and receiving various types of information to and from the CCU 11201. The communication unit 11404 transmits the image signal obtained from the imaging unit 11402 as the RAW data to the CCU 11201 via the transmission cable 11400.

Furthermore, the communication unit 11404 receives a control signal for controlling the drive of the camera head 11102 from the CCU 11201 and supplies the same to the camera head controller 11405. The control signal includes, for example, information regarding imaging conditions such as information specifying a frame rate of the captured image, information specifying an exposure value during image capture, and/or information specifying the magnification and focal point of the captured image.

Note that the imaging conditions such as the abovementioned frame rate, exposure value, magnification, and focal point may be appropriately specified by the user or automatically set by the controller 11413 of the CCU 11201 on the basis of the obtained image signal. In the latter case, the endoscope 11100 is equipped with a so-called auto exposure (AE) function, an auto focus (AF) function, and an auto white balance (AWB) function.

The camera head controller 11405 controls the drive of the camera head 11102 on the basis of the control signal from the CCU 11201 received via the communication unit 11404.

The communication unit 11411 includes a communication device for transmitting and receiving various types of information to and from the camera head 11102. The communication unit 11411 receives the image signal transmitted from the camera head 11102 via the transmission cable 11400.

Furthermore, the communication unit 11411 transmits the control signal for controlling the drive of the camera head 11102 to the camera head 11102. The image signal and the control signal may be transmitted by electric communication, optical communication, and the like.

The image processor 11412 performs various types of image processing on the image signal which is the RAW data transmitted from the camera head 11102.

The controller 11413 performs various types of control regarding image capture of the surgical site and the like by the endoscope 11100 and display of the captured image obtained by image capture of the surgical site and the like. For example, the controller 11413 generates the control signal for controlling drive of the camera head 11102.

Furthermore, the controller 11413 allows the display device 11202 to display the captured image including the surgical site and the like on the basis of the image signal subjected to the image processing by the image processor 11412. At that time, the controller 11413 may recognize various objects in the captured image using various image recognition technologies. For example, the controller 11413 may detect an edge shape, a color, and the like of the object included in the captured image, thereby recognizing the surgical instrument such as forceps, the specific living-body site, bleeding, mist when the energy treatment instrument 11112 is used, and the like. When allowing the display device 11202 to display the captured image, the controller 11413 may overlay various types of surgery support information on the image of the surgical site using a recognition result. The surgery support information is displayed as overlaid, and presented to the operator 11131, so that it is possible to reduce the burden on the operator 11131 and enable the operator 11131 to reliably proceed with surgery.

The transmission cable 11400 connecting the camera head 11102 and the CCU 11201 is an electric signal cable corresponding to communication of electric signals, an optical fiber compatible with optical communication, or a composite cable thereof.

Here, in the illustrated example, the communication is performed by wire using the transmission cable 11400, but the communication between the camera head 11102 and the CCU 11201 may be performed wirelessly.

An example of the endoscopic surgical system to which the technology according to the present disclosure may be applied has been described above. The technology according to the present disclosure may be applied to the imaging unit 11402 of the camera head 11102 in the configuration described above. Specifically, the camera package 1 or the camera module 700 may be applied as the imaging unit 11402. By applying the technology according to the present disclosure to the imaging unit 11402, it is possible to obtain a sharper surgical site image while making the camera head 11102 compact.

Note that, although the endoscopic surgical system is herein described as an example, the technology according to the present disclosure may also be applied to a microscopic surgical system and the like, for example.

<23. Example of Application to Mobile Object>

In addition, the technology according to the present disclosure may further be implemented as a device to be mounted on any type of mobile objects such as vehicles, electric vehicles, hybrid electric vehicles, motorcycles, bicycles, personal mobilities, airplanes, drones, ships, and robots, for example.

Figure 65:
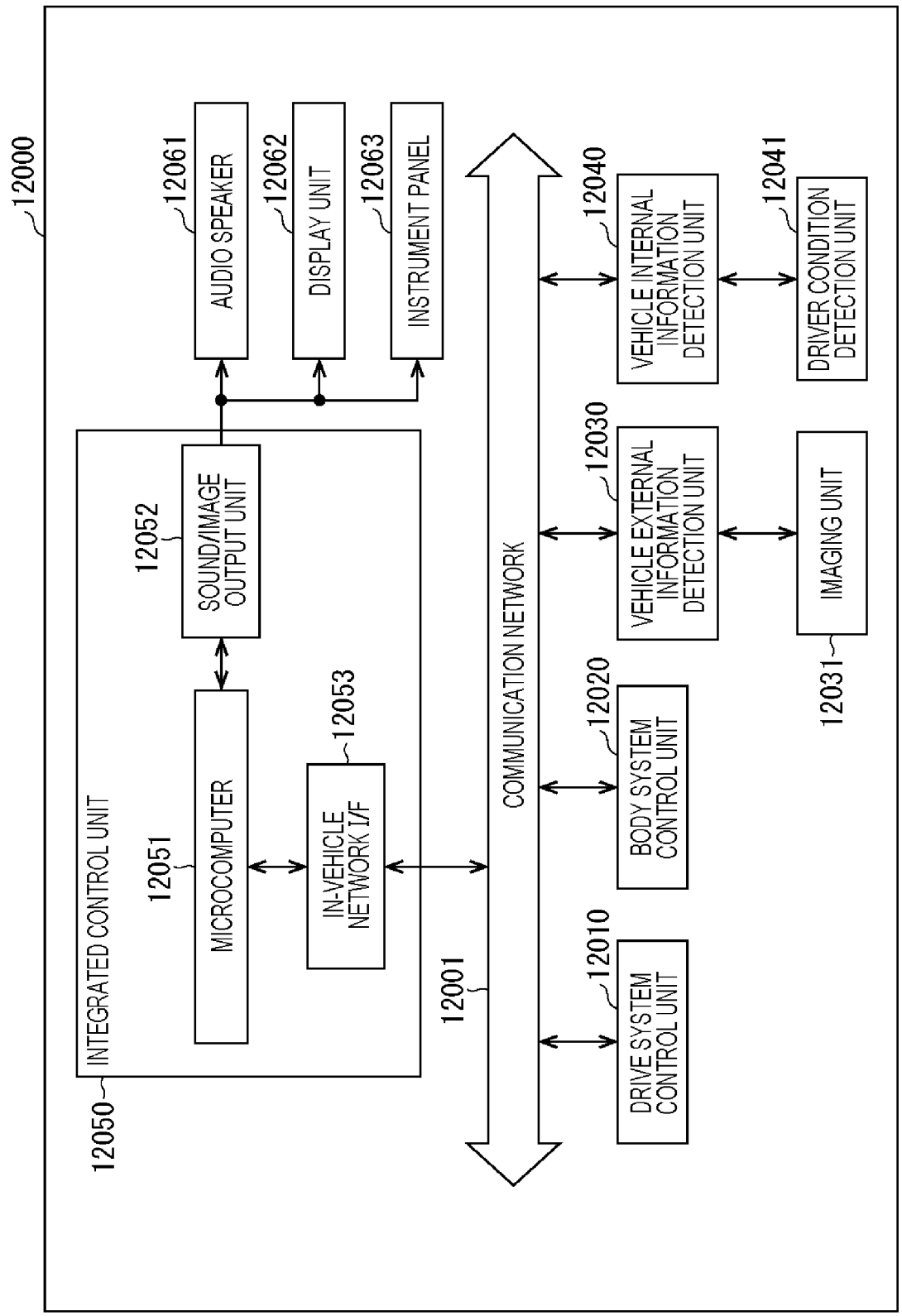
FIG. 65 is a block diagram showing an example of a schematic configuration of a vehicle control system.

FIG. 65 is a block diagram showing a schematic configuration example of a vehicle control system which is an example of a mobile object control system to which the technology according to the present disclosure can be applied.

A vehicle control system 12000 includes a plurality of electronic control units connected to each other via a communication network 12001. In the example shown in FIG. 65, the vehicle control system 12000 includes a drive system control unit 12010, a body system control unit 12020, a vehicle external information detection unit 12030, a vehicle internal information detection unit 12040, and an integrated control unit 12050. Further, a microcomputer 12051, a sound/image output unit 12052, and an in-vehicle network interface (I/F) 12053 are illustrated as the functional configuration of the integrated control unit 12050.

The drive system control unit 12010 controls the operation of devices related to a drive system of a vehicle according to various programs. For example, the drive system control unit 12010 functions as a control device over a driving force generating device such as an internal combustion engine or a driving motor for generating a driving force of the vehicle, a driving force transmission mechanism for transmitting the driving force to wheels, a steering mechanism adjusting a steering angle of the vehicle, a braking device that generates a braking force of the vehicle, and the like.

The body system control unit 12020 controls operations of various devices mounted on the vehicle body according to various programs. For example, the body system control unit 12020 functions as a keyless entry system, a smart key system, a power window device, or a control device for various lamps such as a headlamp, a backup lamp, a brake lamp, a blinker, or a fog lamp. In this case, radio waves transmitted from a portable device that can be used as a key or signals from various switches may be input to the body system control unit 12020. The body system control unit 12020 receives input of these radio waves or signals, and controls a door lock device, power window device, lamps, and the like of the vehicle.

The vehicle external information detection unit 12030 detects information regarding the outside of the vehicle equipped with the vehicle control system 12000. For example, the vehicle external information detection unit 12030 is connected with an imaging unit 12031. The vehicle external information detection unit 12030 causes the imaging unit 12031 to capture an image outside the vehicle, and receives the captured image. The vehicle external information detection unit 12030 may perform, on the basis of the received image, a process of detecting an object such as a person, a vehicle, an obstacle, a road sign, or a character on a road surface, or a process of detecting the distance thereto.

The imaging unit 12031 is an optical sensor that receives light and outputs an electric signal corresponding to the amount of received light. The imaging unit 12031 can output an electric signal as an image or as information for distance measurement. Further, the light received by the imaging unit 12031 may be visible light or invisible light such as infrared rays.

The vehicle internal information detection unit 12040 detects information regarding the inside of the vehicle. For example, the vehicle internal information detection unit 12040 is connected with a driver condition detection unit 12041 that detects a condition of a driver. The driver condition detection unit 12041 may include, for example, a camera that captures an image of the driver. On the basis of detection information input from the driver condition detection unit 12041, the vehicle internal information detection unit 12040 may calculate a degree of fatigue of the driver or a degree of concentration of the driver, or may determine whether or not the driver is dozing.

The microcomputer 12051 can calculate a control target value for the driving force generating device, the steering mechanism, or the braking device on the basis of the information about the inside and outside of the vehicle obtained by the vehicle external information detection unit 12030 or the vehicle internal information detection unit 12040, and output a control command to the drive system control unit 12010. For example, the microcomputer 12051 may perform cooperative control intended to implement functions of an advanced driver assistance system (ADAS) which include collision avoidance or shock mitigation for the vehicle, following driving based on distance between vehicles, vehicle speed maintaining driving, a warning of collision of the vehicle, a warning of lane departure of the vehicle, or the like.

In addition, the microcomputer 12051 may perform cooperative control intended for automatic driving, which makes the vehicle to travel autonomously without the need of the operation of the driver, or the like, by controlling the driving force generating device, the steering mechanism, the braking device, or the like on the basis of the information about the surrounding situation of the vehicle obtained by the vehicle external information detection unit 12030 or the vehicle internal information detection unit 12040.

Further, the microcomputer 12051 can output a control command to the body system control unit 12020 on the basis of information about the outside of the vehicle acquired by the vehicle external information detection unit 12030. For example, the microcomputer 12051 may perform cooperative control including controlling the head lamps on the basis of the location of a preceding vehicle or an oncoming vehicle detected by the vehicle external information detection unit 12030 and changing high beams to low beams, for example, for the purpose of anti-glare.

The sound/image output unit 12052 transmits an output signal of at least one of a sound or an image to an output device capable of visually or auditorily giving information to an occupant of the vehicle or the outside of the vehicle. In the example of FIG. 65, an audio speaker 12061, a display unit 12062, and an instrument panel 12063 are illustrated as the output device. The display unit 12062 may include, for example, at least one of an on-board display or a head-up display.

Figure 66:
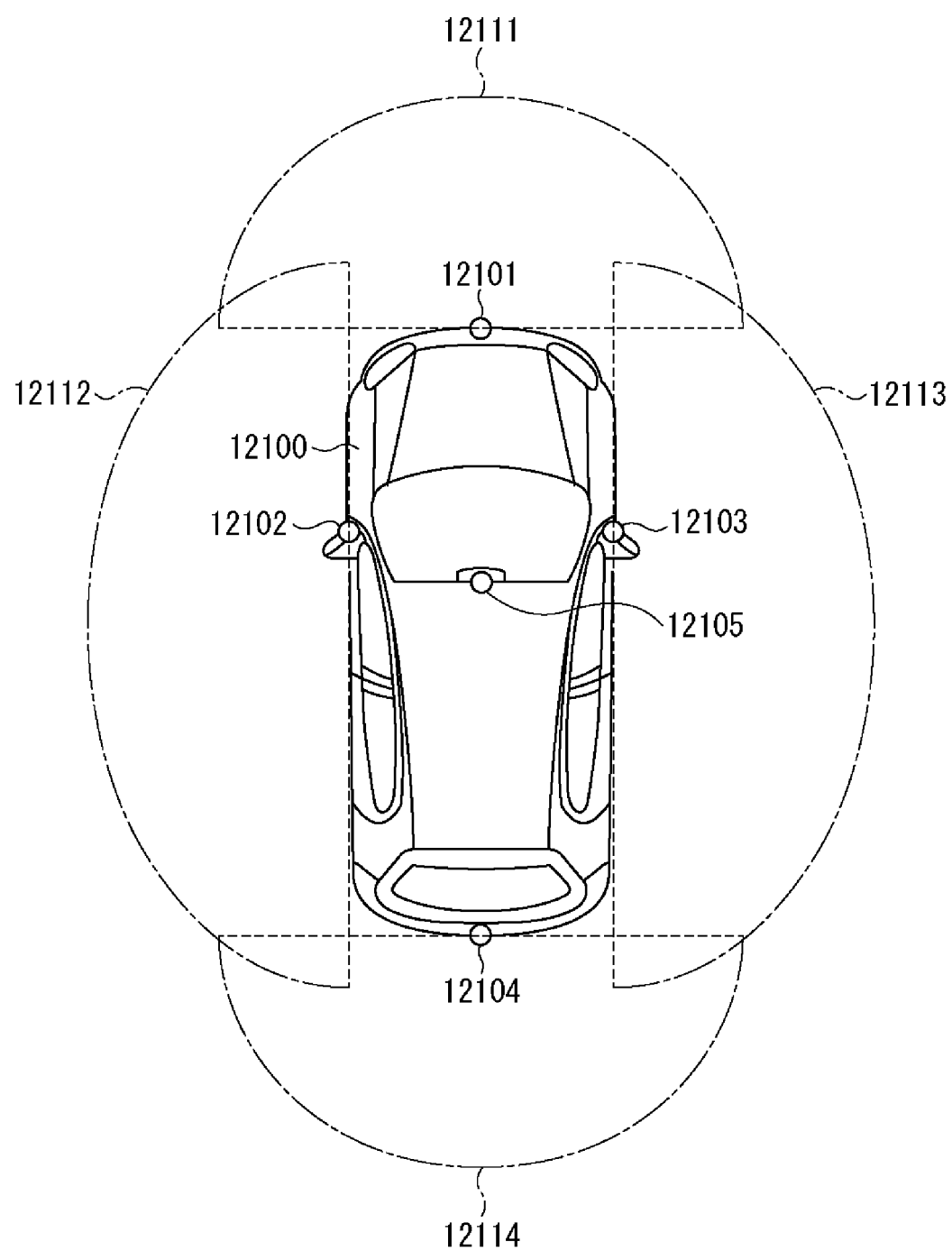
FIG. 66 is an explanatory diagram showing an example of installation positions of a vehicle external information detection unit and imaging units.

FIG. 66 is a diagram showing examples of mounting positions of the imaging unit 12031.

In FIG. 66, a vehicle 12100 includes, as the imaging unit 12031, imaging units 12101, 12102, 12103, 12104, and 12105.

For example, the imaging units 12101, 12102, 12103, 12104, and 12105 are provided at positions such as the front nose, the side-view mirrors, the rear bumper or the back door, and an upper part of the windshield in the cabin of the vehicle 12100. The imaging unit 12101 provided on the front nose and the imaging unit 12105 provided at the upper part of the windshield in the cabin of the vehicle mainly acquire an image of an environment in front of the vehicle 12100. The imaging units 12102 and 12103 on the side-view mirrors mainly obtain an image of an environment on the side of the vehicle 12100. The imaging unit 12104 provided in the rear bumper or the back door mainly obtains an image of an environment behind the vehicle 12100. The images of the environment in front of the vehicle obtained by the imaging units 12101 and 12105 are mainly used for detecting a preceding vehicle, a pedestrian, an obstacle, a traffic light, a traffic sign, a lane, or the like.

Note that FIG. 66 shows examples of image capture ranges of the imaging units 12101 to 12104. An imaging range 12111 indicates the imaging range of the imaging unit 12101 on the front nose, imaging ranges 12112 and 12113 indicate the imaging ranges of the imaging units 12102 and 12103 on the side-view mirrors, respectively, and an imaging range 12114 indicates the imaging range of the imaging unit 12104 on the rear bumper or the back door. For example, a bird's-eye image of the vehicle 12100 as viewed from above can be obtained by superimposing image data captured by the imaging units 12101 to 12104.

At least one of the imaging units 12101 to 12104 may have a function of obtaining distance information. For example, at least one of the imaging units 12101 to 12104 may be a stereo camera including a plurality of imaging elements or an imaging element including pixels for phase difference detection.

For example, the microcomputer 12051 obtains the distance between the vehicle 12100 and each three-dimensional object in the imaging ranges 12111 to 12114 and the temporal change (relative speed to the vehicle 12100) of the distance on the basis of the distance information obtained from the imaging units 12101 to 12104, and may extract, as a preceding vehicle, especially a three-dimensional object which is the closest to the vehicle 12100 on the path on which the vehicle 12100 is traveling and which is traveling at a predetermined speed (e.g., 0 km/h or more) in the direction substantially the same as the traveling direction of the vehicle 12100. Further, the microcomputer 12051 may perform autobrake control (including follow-up stop control), automatic acceleration control (including follow-up start-driving control), and the like by presetting a distance to be maintained between the vehicle 12100 and a preceding vehicle. In this way, it is possible to perform cooperative control intended to achieve autonomous driving without the need of drivers' operations, and the like.

For example, the microcomputer 12051 may sort three-dimensional object data of three-dimensional objects into motorcycles, standard-size vehicles, large-size vehicles, pedestrians, and the other three-dimensional objects such as utility poles on the basis of the distance information obtained from the imaging units 12101 to 12104, extract data, and use the data to automatically avoid obstacles. For example, the microcomputer 12051 sorts obstacles around the vehicle 12100 into obstacles that a driver of the vehicle 12100 can see and obstacles that it is difficult for the driver to see. Then, the microcomputer 12051 determines a collision risk, which indicates a hazard level of a collision with each obstacle. When the collision risk is equal to or higher than a preset value and thus there is a possibility of collision, the microcomputer 12051 may perform driving assistance to avoid a collision by outputting a warning to the driver via the audio speaker 12061 or the display unit 12062, or by forcibly reducing the speed or performing collision-avoidance steering via the drive system control unit 12010.

At least one of the imaging units 12101 to 12104 may be an infrared camera that detects infrared light. For example, the microcomputer 12051 may recognize a pedestrian by determining whether or not images captured by the imaging units 12101 to 12104 include the pedestrian. The method of recognizing a pedestrian includes, for example, a step of extracting feature points in the images captured by the imaging units 12101 to 12104 being infrared cameras, and a step of performing a pattern matching process with respect to a series of feature points indicating an outline of an object, to thereby determine whether or not the object is a pedestrian. When the microcomputer 12051 determines that the images captured by the imaging units 12101 to 12104 include a pedestrian and recognizes the pedestrian, the sound/image output unit 12052 controls the display unit 12062 such that a rectangular contour is displayed overlaid on the recognized pedestrian to emphasize the pedestrian. Further, the sound/image output unit 12052 may control the display unit 12062 such that an icon or the like indicating a pedestrian is displayed at a desired position.

An example of the vehicle control system to which the technology according to the present disclosure can be applied has been described above. The technology according to the present disclosure can be applied to the imaging unit 12031 and the like in the configuration described above. Specifically, the camera package 1 or the camera module 700 can be applied as the imaging unit 12031. By applying the technology according to the present disclosure to the imaging unit 12031, it is possible to obtain a captured image that is easier to see and to acquire distance information while achieving reduction in size. In addition, the obtained captured image and distance information can be used to reduce driver's fatigue and improve the safety level of the driver and the vehicle.

Further, the present disclosure is applicable not only to molding of lenses (lens resin parts) included in the camera package, but also to general imprinting in which a resin is molded using a mold.

It should be noted that the embodiments according to the present disclosure are not limited to the abovementioned embodiments, and various modifications are possible without departing from the gist of the present disclosure.

For example, it is possible to adopt a mode obtained by combining all or some of the plurality of embodiments described above.

It should be noted that the effects described in the present specification are merely illustrative and not restrictive, and effects other than those described in the present specification may also be provided.

It is to be noted that the present disclosure may also have the following configurations.

(1)
A camera package including:
a solid-state imaging element; and
a lens formed above a transparent substrate that protects the solid-state imaging element,
in which a lens formation region in which the lens is formed above the transparent substrate and a lens free region around the lens formation region differ in contact angle.

(2)
The camera package according to (1) described above,
in which the lens formation region and the lens free region differ in contact angle due to a high contact angle film formed in the lens free region.

(3)
The camera package according to (1) or (2) described above,
in which the lens formation region and the lens free region differ in contact angle due to a hydrophilic film formed in the lens formation region.

(4)
The camera package according to (1) or (3) described above,
in which the lens formation region and the lens free region differ in contact angle due to micro-irregularities formed in the lens free region.

(5)
The camera package according to any one of (1) to (4) described above,
in which the lens formation region of the transparent substrate has an average height lower than an average height of the lens free region.

(6)
The camera package according to (5) described above,
in which the lens formation region of the transparent substrate is recessed to generate a difference in height between the lens formation region and the lens free region.

(7)
The camera package according to (5) described above,
in which the lens free region of the transparent substrate is provided with a thick film to generate a difference in height between the lens formation region and the lens free region.

(8)
The camera package according to any one of (1) to (4) described above,
in which the lens formation region of the transparent substrate has a shape extending outward from a rectangular region with nearness to four corners of the rectangular region from a lens center of the rectangular region.

(9)
The camera package according to any one of (1) to (4) described above,
in which the lens formation region of the transparent substrate is separated from the lens formation region at a first curve that circumscribes a long side of a rectangular shape and that has a predetermined radius of curvature, a second curve that circumscribes a short side of the rectangular shape and that has a predetermined radius of curvature, and a region in which the first curve and the second curve are connected to each other with a curve, a straight line, or a point.

(10)
The camera package according to (1) described above, further including
a high contact angle film in the lens free region above the transparent substrate,
in which the high contact angle film or the transparent substrate has optical absorption property, or a light absorbing film or a light reflection film is provided between the high contact angle film and the solid-state imaging element.

(11)
The camera package according to (10) described above,
in which the light absorbing film is formed in the lens free region.

(12)
The camera package according to (10) described above,
in which the light absorbing film is formed in the lens formation region and in the lens free region.

(13)
The camera package according to (10) described above,
in which the light absorbing film is formed between the transparent substrate and the high contact angle film.

(14)
The camera package according to (10) described above, further including
an adhesion promoter on the transparent substrate,
in which the light absorbing film is formed on the adhesion promoter.

(15)
The camera package according to (10) described above,
in which the light absorbing film is formed between the transparent substrate and the solid-state imaging element.

(16)
The camera package according to (10) described above,
in which the high contact angle film has optical absorption property.

(17)
The camera package according to (10) described above,
in which the transparent substrate has optical absorption property.

(18)
The camera package according to any one of (10) to (17) described above, further including
an antireflection structure on an upper surface of a semiconductor substrate of the solid-state imaging element.

(19)
A method for manufacturing a camera package, the method including:
performing processing such that a lens formation region above a transparent substrate that protects a solid-state imaging element and a lens free region around the lens formation region differ in contact angle; dropping a lens material into the lens formation region above the transparent substrate; and pressing a mold to form a lens.

(20)
An electronic device including:
a camera package including
a solid-state imaging element, and
a lens formed above a transparent substrate that protects the solid-state imaging element, in which a lens formation region in which the lens is formed above the transparent substrate and a lens free region around the lens formation region differ in contact angle; and a lens module including one or more lens-equipped substrates disposed above the camera package.

REFERENCE SIGNS LIST

1 Camera package
11 First structure (upper structure)
12 Second structure (lower structure)
13 Solid-state imaging element
14 External terminal
18, 18' Protective substrate
19 Lens resin part
20, 20' High contact angle film
131 Adhesion promoter
132, 135 Light absorbing film
401 Rectangular shape
402 Pattern shape
412 Hydrophilic film
441 Recessed part
451 Thick film
471 Bank
501 Lens material
503 Mold
571 Adhesion promoter
572 Antireflection film
602 Lens material
603 Mold
611 Abutting section
612 Light-shielding film
661 Abutting section
662 Light-shielding film
671 Guide section
700 Camera module
701 Lens-equipped substrate
702 Multilayer lens structure
703 Optical unit
722 Lens resin part
723 Through hole
921 Mold substrate
922 Mold
941 Mold substrate
942 Mold
2000 Imaging device
2001 Image sensor
2002 Camera module

The invention claimed is:

1. A camera package, comprising:
a solid-state imaging element;
a transparent substrate that protects the solid-state imaging element, wherein the transparent substrate includes:
a lens formation region; and
a lens free region around the lens formation region;
a lens on the transparent substrate, wherein the lens is in the lens formation region; and
a plurality of micro-irregularities in the lens free region, wherein a contact angle of the lens free region is different from a contact angle of the lens formation region.

2. The camera package according to claim 1, further comprising a high contact angle film in the lens free region.

3. The camera package according to claim 1, further comprising hydrophilic film in the lens formation region.

4. The camera package according to claim 1, wherein the lens formation region of the transparent substrate has an average height lower than an average height of the lens free region.

5. The camera package according to claim 4, wherein
the lens formation region of the transparent substrate includes a recessed part, and
the lens formation region has a height different from a height of the lens free region.

6. The camera package according to claim 4, wherein
the lens free region of the transparent substrate includes a thick film, and
the lens free region has a height different from a height of the lens formation region.

7. The camera package according to claim 1, wherein
the lens formation region of the transparent substrate corresponds to a rectangular region, and
the lens formation region has a shape that extends outward from the rectangular region with nearness to four corners of the rectangular region from a lens center of the rectangular region.

8. The camera package according to claim 1, wherein the lens formation region of the transparent substrate includes:
a first curve that circumscribes a long side of a rectangular shape of the lens;
a second curve that circumscribes a short side of the rectangular shape; and
a region where the first curve and the second curve are connected, the first curve has a first radius of curvature,
the second curve has a second radius of curvature,
the region includes one of a third curve, a straight line, or a point, and
the one of the third curve, the straight line, or the point connects the first curve to the second curve.

9. The camera package according to claim 1, further comprising a high contact angle film on the transparent substrate, wherein
the high contact angle film is in the lens free region,
one of the high contact angle film or the transparent substrate has one of:
an optical absorption property, or
one of a light absorbing film or a light reflection film, and
the one of the light absorbing film or the light reflection film is between the high contact angle film and the solid-state imaging element.

10. The camera package according to claim 9, wherein the lens free region includes the light absorbing film.

11. The camera package according to claim 9, wherein each of the lens formation region and the lens free region includes the light absorbing film.

12. The camera package according to claim 9, wherein the light absorbing film is between the transparent substrate and the high contact angle film.

13. The camera package according to claim 9, further comprising an adhesion promoter on the transparent substrate, wherein the light absorbing film is on the adhesion promoter.

14. The camera package according to claim 9, wherein the light absorbing film is between the transparent substrate and the solid-state imaging element.

15. The camera package according to claim 9, wherein the high contact angle film has the optical absorption property.

16. The camera package according to claim 9, wherein the transparent substrate has the optical absorption property.

17. The camera package according to claim 9, wherein
the solid-state imaging element includes a semiconductor substrate, and
the camera package further comprises an antireflection structure on an upper surface of the semiconductor substrate.

18. A method for manufacturing a camera package, the method comprising:
forming a lens formation region above a transparent substrate, wherein the transparent substrate protects a solid-state imaging element;
forming a lens free region around the lens formation region, wherein the lens free region and the lens formation region differ in a contact angle;
dropping a lens material into the lens formation region; and
pressing a mold to form a lens.

19. An electronic device, comprising:
a camera package including:
   a solid-state imaging element;
   a transparent substrate that protects the solid-state imaging element, wherein the transparent substrate includes:
      a lens formation region; and
      a lens free region around the lens formation region;
   a lens on the transparent substrate, wherein the lens is in the lens formation region; and
   a plurality of micro-irregularities in the lens free region, wherein a contact angle of the lens free region is different from a contact angle of the lens formation region; and
a lens module including one or more lens-equipped substrates on disposed above the camera package.

20. A camera package, comprising:
a solid-state imaging element;
a transparent substrate that protects the solid-state imaging element, wherein the transparent substrate includes:
   a lens formation region; and
   a lens free region around the lens formation region; and
a lens on the transparent substrate, wherein
   the lens is in the lens formation region,
   a contact angle of the lens formation region is different from a contact angle of the lens free region,
   the lens formation region includes:
      a first curve that circumscribes a long side of a rectangular shape of the lens;
      a second curve that circumscribes a short side of the rectangular shape; and
      a region where the first curve and the second curve are connected,
   the first curve has a first radius of curvature,
   the second curve has a second radius of curvature,
   the region includes one of a third curve, a straight line, or a point, and
   the one of the third curve, the straight line, or the point connects the first curve to the second curve.

* * * * *